(12) United States Patent
Murakami et al.

(10) Patent No.: US 6,727,146 B2
(45) Date of Patent: Apr. 27, 2004

(54) SEMICONDUCTOR DEVICE AND METHOD OF MANUFACTURING THEREOF

(75) Inventors: Eiichi Murakami, Tokorozawa (JP); Akio Nishida, Tachikawa (JP); Kazunori Umeda, Higashimurayama (JP); Kousuke Okuyama, Kawagoe (JP); Toshiaki Yamanaka, Iruma (JP); Jiro Yugami, Yokohama (JP); Shinichiro Kimura, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/288,448

(22) Filed: Nov. 6, 2002

(65) Prior Publication Data

US 2003/0054613 A1 Mar. 20, 2003

Related U.S. Application Data

(63) Continuation of application No. 09/942,668, filed on Aug. 31, 2001, now abandoned.

(30) Foreign Application Priority Data

Oct. 17, 2000 (JP) ........................................ 2000-316964

(51) Int. Cl.[7] .................... H01L 21/8234; H01L 21/336
(52) U.S. Cl. ........................ 438/275; 438/313; 438/314; 438/317; 438/762; 438/769
(58) Field of Search .................... 438/591, 515, 438/762, 923, 313, 314, 317, 319, 586, 634, 778, 784, 791, 770, 264, 275, 769, 199, 216, 238

(56) References Cited

U.S. PATENT DOCUMENTS

| 4,554,726 A | * | 11/1985 | Hillenius et al. | 438/228 |
|---|---|---|---|---|
| 5,464,783 A | * | 11/1995 | Kim et al. | 438/591 |
| 5,554,871 A | * | 9/1996 | Yamashita et al. | 257/336 |
| 5,591,681 A | * | 1/1997 | Wristers et al. | 438/762 |
| 5,629,221 A | * | 5/1997 | Chao et al. | 438/591 |
| 5,702,988 A | * | 12/1997 | Liang | 438/238 |
| 5,872,049 A | * | 2/1999 | Gardner et al. | 438/585 |
| 6,037,639 A | * | 3/2000 | Ahmad | 257/401 |
| 6,051,510 A | * | 4/2000 | Fulford et al. | 438/778 |
| 6,168,980 B1 | * | 1/2001 | Yamazaki et al. | 438/162 |
| 6,180,473 B1 | * | 1/2001 | Hong et al. | 438/303 |
| 6,232,244 B1 | * | 5/2001 | Ibok | 438/770 |
| 6,235,590 B1 | * | 5/2001 | Daniel et al. | 438/275 |
| 6,258,673 B1 | * | 7/2001 | Houlihan et al. | 438/275 |

OTHER PUBLICATIONS

N. Kimizuka, T. Yamamoto, T. Mogami, K. Yamaguchi, K. Imai and T. Horiuchi, "The Impact of Bias Temperature Instability for Direct–Tunneling Ultra–thin GTE Oxide on MOSFET Scaling", 1999 Symposium on VLSI Technology Digest of Technical papers, pp. 73–74.

* cited by examiner

Primary Examiner—Michael S. Lebentritt
(74) Attorney, Agent, or Firm—Reed Smith LLP; Stanley P. Fisher, Esq.; Juan Carlos A. Marquez, Esq.

(57) ABSTRACT

This semiconductor device manufacturing method comprises the steps of: forming a thick gate oxide film (thick oxide film) in a first region of a substrate, forming a thin gate oxide film (thin oxide layer) in a second region, and then, applying oxynitridation to these gate oxide films; forming gate electrodes to 1d on these gate oxide films; and implanting an ion that contains nitrogen or nitrogen atoms into at least one part of an interface between the hick gate oxide film (thick oxide film) and the substrate before or after the step of forming the gate electrodes, thereby forming a highly oxy-nitrided region. In this manner, in a semiconductor device in which there coexist a MISFET having a thin gate insulation film and a MISFET having a thick gate insulation film, hot carrier reliability of the MISFET having the thick gate insulation film is improved.

2 Claims, 54 Drawing Sheets

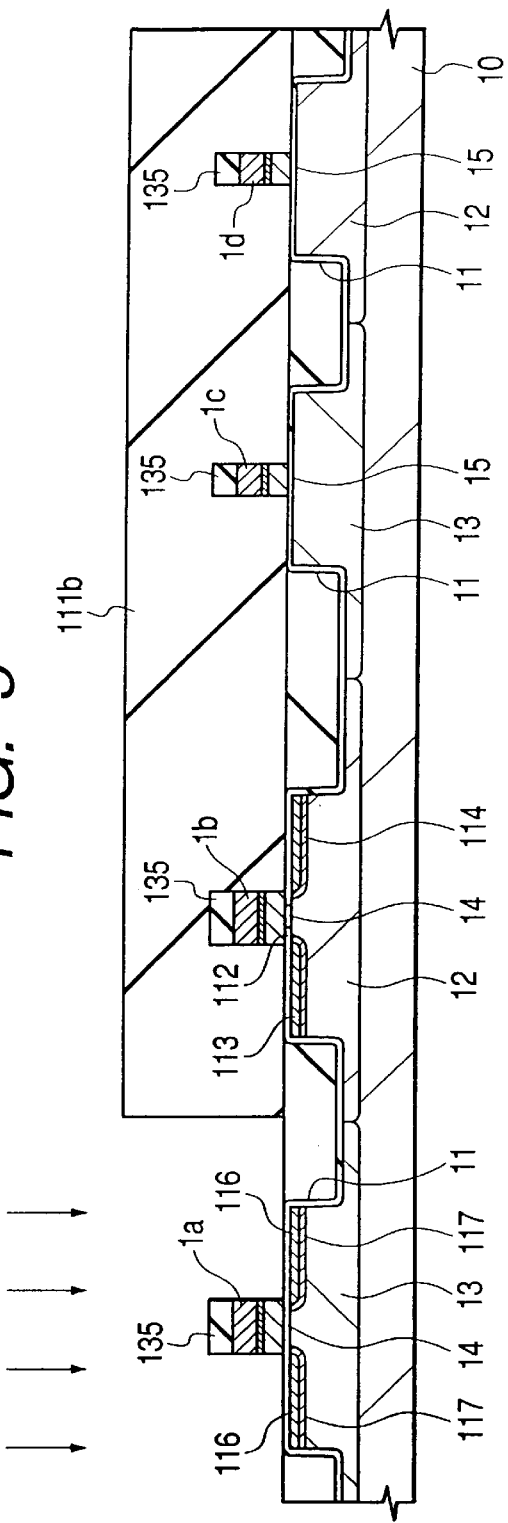
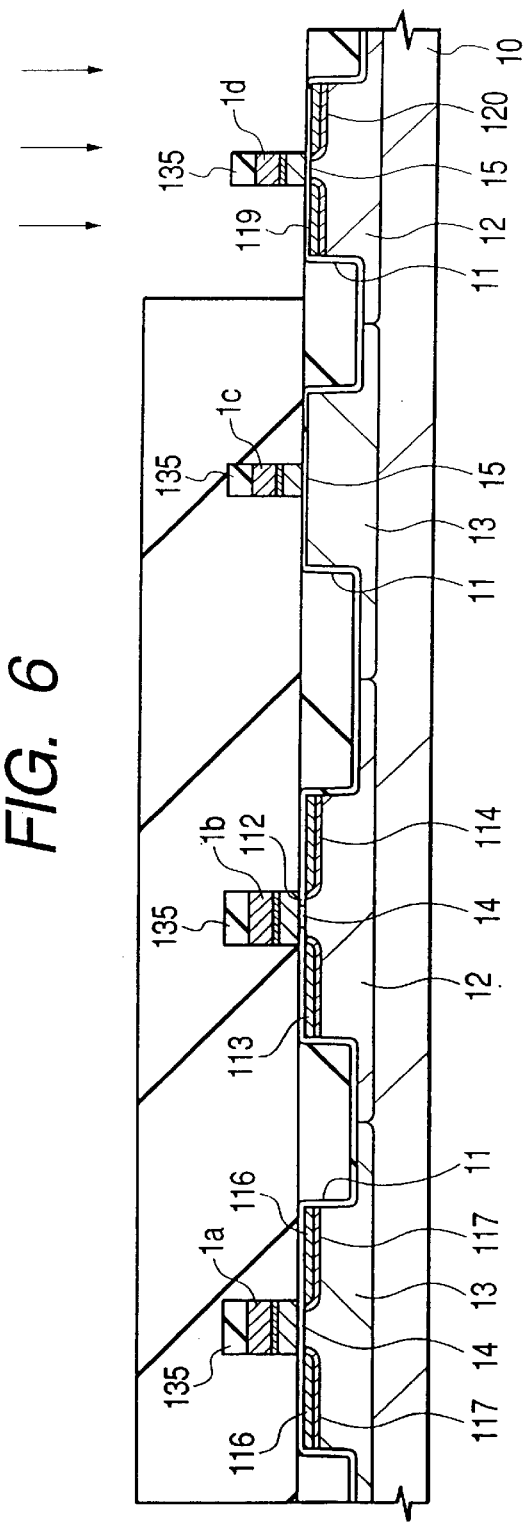

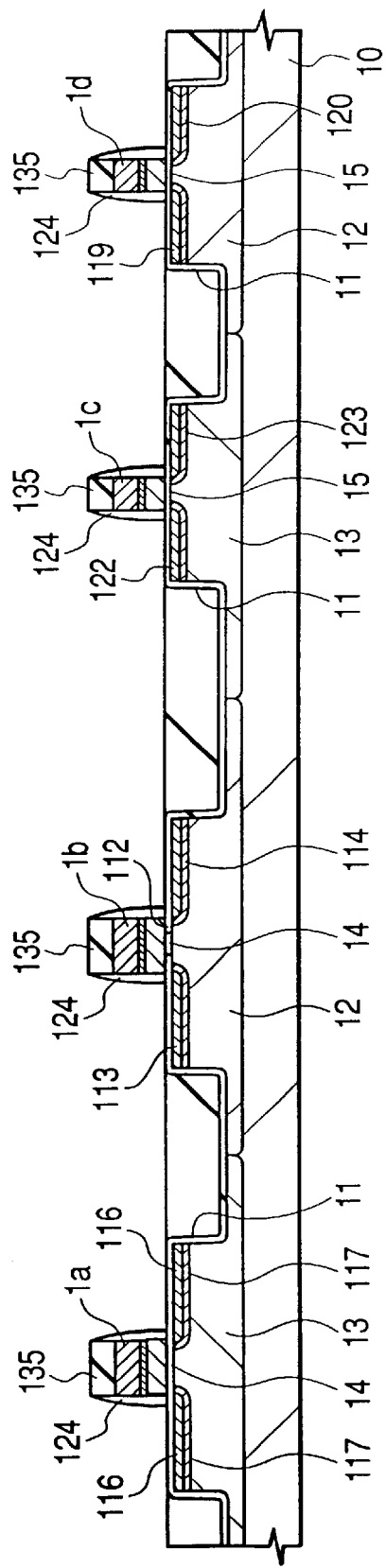
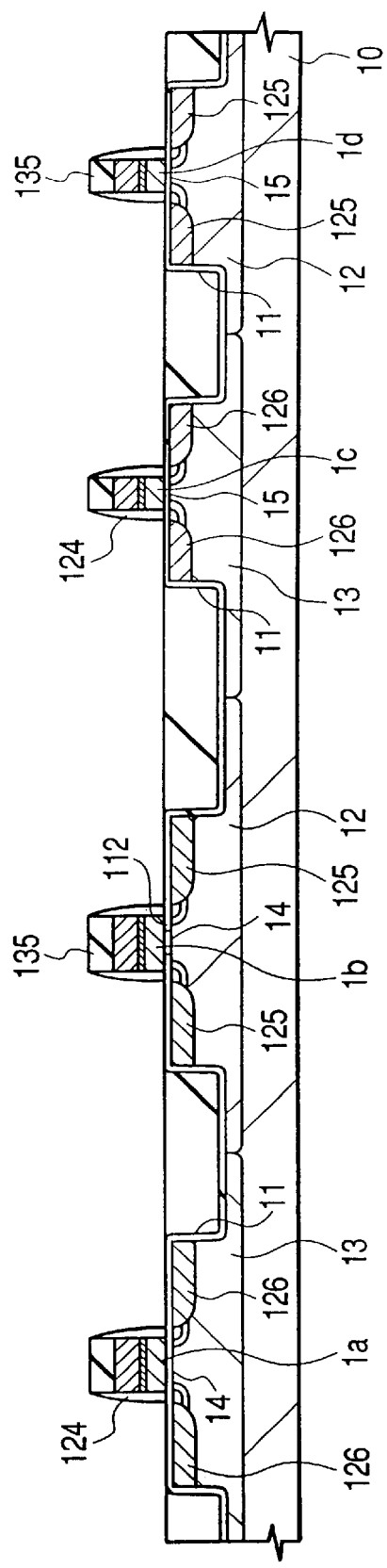

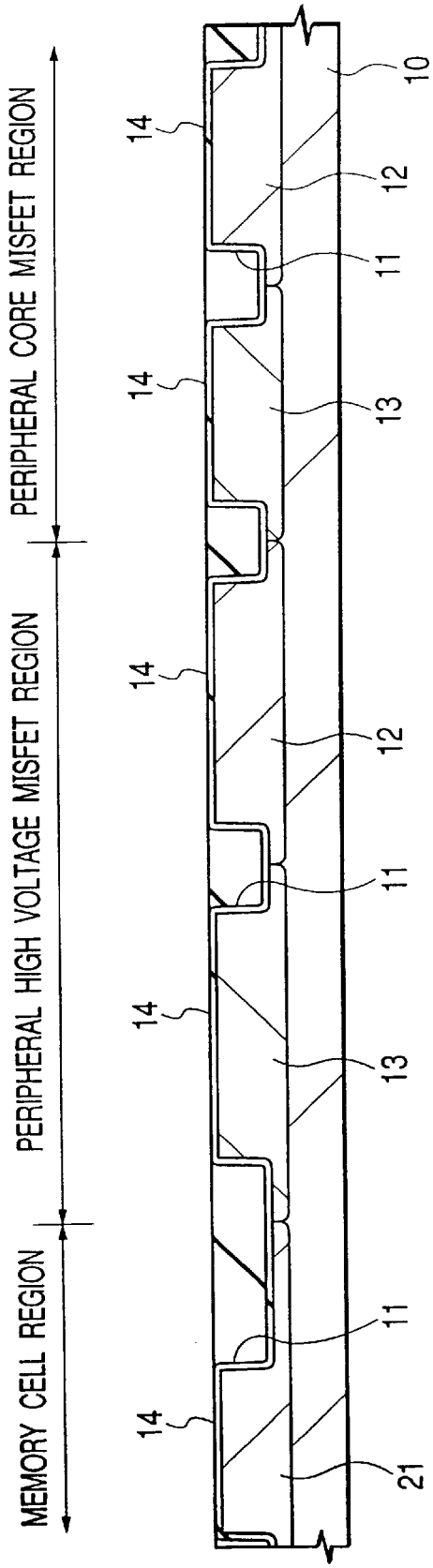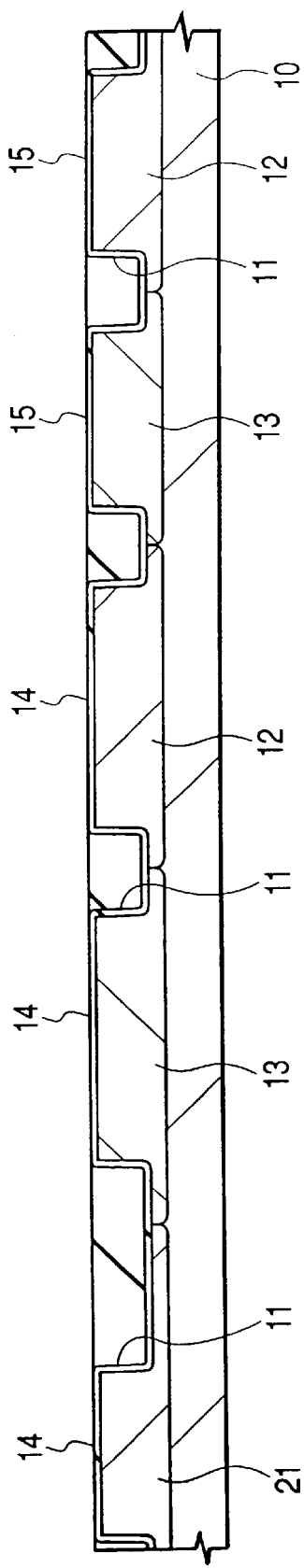

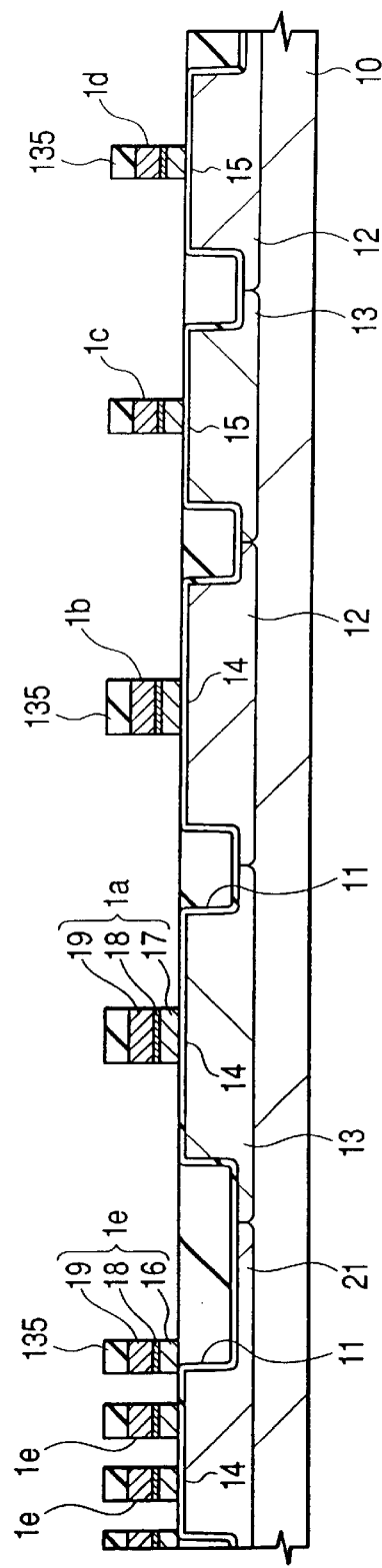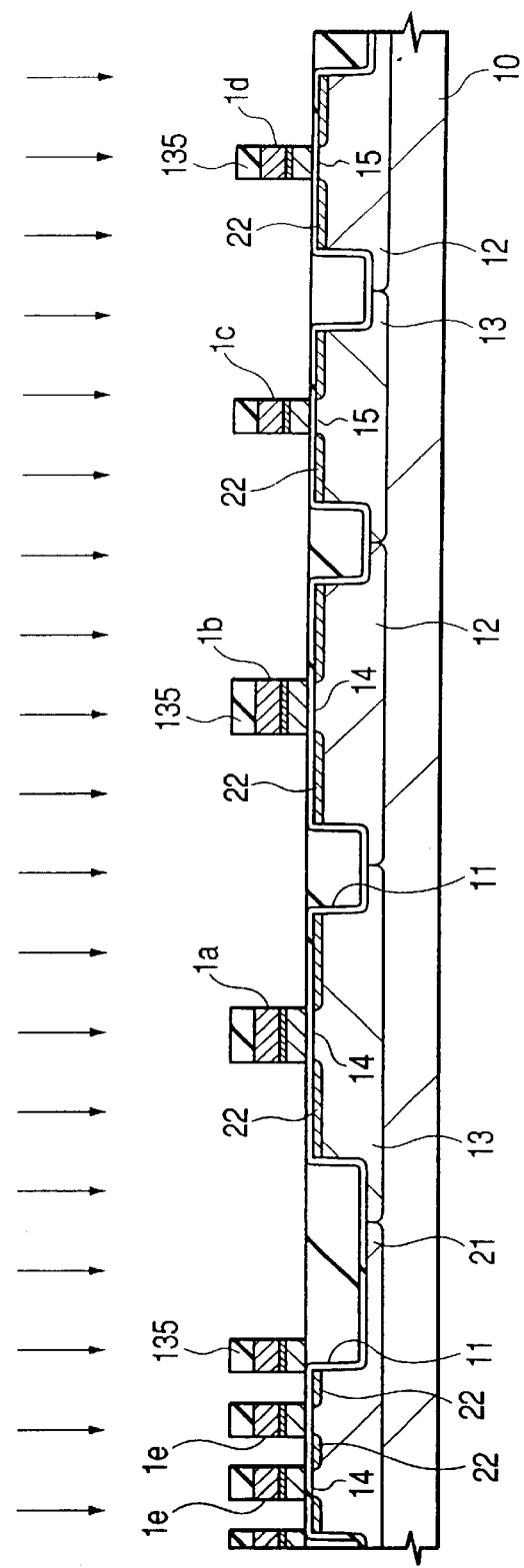

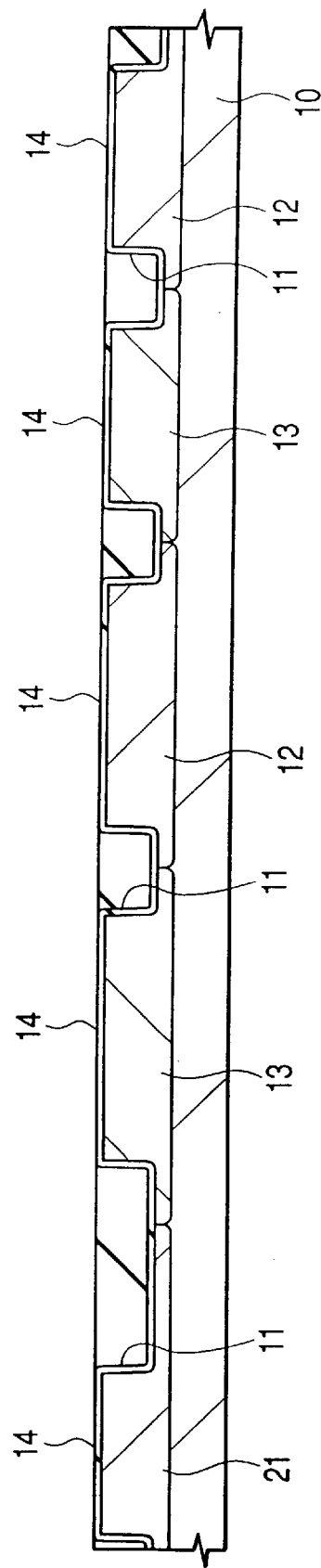
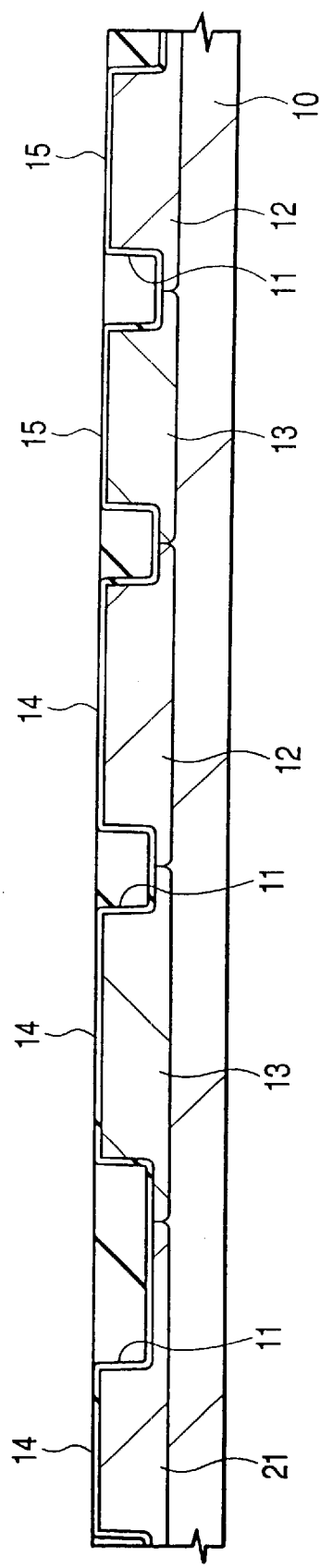

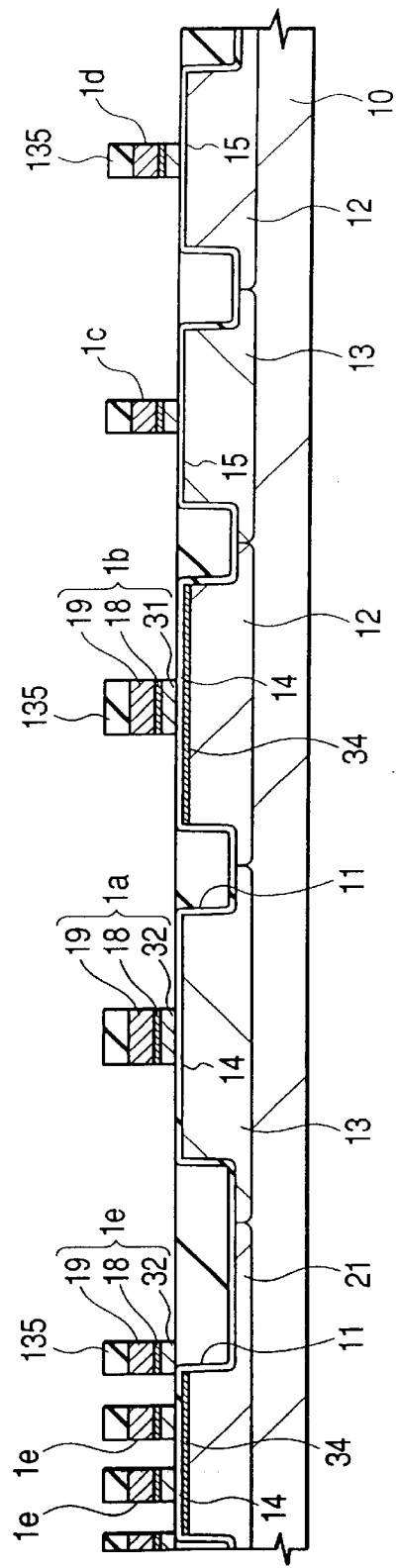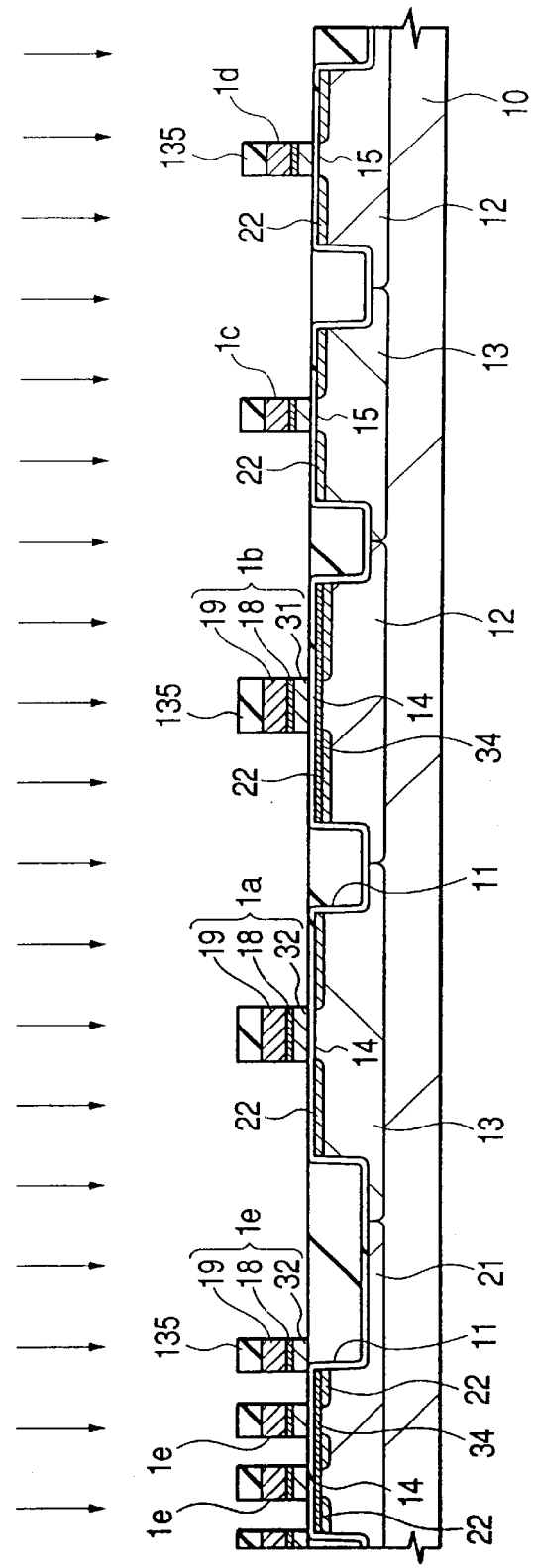

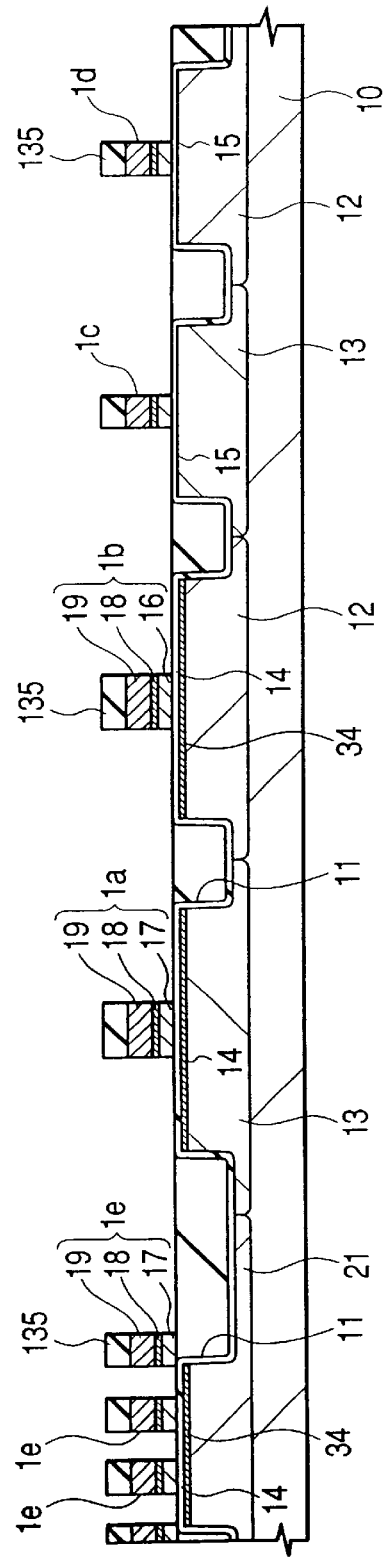
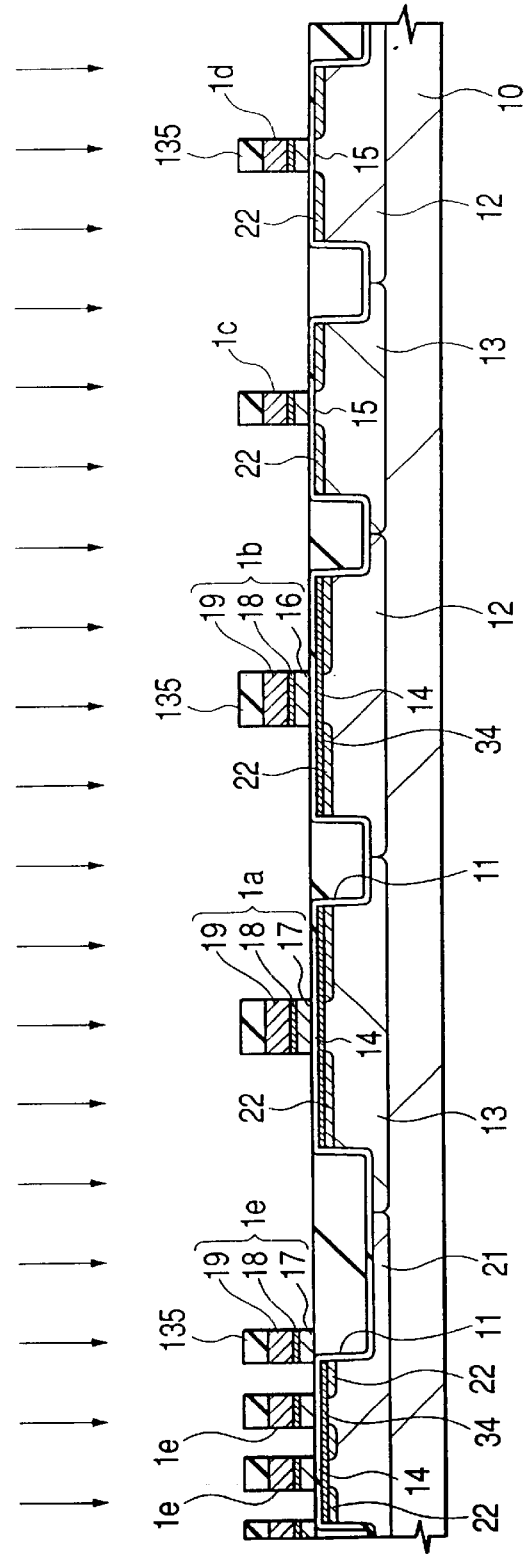

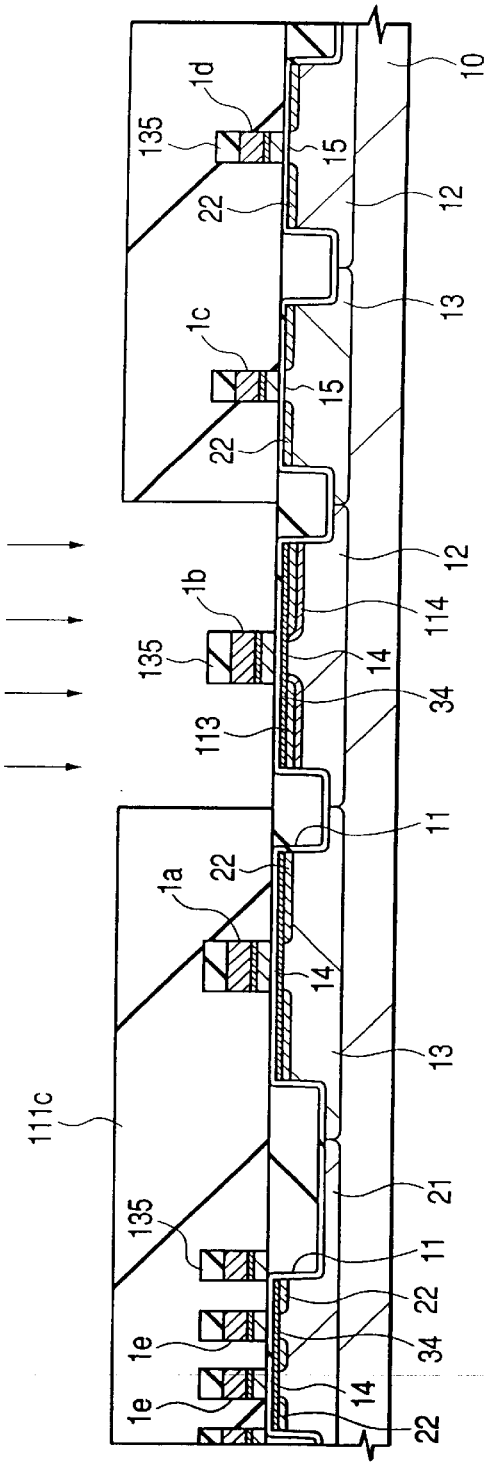
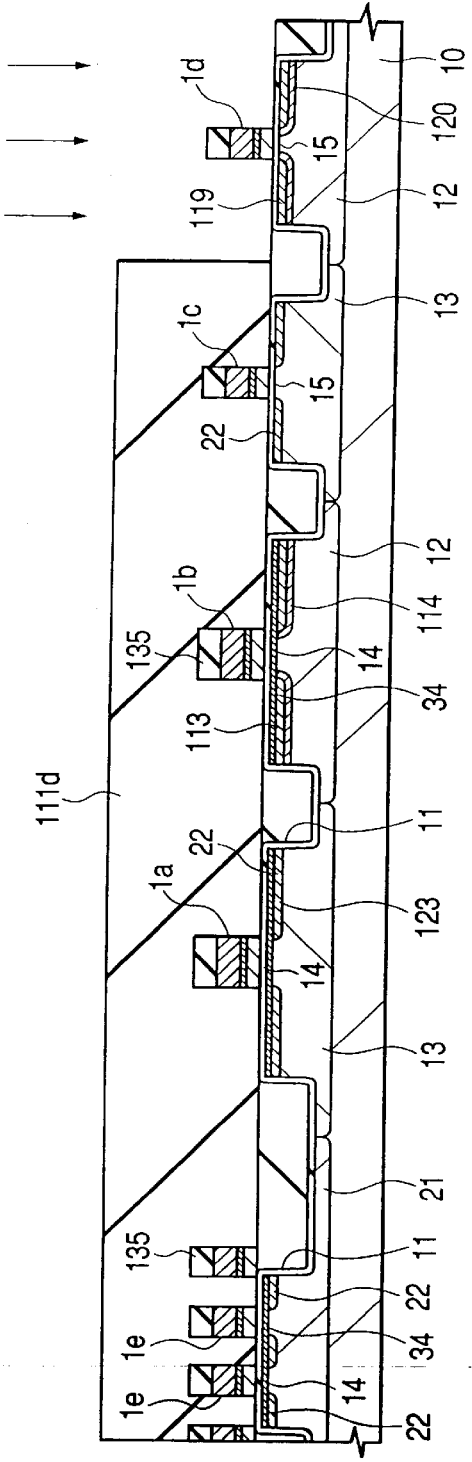

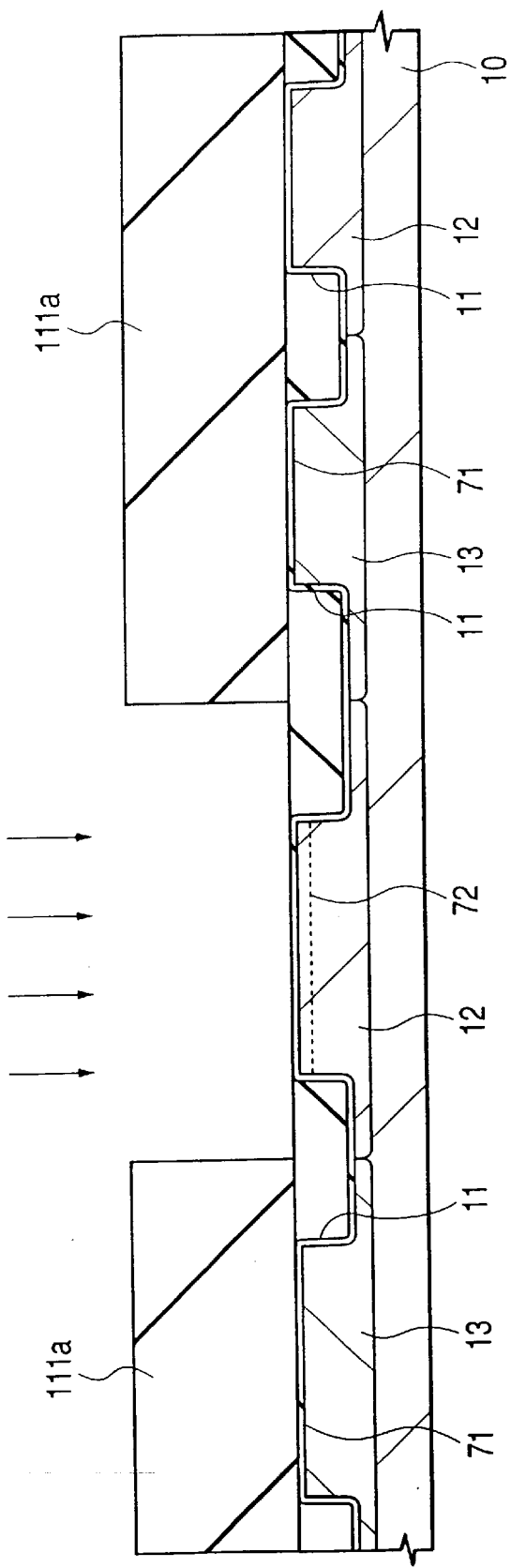
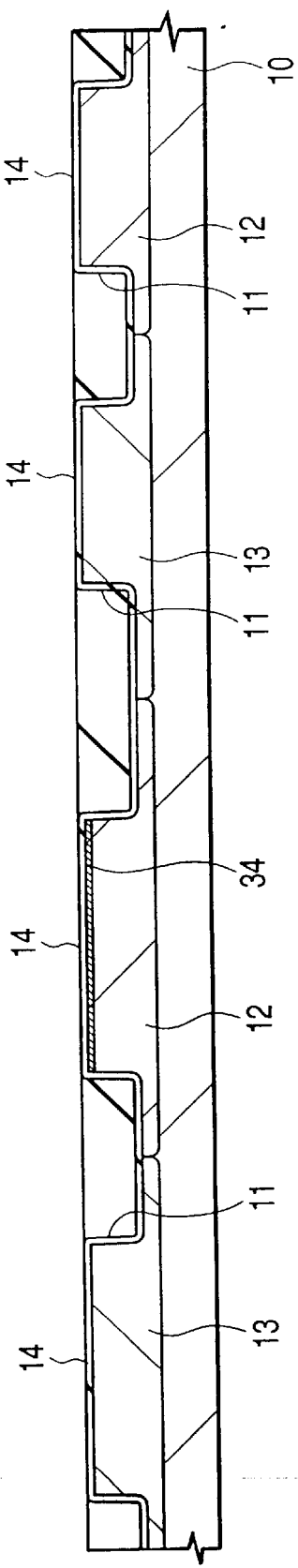

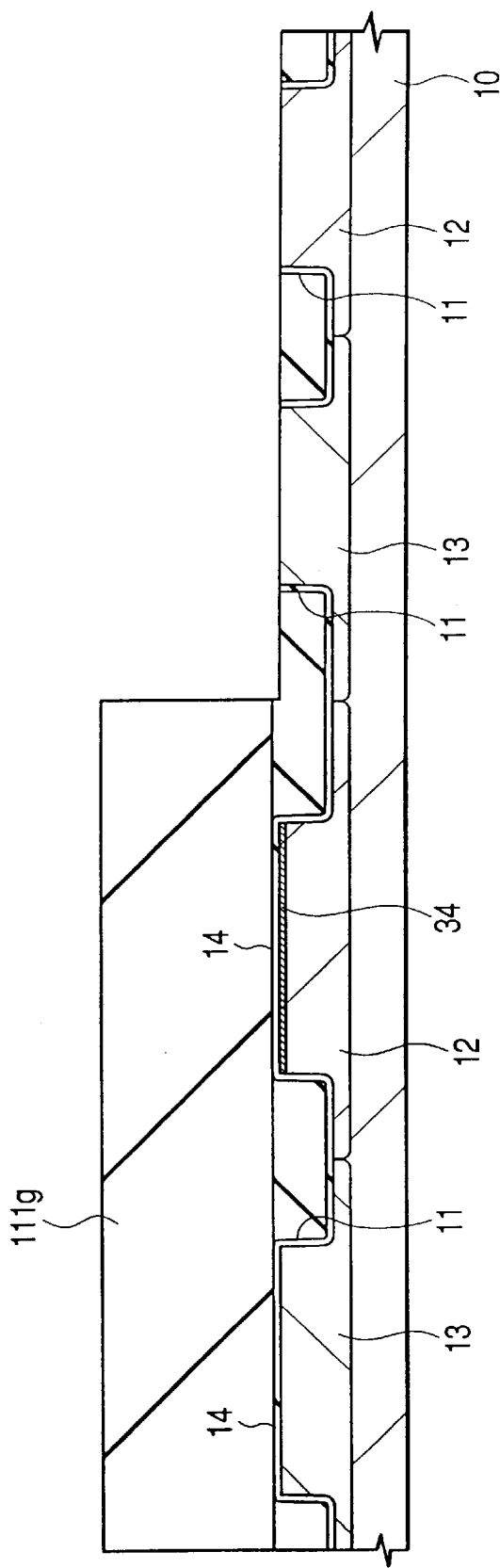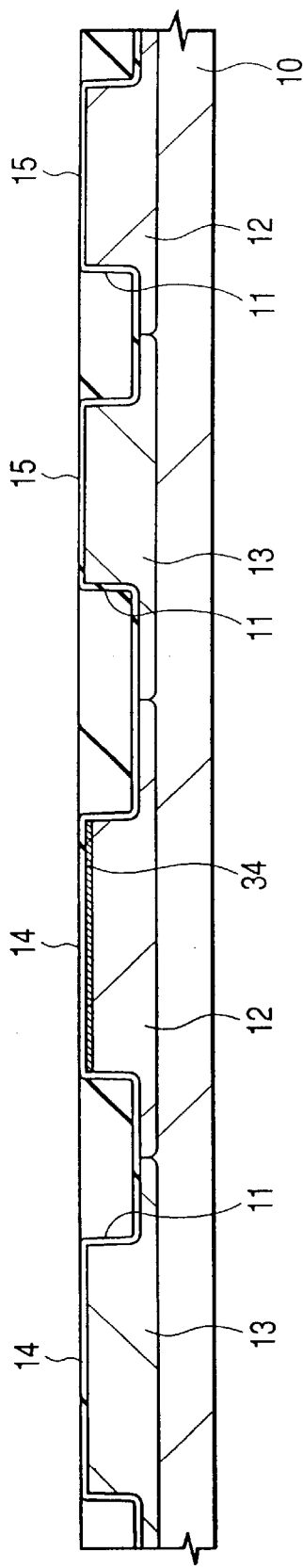

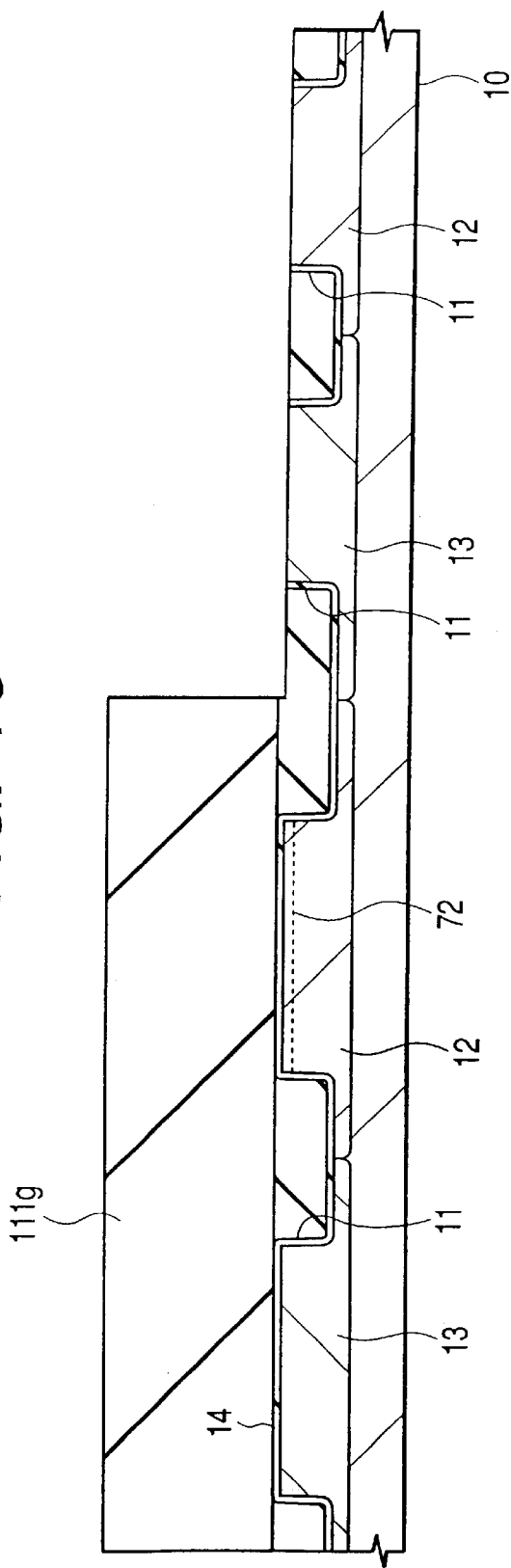
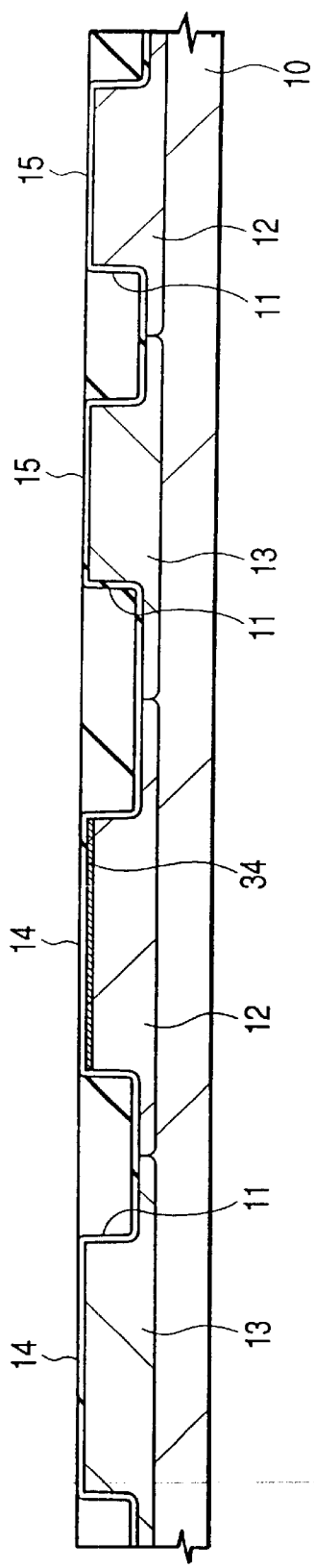

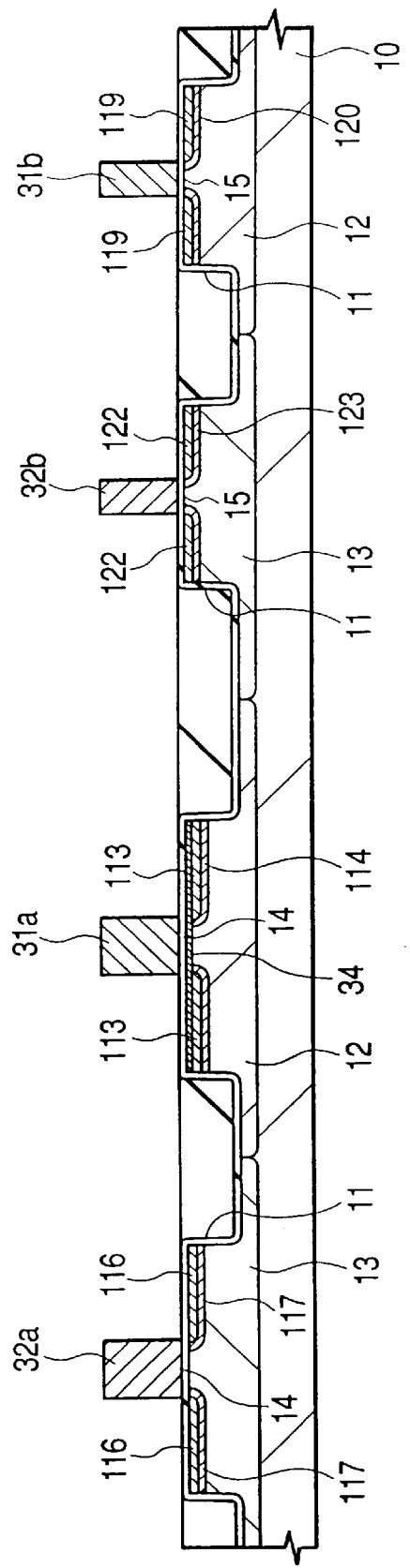
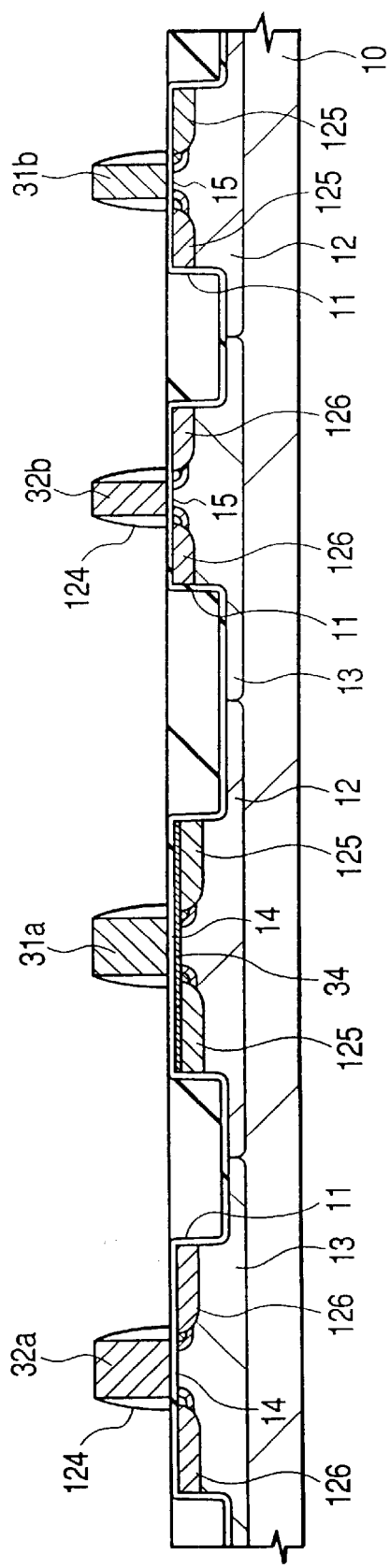

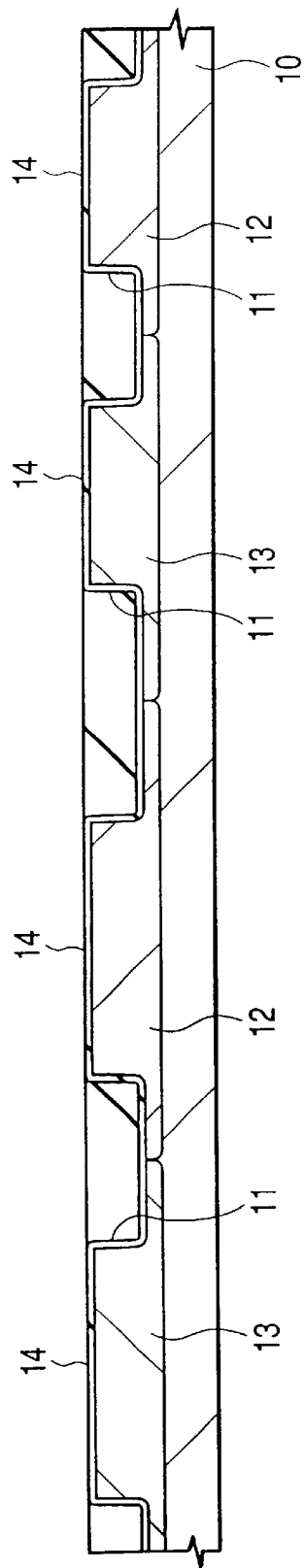
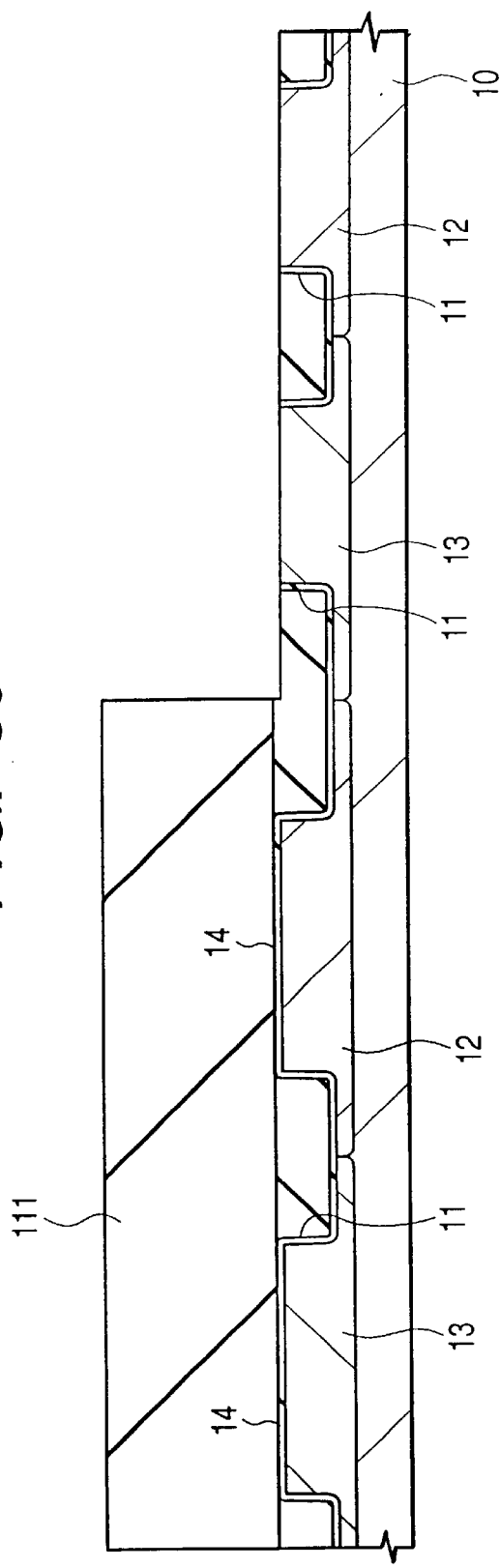
FIG. 79
FIG. 80

US 6,727,146 B2

SEMICONDUCTOR DEVICE AND METHOD OF MANUFACTURING THEREOF

This application is a continuation application of U.S. application Ser. No. 09/942,668 filed on Aug. 31, 2001 is now abandoned.

TECHNICAL FIELD OF THE INVENTION

The present invention relates to a semiconductor device and a manufacturing technique of the semiconductor device. More particularly, the present invention relates to a technique for optimizing an amount of nitrogen that is contained in an interface between a gate insulation film and a semiconductor substrate of a MISFET (Metal Insulator Semiconductor Field Effect Transistor), thereby improving device reliability such as hot carrier reliability.

BACKGROUND OF THE INVENTION

In recent years, since it becomes evident that a gate oxide film is oxy-nitrided in gas atmosphere such as NO or $N_2O$, and nitrogen atoms are piled up on an interface between the gate oxide film and a silicon substrate, thereby making it possible to improve a hot carrier reliability of an n-channel type MISFET, and restrain boron (B) penetration from a p-type polycrystal silicon gate, this oxynitridation has been practically available for use in logic products.

However, there has been a report that, if an amount of nitrogen in the interface between the gate oxide film and the silicon substrate (hereinafter, referred to as a $SiO_2/Si$ interface) is excessively increased, a p-channel type MISFET is severely degraded (for example, NBTI (negative bias temperature instability) described in 1999 VLSI Symposium Digest of Technical Paper, P. 73). Therefore, control of an amount of nitrogen in the above interface is an important task.

In addition, as a substitutive technique of an oxynitridation, for example, as described in Japanese Patent Application Laid-open No. 10-79506, it is known that a similar advantageous effect is attained by ion implantation when source and drain extensions are formed after nitrogen or a nitrogen-containing ion has been subjected to gate electrode processing. FIG. 84 shows the test result showing an example, where remarkable improvement of a hot carrier reliability is achieved by almost one hundred times in a nitrogen atom of $1\times10^{15}$ $cm^{-2}$ in dosage.

SUMMARY OF THE INVENTION

However, according to study of the Inventor, recent logic LSI products employ gate oxide films having dual oxide thickness (hereinafter, these films are referred to as a thin film and a thick film for clarity). Thus, in the same oxynitridation, as a result of shortage of an amount of nitrogen relevant to thick film, there has been a problem that a hot carrier reliability of an n-channel type MISFET using a thick film tends to be in short. On the other hand, in the case where an oxynitridation condition is determined in accordance with a thick film, there has been a problem that an excessive amount of nitrogen is produced, and the NBTI durability of the p-channel type MISFET is impaired, or alternatively, a fixed charge increases, and threshold voltages of the n-channel MISFET and p-channel MISFET are greatly shifted. This problem will be described more specifically with reference to the accompanying drawings.

FIG. 79 to FIG. 83 each show an outline of CMOS process flow using a gate oxide film having thickness of dual oxide level. A shallow trench isolation region 11 is formed on a silicon (Si) substrate (hereinafter, simply referred to as a substrate) 10, and a p-well 12 for n-channel type MISFET and an n-well 13 for p-channel type MISFET are formed. Then, the surface of a substrate 10 is fully oxidized, and a thick oxide film 14 is formed (FIG. 79). Next, the surface 10 of the thick MISFET section is covered with a resist mask 111, and a thick oxide film 14 at the thin MISFET section is removed by etching (FIG. 80). Next, after washing the surface of the substrate 10, the substrate 10 is re-oxidized, thereby forming a thin oxide film 15 on the substrate 10 of the thin MISFET section (FIG. 81). In this case, the thick oxide film 14 is thus re-oxidized so as to have desired film thickness, although the film thickness slightly decreases due to the above washing step. Thereafter, the full face of the substrate 10 is subjected to oxynitridation by employing an NO gas so that an nitrogen atom in desired amount is contained in an interface between the fate oxide film (14, 15) and the substrate 10.

Next, a polycrystal silicon film deposited on the substrate 10 is patterned, thereby forming gate electrodes 31 and 32. Thereafter, an extension region (n⁻ type semiconductor region) 113 and a halo region (p-type semiconductor region) 114 for punch-through restraining are formed at the p-well 12 of the thick MISFET section, and an extension region (p-type semiconductor region) 116 and a halo region (n-type semiconductor region) 117 are formed. In addition, an extension region (n-type semiconductor region) 119 and a halo region (p-type semiconductor region) 120 are formed at the p-well 12 of the thin MISFET section, and an extension region (p⁻ type semiconductor region) 122 and a halo region (n-type semiconductor region) 123 are formed at the n-well 13 (FIG. 82).

Next, a sidewall spacer 124 is formed on the side wall of gate electrodes 31a, 31b, 32a, and 32b, and then, an As ion and an boron fluoride ion is implanted in the substrate 10, thereby forming a n⁺ type semiconductor region 125 with high impurity concentration that configures the source and drain of an n-channel type MISFET and a p-channel type MISFET 126 with high impurity concentration that configures the source and drain of a p-channel type MISFET. Thereafter, a silicide layer 127 is formed each on the surface of the source and drain of the n-channel type MISFET (n⁺ type semiconductor region 125) and the surface of the source and drain of the p-channel type MISFET (p⁺ type semiconductor region 126) (FIG. 83).

However, in the above process, gate oxide films 14 and 15 of dual oxide thickness are treated in accordance with one oxynitridation step. Thus, an amount of interfacial nitrogen between the thick gate oxide film 14 and the substrate 10 is smaller than that between an interface between the thin gate oxide film 15 and the substrate 10, and a hot carrier reliability of the MISFET using a thick film becomes insufficient.

FIG. 85 shows the testing result when oxide under-layer dependency of an amount of nitrogen on the interface is investigated. In the figure, it is found that the current thick film (7 nm) contains nitrogen in amount almost 5 times as much as the current thin film (2.5 nm). Here, this phenomenon is studied by using a simple model.

When an Si substrate surface-oxide in gas such as NO is heat treated, nitridation species such as NO molecules solve and thermally diffuses in the oxide film, whereby the specifies reach an $SiO_2/Si$ interface. It is considered that this interface has a density of a site that can be coupled with nitrogen, and thus, functions as a sink. In consideration of the nitride species concentration in the oxide film based on this presumption, when the thickness of the oxide film is thin, the film has a linear distribution as shown in FIG. 86, and a flux F of the nitride specifies is prosectional to Ns/tox (Ns: oxide film surface concentration such as NO molecules (depending on solid solubility) and tox: Oxide under-layer film thickness). Therefore, the nitrogen amount N of the interface is led to be inversely prosectional to "tox" by dN/dt=F. In actuality, when the oxide film becomes thick, a complimentary error function distribution as shown in FIG. 87 is obtained, and thus, the flux F decreases more remarkably than linear approximation. Therefore, in the case where an oxide film having two types of thickness is processed in one oxynitridation process, it is found that an amount of nitrogen on the thick interface is inversely prosectional to an amount of nitrogen in thin film×film thickness at most. A policy that a thinner film is produced without changing the film thickness of the thick film is effectual, and thus, a difference in amount of nitrogen is likely to be more remarkable.

In addition, in DRAM (Dynamic Random Access Memory) embedded logic products, blanket oxynitridation is carried out while a logic side is defined as a reference, and thus, an amount of B (boron) channel implantation into a DRAM memory cell transistor increases. That is, if oxynitridation is carried out in order to improve a hot carrier reliability of a MISFET that configures the DRAM peripheral circuit, the threshold voltage of the n-channel type MISFET is reduced by generation of a fixed positive charge on the $SiO_2$/Si interface. Thus, an amount of channel B ion implantation into the n-channel type MISFET that configures a memory cell must be increased. As a result, there occurs a DRAM specific problem that the concentration of B in the substrate increases, the "pn" junction electric field is intense, a leak current increases, and data retention time is reduced. This problem is more serious as a highly integrated DRAM is embedded in the future.

The present invention has been made in order to solve the foregoing problem. It is an object of the present invention to provide a technique of improving a hot carrier reliability of a MISFET having a thick gate insulation film in a semiconductor device in which there coexist a MISFET having a thin gate insulation film and a MISFET having a thick gate insulation film.

The foregoing and other objects and novel characteristics of the present invention would be evident from a description and accompanying drawings of the specification.

An outline of typical information disclosed in the present application is briefly described as follows. According to one aspect of the present invention, there is provided a semiconductor device comprising:

a first n channel and p channel MISFET having a first gate insulation film; and a second n channel and p channel MISFET having a second gate insulation film that is thicker than the first MISFET, wherein nitrogen in amount equal to or greater than that determined by a reverse ratio of film thickness as compared with an amount that exists on an interface between the first gate insulation film and the semiconductor substrate is contained in at least one part of an interface between the second gate insulation film and a semiconductor substrate. Further, nitrogen in amount equal to or greater than that existing on an interface between a gate insulation film of the second p-channel MISFET and the substrate is contained in at least one part of an interface between a gate insulation film and a substrate of the second p-channel MISFET.

A semiconductor device, where an n-channel type MISFET that wherein a memory cell of a DRAM is formed in a first region of a main face of a semiconductor substrate, and an n-channel type MISFET and a p-channel type MISFET, each of which configures a peripheral circuit or a logic LSI of the DRAM, is formed in a second region of a main face of the semiconductor substrate, wherein nitrogen is contained in at least one part of an interface between a gate insulation film of an n-channel type MISFET and a p-channel type MISFET, each of which configures a peripheral circuit or a logic LSI of the DRAM.

According to still another aspect of the present invention, there is provided a method of manufacturing a semiconductor comprising the steps of:

(a) forming a first gate insulation film in a first region of a main face of a semiconductor substrate, followed by forming a second gate insulation film that is thicker than the first gate insulation film in a second region of a main face of the semiconductor substrate;

(b) applying oxynitridation to the first and second gate insulation film;

(c) forming a first gate electrode of a first MISFET on the top of the first gate insulation film, followed by forming a second gate electrode of a second MISFET on the top of the second insulation film; and (d) implanting an ion that contains nitrogen or nitrogen atoms in at least one part of an interface between the second gate insulation film and the semiconductor substrate before or after the step (a) or before or after the step (c).

According to a yet another aspect of the present invention, there is a method of manufacturing a semiconductor device comprising the steps of:

(a) forming a second gate insulation film on a main face of a semiconductor substrate;

(b) applying oxynitridation to the second gate insulation film;

(c) removing the second gate insulation film in a first region of the semiconductor substrate, followed by leaving the second gate insulation film in a second region of the semiconductor substrate;

(d) oxidizing the semiconductor substrate, thereby forming a first gate insulation film that is thinner than the second gate insulation film in the first region of the semiconductor substrate;

(e) applying second oxynitridation to the first and second gate insulation films; and (f) forming a first gate electrode of a first MISFET on the top of the first gate insulation film, followed by forming a second gate electrode of a second MISFET on the top of the second gate insulation film.

BRIEF DESCRIPTION OF THE DRAWINGS

FIG. 5 is a sectional view of essential parts of a semiconductor substrate showing a method of manufacturing a logic LSI according to the first embodiment;

FIG. 6 is a sectional view of essential parts of a semiconductor substrate showing a method of manufacturing a logic LSI according to the first embodiment;

FIG. 8 is a sectional view of essential parts of a semiconductor substrate showing a method of manufacturing a logic LSI according to the first embodiment;

FIG. 9 is a sectional view of essential parts of a semiconductor substrate showing a method of manufacturing a logic LSI according to the first embodiment;

FIG. 11 is a sectional view of essential parts of a semiconductor substrate showing a method of manufacturing a DRAM embedded logic LSI according to a second embodiment of the present invention;

FIG. 12 is a sectional view of essential parts of a semiconductor substrate showing a method of manufacturing a DRAM embedded logic LSI according to the second embodiment of the present invention;

FIG. 13 is a sectional view of essential parts of a semiconductor substrate showing a method of manufacturing a DRAM embedded logic LSI according to the second embodiment of the present invention;

FIG. 14 is a sectional view of essential parts of a semiconductor substrate showing a method of manufacturing a DRAM embedded logic LSI according to the second embodiment of the present invention;

FIG. 31 is a sectional view of essential parts of a semiconductor substrate showing a method of manufacturing a DRAM embedded logic LSI according to a fourth embodiment of the present invention;

FIG. 32 is a sectional view of essential parts of a semiconductor substrate showing a method of manufacturing a DRAM embedded logic LSI according to the fourth embodiment of the present invention;

FIG. 35 is a sectional view of essential parts of a semiconductor substrate showing a method of manufacturing a DRAM embedded logic LSI according to the fourth embodiment of the present invention;

FIG. 36 is a sectional view of essential parts of a semiconductor substrate showing a method of manufacturing a DRAM embedded logic LSI according to the fourth embodiment of the present invention;

FIG. 53 is a sectional view of essential parts of a semiconductor substrate showing a method of manufacturing a DRAM embedded logic LSI according to the sixth embodiment;

FIG. 54 is a sectional view of essential parts of a semiconductor substrate showing a method of manufacturing a DRAM embedded logic LSI according to the sixth embodiment;

FIG. 55 is a sectional view of essential parts of a semiconductor substrate showing a method of manufacturing a DRAM embedded logic LSI according to the sixth embodiment;

FIG. 56 is a sectional view of essential parts of a semiconductor substrate showing a method of manufacturing a DRAM embedded logic LSI according to the sixth embodiment;

FIG. 63 is a sectional view of essential parts of a semiconductor substrate showing a method of manufacturing a logic LSI according to a seventh embodiment;

FIG. 64 is a sectional view of essential parts of a semiconductor substrate showing a method of manufacturing a logic LSI according to the seventh embodiment;

FIG. 65 is a sectional view of essential parts of a semiconductor substrate showing a method of manufacturing a logic LSI according to the seventh embodiment;

FIG. 66 is a sectional view of essential parts of a semiconductor substrate showing a method of manufacturing a logic LSI according to the seventh embodiment;

FIG. 73 is a sectional view of essential parts of a semiconductor substrate showing a method of manufacturing a logic LSI according to an eighth embodiment;

FIG. 74 is a sectional view of essential parts of a semiconductor substrate showing a method of manufacturing a logic LSI according to the eighth embodiment;

FIG. 75 is a sectional view of essential parts of a semiconductor substrate showing a method of manufacturing a logic LSI according to the eighth embodiment;

FIG. 76 is a sectional view of essential parts of a semiconductor substrate showing a method of manufacturing a logic LSI according to the eighth embodiment;

FIG. 79 is a sectional view of essential parts of a semiconductor substrate showing a method of manufacturing a CMOS-logic LSI studied by the Invention;

FIG. 80 is a sectional view of essential parts of a semiconductor substrate showing a method of manufacturing a CMOS-logic LSI studied by the Invention;

DESCRIPTION OF THE PREFERRED EMBODIMENTS

Figure 1:
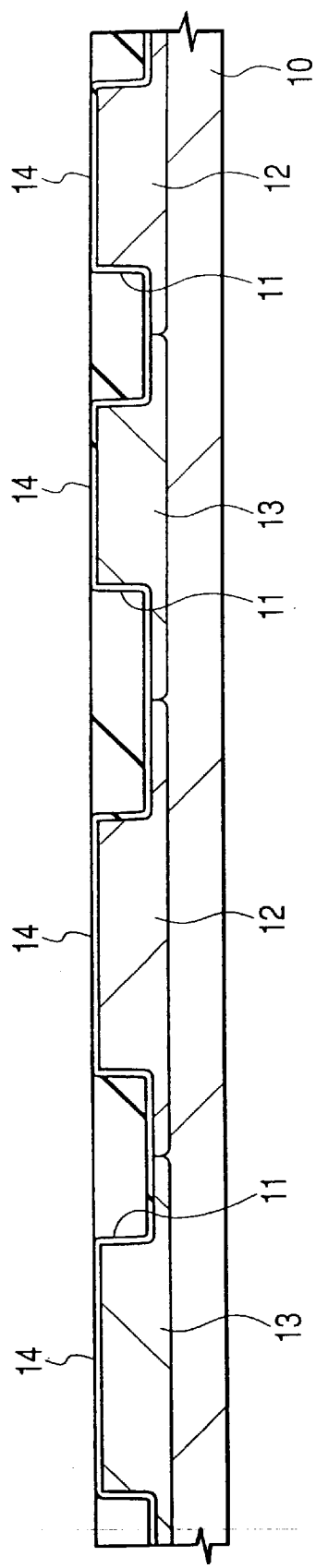
FIG. 1 is a sectional view of essential parts of a semiconductor substrate showing a method of manufacturing a logic LSI according to a first embodiment of the present invention.

Hereinafter, preferred embodiments of the present invention will be described with reference to the accompanying drawings. In the figures, for the purpose of illustration of embodiments, like elements having the same functions are designated by like reference numerals. A duplicate description will be omitted here.

First Embodiment

The present embodiment describes an example of application of nitrogen ion implantation into source and drain extension regions to a logic LSI.

First, as shown in FIG. 1, as in a conventional technique, a shallow trench isolation region 11 is formed at a silicon substrate (hereinafter, referred to as a substrate) 10, and then, a p-well 12 for n-channel type MISFET and a n-well 13 for p-channel MISFET are formed by impurity ion implantation. Thereafter, the full face of the substrate 10 is surface-oxidized, and a thick gate oxide film (thick oxide film) 14 is formed.

Figure 2:
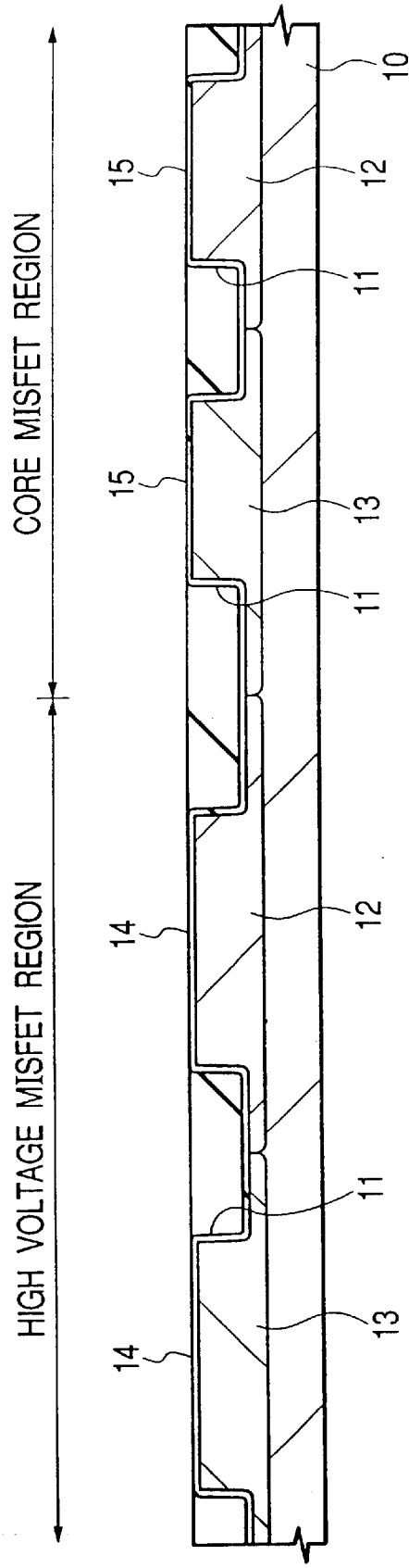
FIG. 2 is a sectional view of essential parts of a semiconductor substrate showing a method of manufacturing a logic LSI according to the first embodiment.

Next, as shown in FIG. 2, as in the conventional technique, a thick oxide film 14 is left in a high voltage resistance MISFET region (left half of the figure), and only the thickness of a core MISFET-region (right half of the figure) 14 is removed. After surface washing, the substrate 10 is re-oxidized, thereby forming a thin gate oxide film (thin oxide film) 15 on the surface of the substrate 10 in the core MISFET. The thick oxide film 14 is additionally oxidized so as to have desired film thickness, although the film thickness slightly decreases in the washing step. Thereafter, the full face of the substrate 10 is subjected to oxynitridation at 1050° C. and for 30 seconds using NO gas so that a nitrogen atom in desired amount is contained in a $SiO_2/Si$ interface of the thick oxide film 15 (not shown). At this time, although the $SiO_2/Si$ interface of the thick oxide film 14 is also oxy-nitrided at the same time, an amount of nitrogen is smaller than that at the thin film section.

Figure 3:
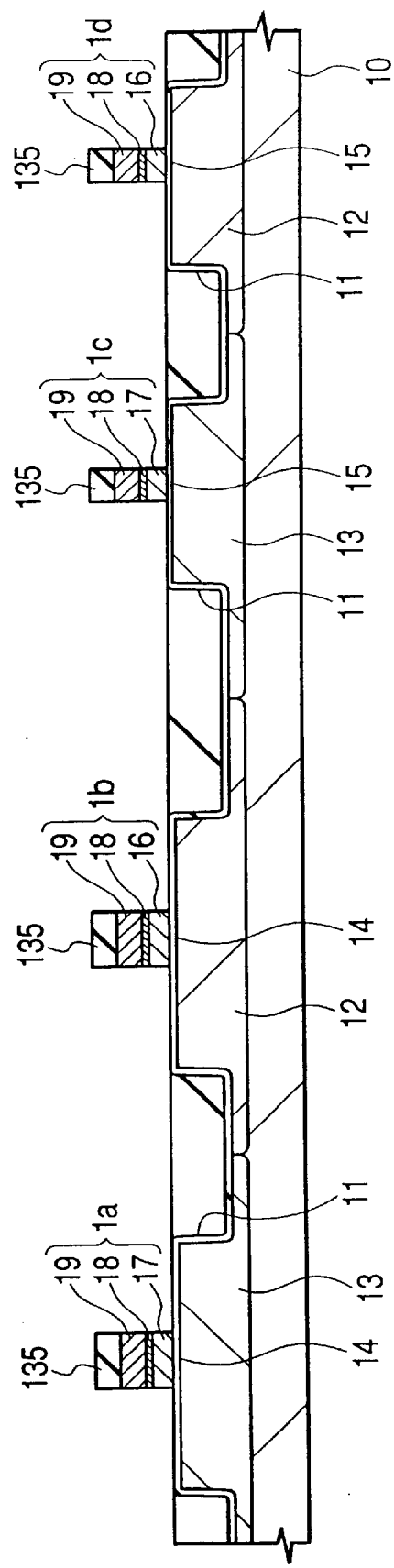
FIG. 3 is a sectional view of essential parts of a semiconductor substrate showing a method of manufacturing a logic LSI according to the first embodiment.

Next, as shown in FIG. 3, there are formed gate electrodes 1a to 1d each having a poly Si-metal structure, each of which comprises a three-layer film, i.e., an n-type polycrystal silicon film 16 (and p-type polysilicon film 17), WN (tungsten nitride) film 18 and a W (tungsten) film 19. In the n-type polycrystal silicon film 16 and p-type polycrystal silicon film 17, after a polycrystal silicon film is deposited on the substrate 10, P (phosphor) ion is implanted into a part of the films, and B (boron) ion is implanted into another part of the films, respectively, thereby forming these films. A silicon nitride film 135 is formed on the top of the gate electrodes 1a to 1d.

Figure 4:
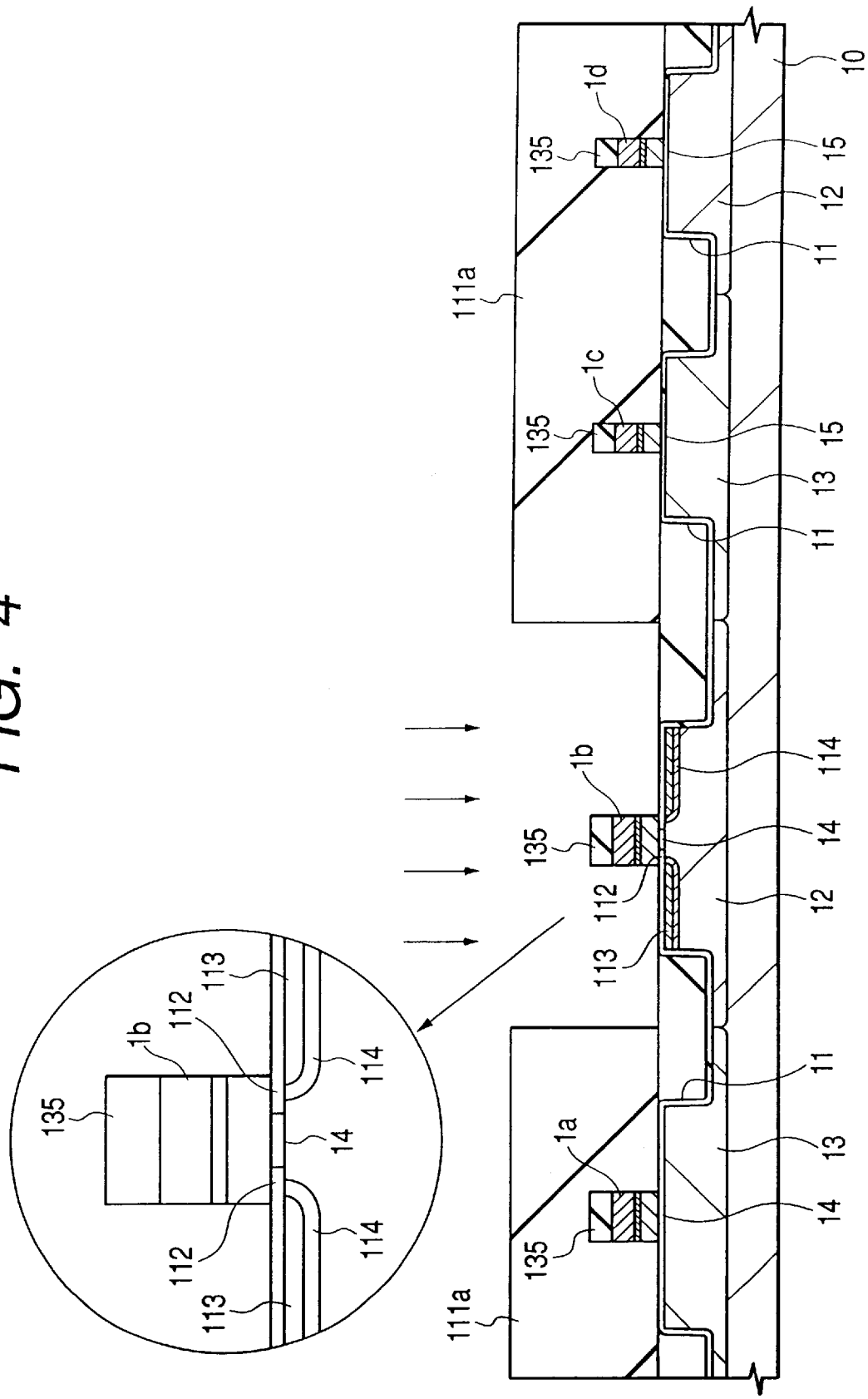
FIG. 4 is a sectional view of essential parts of a semiconductor substrate showing a method of manufacturing a logic LSI according to the first embodiment.

Next, as shown in FIG. 4, using a resist mask 111a having only a high voltage resistance n-channel type MISFET forming region opened thereat, a nitrogen ion ($N_2^+$, 40 KeV, $2\times10^{15}$ cm$^{-2}$), thereby forming a highly oxy-nitrided region 112 at a part of the gate oxide film 14. Then, P-ion and boron fluoride-ion are implanted, thereby forming a high voltage resistance n-channel type MISFET extension region (n$^-$ type semiconductor region) 113 and a halo region (p-type semiconductor region) 114. At this time, a nitrogen ion is first implanted, whereby the surface of the substrate 10 is pre-amorphized, and B or P channeling is prevented. Thus, a shallow junction (extension region 113 and halo region 114) can be formed.

Next, as shown in FIG. 5, using a resist mask 111b having only a high voltage resistance p-channel type MISFET region opened thereat, a boron fluoride-ion and a p-ion 115 are implanted, thereby forming a high voltage resistance p-channel type MISFET extension region (p$^-$ type semiconductor region) 116 and a halo region (n-type semiconductor region) 117.

Figure 7:
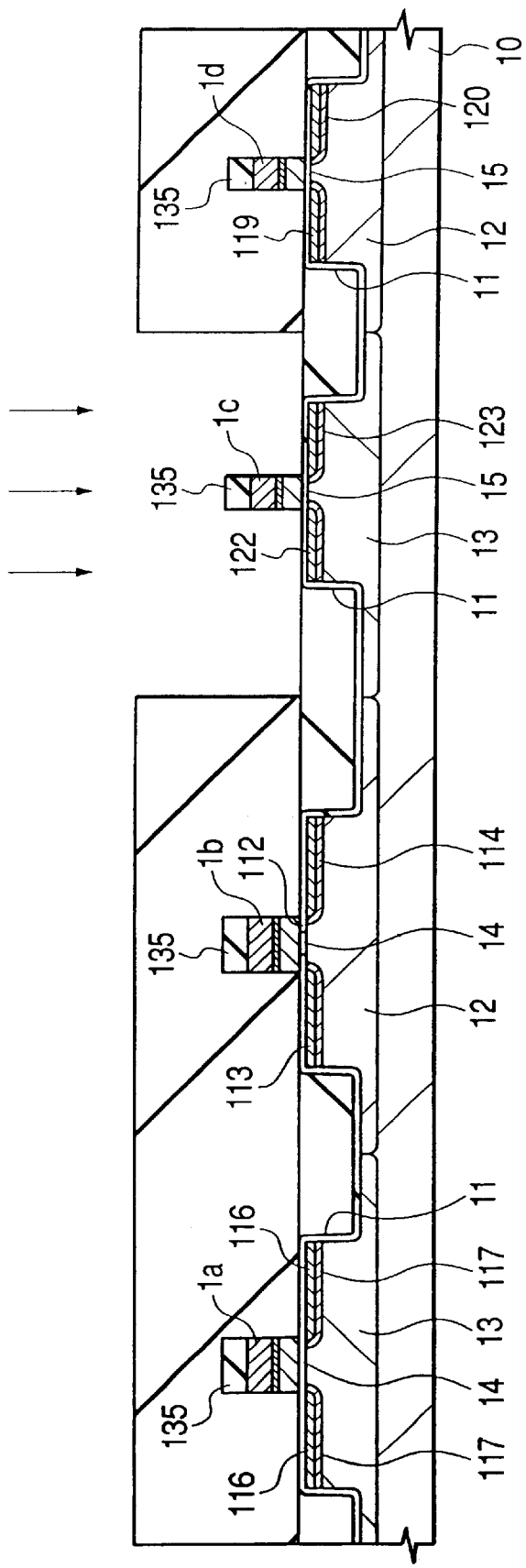
FIG. 7 is a sectional view of essential parts of a semiconductor substrate showing a method of manufacturing a logic LSI according to the first embodiment.

Next, as shown in FIG. 6, in the same way as the above, the extension region 119 and halo region 120 of the core n-channel type MISFET are formed. As shown in FIG. 7, a p-channel type MISFET extension region 122 and a halo region 123 are formed. At this stage, when short-time heat treatment is carried out, impurities are electrically activated. At the same time, a highly oxy-nitrided region 112 is formed only in the vicinity of source and drain edges of a high voltage resistance n-channel type MISFIT.

Next, in accordance with a general CMOS process, as shown in FIG. 8, a sidewall spacer 124 is formed on the side wall of the gate electrode. Then, as shown in FIG. 9, an As-ion and a boron fluoride-ion are implanted into the substrate 10, thereby forming an n$^+$ type semiconductor region 125 with high impurity concentration that configures the n-channel type MISFET source and drain and a p$^+$ type semiconductor region 126 with high impurity concentration that configures the p-channel type MISFET source and drain. Thereafter, a silicide layer 127 is formed each on the surface of the n-channel type MISFET source and drain and the surface of the p-channel type MISFET source and drain.

Figure 10:
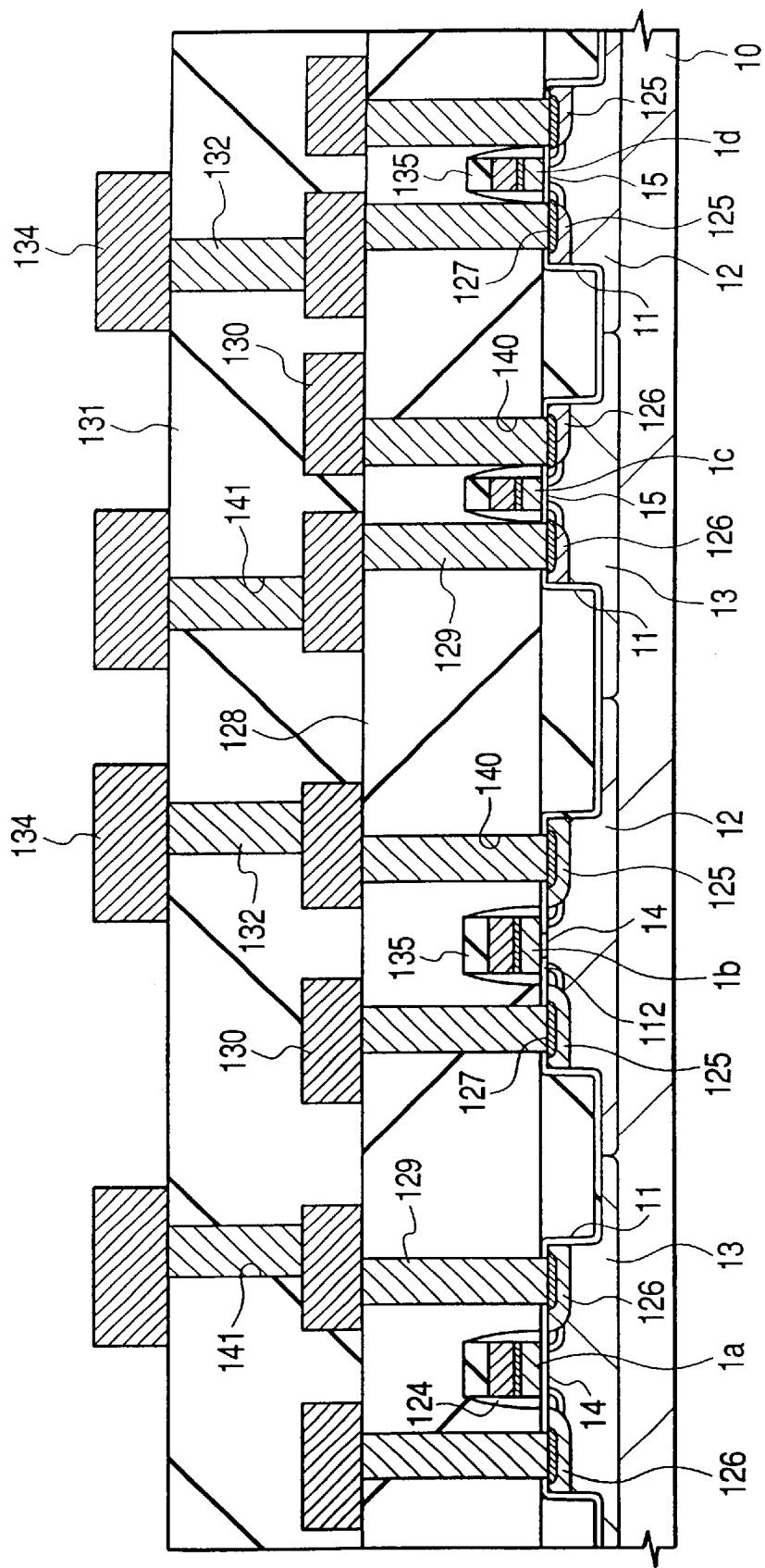
FIG. 10 is a sectional view of essential parts of a semiconductor substrate showing a method of manufacturing a logic LSI according to the first embodiment.

Then, as shown in FIG. 10, a first interdielectric film 128 is formed on the top of the MISFET, and then, a W plug 129 is embedded in a contact hole 140 formed at the first interdielectric film 128 on the top of the source and drain (n$^+$ type semiconductor region 125 and p$^+$ type semiconductor region 126). Thereafter, a metal interconnect 130 of a first layer is formed on the top of the first interdielectric film 128. Similarly, a second interdielectric film 131 is formed on the top of the metal interconnect 130 of the first layer, and then, a W plug 132 is embedded in a contact hole 141 formed at the second interdielectric film 131 on the top of the metal layer 130. Thereafter, a metal interconnect 134 of a second layer is formed on the top of the second interdielectric film 131. In addition, metal interconnects of one or plural layers may be further formed on the top of the metal interconnect 134 of the second layer. The metal interconnects 130 and 134 each are formed of W, for example. As has been described above, a logic LSI is completed.

According to the present invention, it is verified that a sufficient amount of nitrogen atoms exist on the $SiO_2$/Si interface of the drain edge of the high voltage resistance n-channel type MISFET, and the life of hot carrier reliability is 10 years or more. In addition, it is verified that the NBTI life of the p-channel type MISFET is 10 years or more. That is, as a result of optimizing an amount of nitrogen on the $SiO_2$/Si interface of the core n-channel type MISFET and high voltage resistance n-channel type MISFET, sufficient hot carrier reliability can be ensured without any side effect.

In a selective oxynitridation technique using nitrogen ion implantation, it is possible to further select a specific section of the thicker n-channel type MISFET. For example, nitrogen ion is implanted into a site at which a gate length is short, and countermeasures against a hot carrier is indispensable. Nitrogen ion is not implanted into a site at which an occurrence of a 1/f noise or the like is not preferable as in analog MISFET. However, in the case where nitrogen is ion implanted into all the n-channel type MISFETs, a general extension implantation mask can be used, and thus, there is an advantage that an increased number of steps can be minimized.

Second Embodiment

The present embodiment describes an example of application of nitrogen ion implantation into source and drain extension regions into a DRAM embedded logic LSI (system LSI having DRAM).

First, as shown in FIG. 11, a shallow trench isolation region 11 is formed on a silicon substrate 10, thereby forming a p-well 21 for n-channel type MISFET that configures a memory cell, a p-well 12 for the peripheral n-channel type MISFET, and an n-well 13 for the peripheral p-channel type MISFET. Thereafter, the full face of the substrate 10 is surface oxidized, and a gate oxide film (thick oxide film) 14 is formed.

Next, as shown in FIG. 12, as in the conventional technique, a thick oxide film 14 is left in a memory cell region and its peripheral high voltage resistance MISFET region, and only the thick oxide film 14 in the peripheral core MISFET region is removed. After surface washing, the substrate 10 is re-oxidized, thereby forming a thin oxide film 15 on the surface of the substrate 10 in the core MISFET region. The thick oxide film 14 is additionally oxidized so as to have desired film thickness, although the film thickness slightly decreases in the washing step. Thereafter, the full face of the substrate 10 is subjected to oxynitridation using NO gas so that nitrogen atoms in desired amount is contained in the $SiO_2$/Si interface of the thin oxide film 15 (not shown). At this time, although the $SiO_2$/Si interface of the thick oxide film 14 is also oxy-nitrided at the same time, an amount of nitrogen is smaller than that at the thin film section.

Next, as shown in FIG. 13, there are formed gate electrodes 1a to 1e each having a poly Si metal structure, each of which comprises a three-layer film of an n-type polycrystal silicon film 16 (and p-type polycrystal silicon film 17), WN (tungsten nitride) film 18, and W (tungsten) film 19. In the n-type polycrystal silicon film 16 and p-type polycrystal silicon film 17, after a polycrystal silicon film is deposited on the substrate 10, a P (phosphor) ion is implanted into a part of the film, and a B (boron) ion is implanted into another part of the film, respectively, thereby forming the film. A silicon nitride film 135 is formed on the top of the gate electrodes 1a to 1e.

Next, as shown in FIG. 14, a p (phosphor) ion is implanted into the full face of the substrate 10, thereby forming an n-channel type MISFET extension region 22 that configures a memory cell. In the present embodiment, although a P-ion is implanted into the full face of the substrate 10 in order to reduce the number of photomasks, a region other than a memory cell region is covered with a photo resist film, whereby P-ion may be implanted into only the substrate 10 in the memory cell region.

Figure 15:
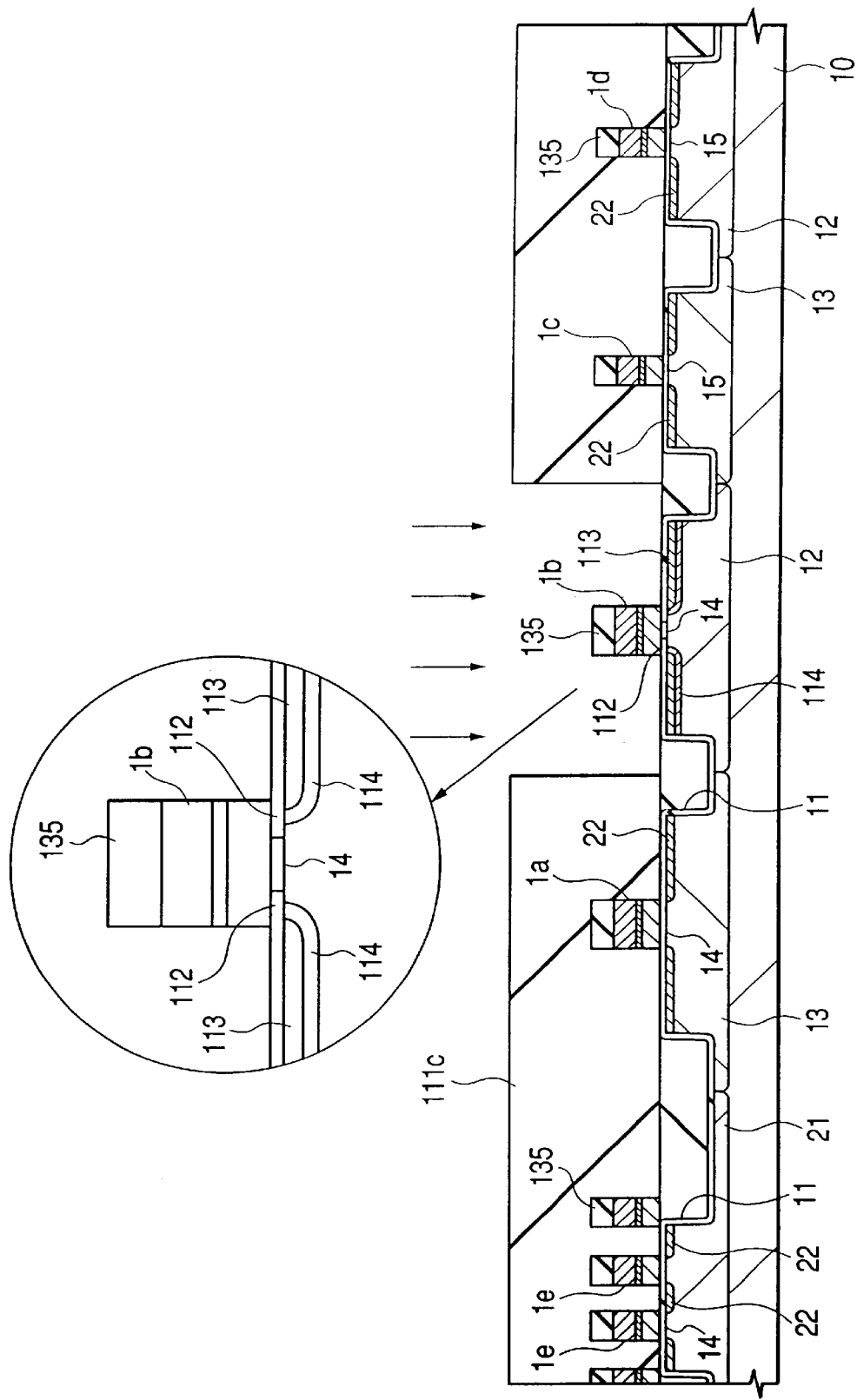
FIG. 15 is a sectional view of essential parts of a semiconductor substrate showing a method of manufacturing a DRAM embedded logic LSI according to the second embodiment of the present invention.

Next, as shown in FIG. 15, using a resist mask 111c having only the high voltage resistance n-channel type MISFET region opened thereat, a nitrogen ion, a p-ion, and a boron fluoride ion are implanted, thereby forming an extension region (n⁻ type semiconductor region 113, a halo region (p-type semiconductor region) 114, and a highly oxy-nitrided region 112 of the high voltage resistance n-channel type MISFET.

Figure 16:
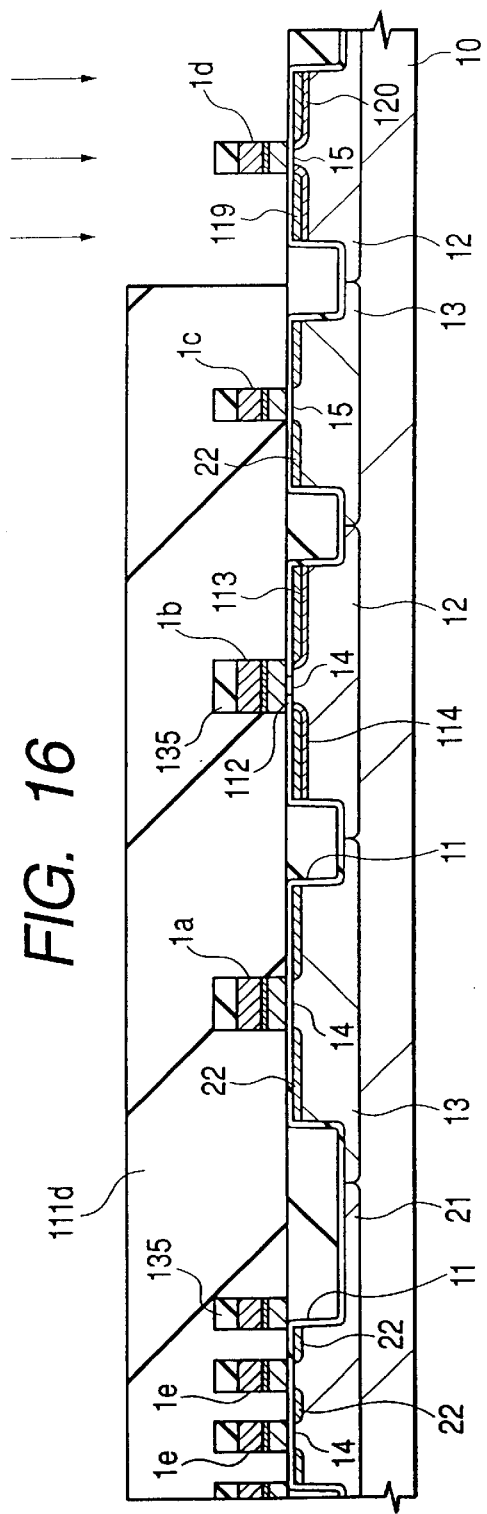
FIG. 16 is a sectional view of essential parts of a semiconductor substrate showing a method of manufacturing a DRAM embedded logic LSI according to the second embodiment of the present invention.

Next, as shown in FIG. 16, using a resist mask 111d having only the core n-channel type MISFET region opened thereat, an arsenic (As) ion and a boron fluoride ion 118 are implanted, thereby forming an extension region (n⁻ type semiconductor region) 119 and a halo region (p-type semiconductor region 120 of the core n-channel type MISFET. In the case where the nitrogen concentration on the $SiO_2$/Si interface of the thin oxide film 15 in the core n-channel type MISFET region is low, nitrogen ion implantation may be added here.

Figure 17:
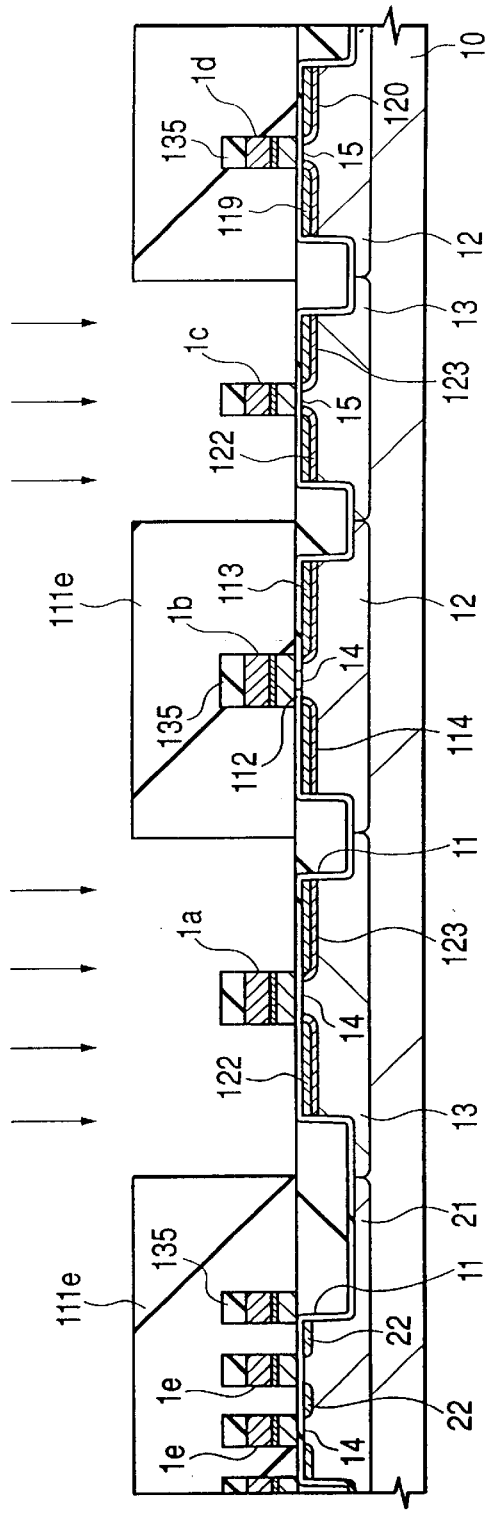
FIG. 17 is a sectional view of essential parts of a semiconductor substrate showing a method of manufacturing a DRAM embedded logic LSI according to the second embodiment of the present invention.

Next, as shown in FIG. 17, using a resist mask 111e having only a p-channel type MISFET region opened thereat, a boron fluoride ion and P-ion 121 are implanted, thereby forming an extension region ($p_-$ type semiconductor region) 122 and a halo (n-type semiconductor region) 123 of the p-channel type MISFET. In the present embodiment, in order to reduce the number of photomasks, the source and drain of the p-channel type MISFET are commonly available for use in the standard and high voltage resistance type. The source and drain of the n-channel type MISFET as well, other than a memory cell, are commonly available for use in the standard and high voltage resistance type, whereby the number of photomasks can further be reduced. At this stage, when short-time heat treatment is carried out, impurities are electrically activated, and at the same time, a highly oxy-nitrided region 112 is formed only in the vicinity of the source and drain edges of the high voltage resistance n-channel type MISFET.

Figure 18:
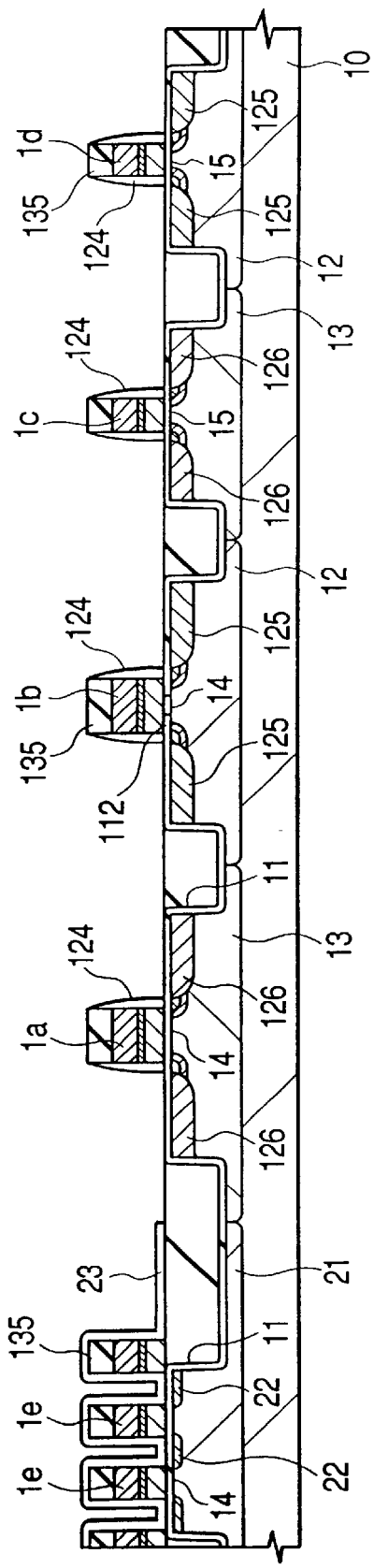
FIG. 18 is a sectional view of essential parts of a semiconductor substrate showing a method of manufacturing a DRAM embedded logic LSI according to the second embodiment of the present invention.

Next, as shown in FIG. 18, the silicon nitride film 23 deposited on the substrate 10 is anisotropically etched, thereby forming a sidewall spacer 124 on the side wall of the gate electrode of the peripheral MISFET. At this time, the silicon nitride film 23 in the memory cell area is covered with a resist mask (not shown) so as to make the silicon nitride film 23 free of being etched.

Figure 19:
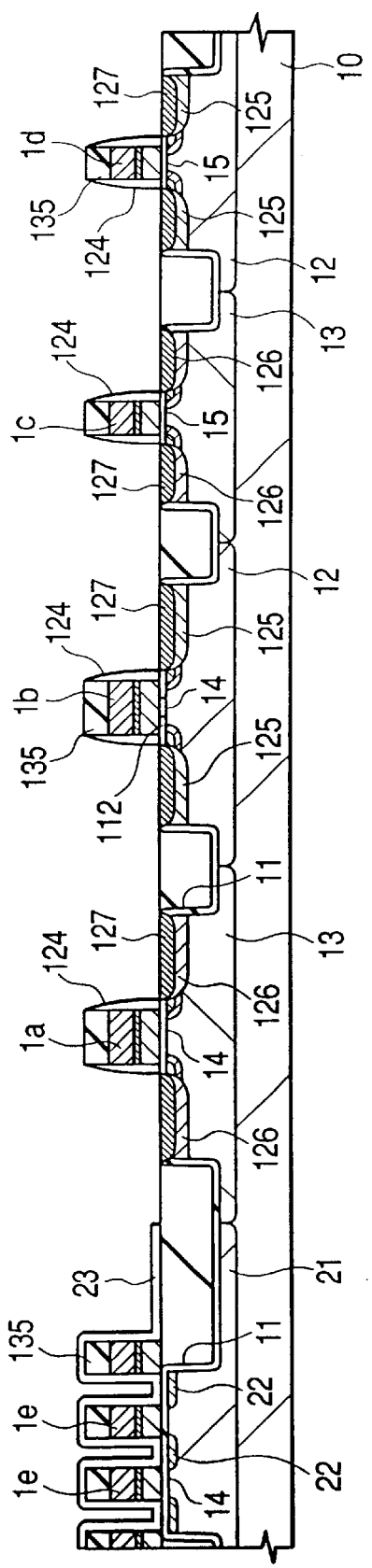
FIG. 19 is a sectional view of essential parts of a semiconductor substrate showing a method of manufacturing a DRAM embedded logic LSI according to the second embodiment of the present invention.

Then, an arsenic (As) ion and a boron fluoride ion are implanted into the substrate 10, thereby forming an n⁺type semiconductor region 125 with high impurity concentration that configures the source and drain of the peripheral n-channel type MISFET and a P⁺ type semiconductor region 126 with high impurity concentration that configures the source and drain of the peripheral p-channel type MISFET. Thereafter, as shown in FIG. 19, a silicide layer 127 is formed each on the surface of the n⁺ type semiconductor region (source and drain) 125 of the peripheral n-channel type MISFET and on the surface of the p⁺ type semiconductor region (source and drain) 126 of the peripheral p-channel type MISFET.

Figure 20:
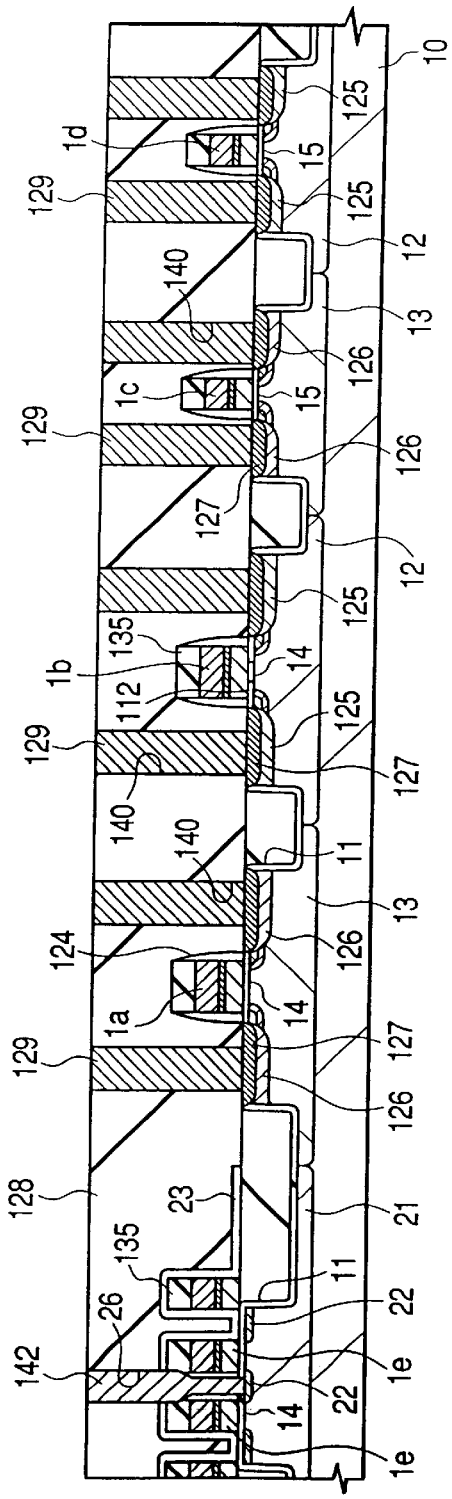
FIG. 20 is a sectional view of essential parts of a semiconductor substrate showing a method of manufacturing a DRAM embedded logic LSI according to the second embodiment of the present invention.

Next, as shown in FIG. 20, after a first interdielectric film 128 is formed on the top of the MISFET, and a polycrystal silicon plug 142 is embedded in a contact hole 26 formed at the first interdielectric film 128 on the top of one of the source and drain of the memory cell MISFET. Then, a W plug 129 is embedded in a contact hole formed at the first interdielectric film 128 at the source and drain of the peripheral MISFET.

Figure 21:
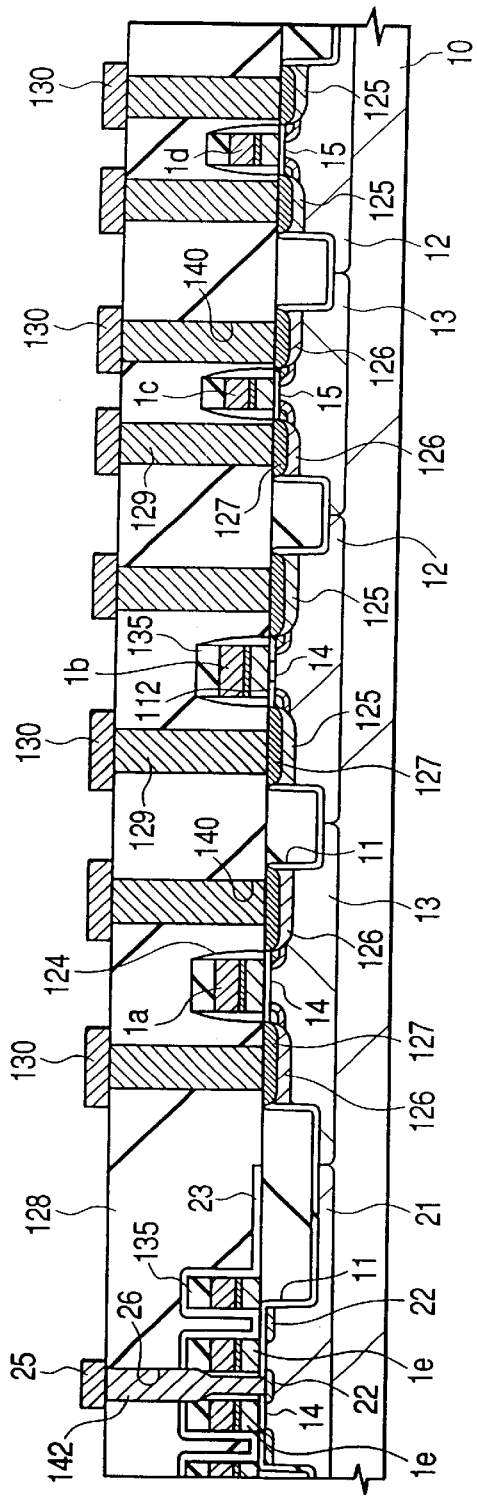
FIG. 21 is a sectional view of essential parts of a semiconductor substrate showing a method of manufacturing a DRAM embedded logic LSI according to the second embodiment of the present invention.

Next, as shown in FIG. 21, a bit line 25 and a metal interconnect 130 of a first layer are formed on the top of the first layer interdielectric film 128. The bit line 25 and metal interconnect 130 are formed of W, for example.

Figure 22:
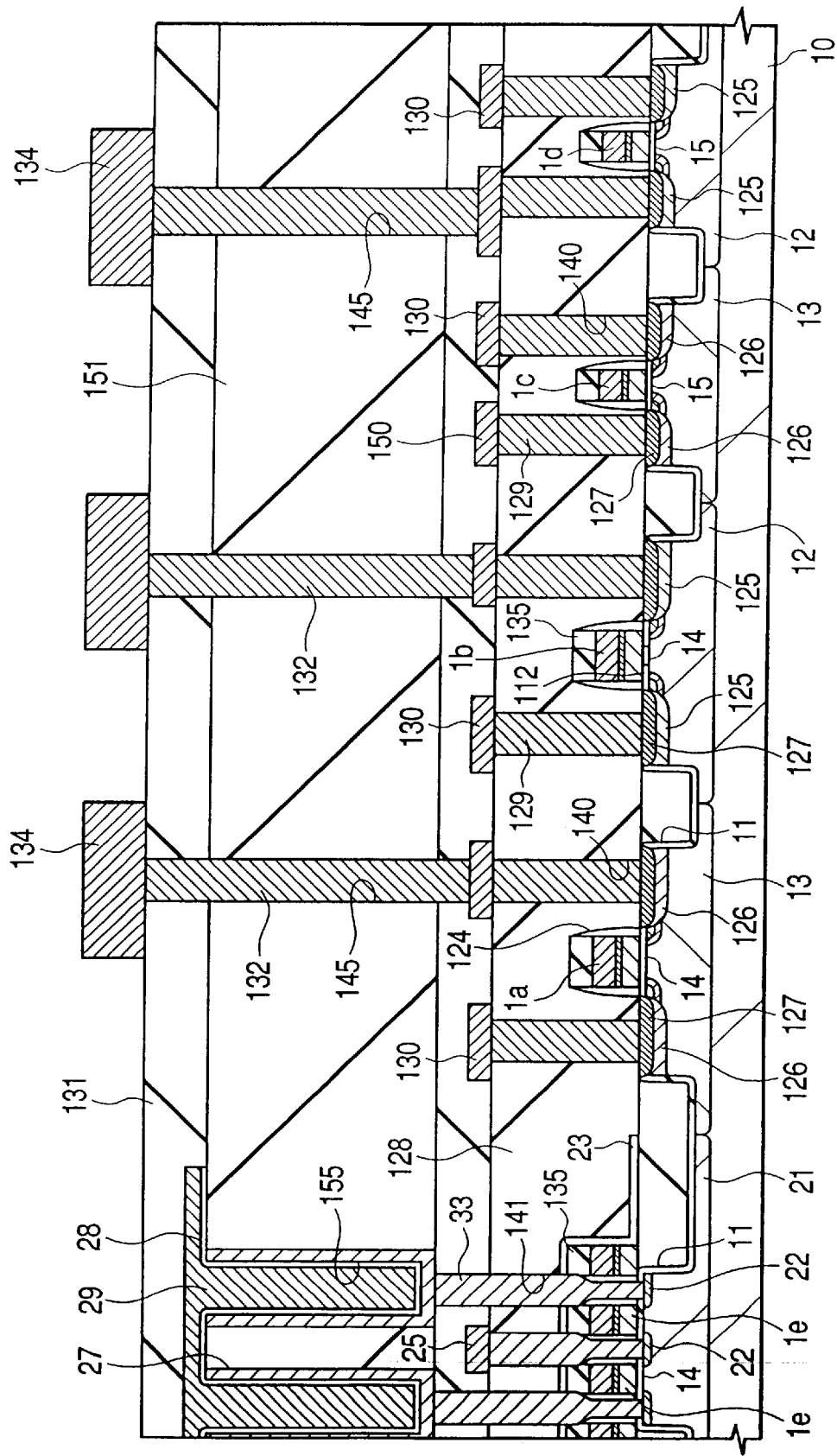
FIG. 22 is a sectional view of essential parts of a semiconductor substrate showing a method of manufacturing a DRAM embedded logic LSI according to the second embodiment of the present invention.

Next, as shown in FIG. 22, a silicon oxide film 150 is formed on the top of the bit line 25 and metal interconnect 130. Then, a first interdielectric film 128 is formed on the top of the other one of the source and drain of the memory cell MISFET, and a contact hole 141 is formed at the silicon oxide film 150. Thereafter, a polycrystal silicone plug 26 is embedded inside of the contact hole 141.

Next, an silicon oxide film 151 is embedded on the top of the silicon oxide film 150, and then, a trench 155 is formed at the silicon oxide film 151 of the memory cell region. Thereafter, a memory cell capacitor is formed inside of the trench 155. This capacitor is configured to have a lower electrode 27 that is formed of a polycrystal silicon, a capacity insulation film 28 for capacitor that is formed of a tantalum oxide ($Ta_2O_5$), and an upper electrode 29 that is formed of a titanium nitride (TiN).

Next, a second interdielectric film 131 is formed on the top of the capacitor, and then, a W plug 132 is embedded in a through hole 145 formed at the second interdielectric film 131 and silicon oxide films 151 and 150 on the top of the metal interconnect 130. Thereafter, a metal interconnect 134 as a second layer is formed on the top of the second interdielectric film 131. In addition, metal interconnects of one or plural layers may further be formed on the top of the metal interconnect 134 of the second layer. As has been described above, a DRAM embedded logic LSI is completed.

According to the present embodiment, it is verified that a sufficient amount of nitrogen atoms exist on the $SiO_2$/Si interface of the drain edge of the high voltage resistance n-channel type MISFET, and the life of the hot carrier reliability is 10 years or more. In addition, it is verified that the NBTI life of the p-channel type MISFET is 10 years or more. That is, as a result of optimizing an amount of nitrogen on the $SiO_2$/Si interface of the core n-channel type MISFET and high voltage resistance n-channel type MISFET, a sufficient hot carrier reliability can be ensured without any side effect. Further, the threshold voltage of the memory cell n-channel type MISFET minimizes an amount reduced by the oxynitridation process, thereby making it possible to increase a DRAM data retention time without increasing an amount of channel ion implantation. Further, in order to selectively ion implant nitrogen into the high voltage resistance n-channel type MISFET, a general extension implantation mask can be used. Thus, there is provided an advantage that an increased number of steps can be minimized.

The present invention is applicable to a general-purpose DRAM without any significant change. In the general-purpose DRAM, although a gate oxide film has a single oxide level, it is important to carried out nitrogen ion implantation into a high voltage resistance n-channel type MISFET of which improvement of high carrier durability is indispensable. In addition, in the case where a gate electrode of the memory cell n-channel type MISFET has an n-type polycrystal silicon structure, it is important that no nitrogen ion implantation is carried out for such site.

Third Embodiment

The present embodiment described application example 1 of nitrogen ion implantation into a channel into a logic LSI.

Figure 23:
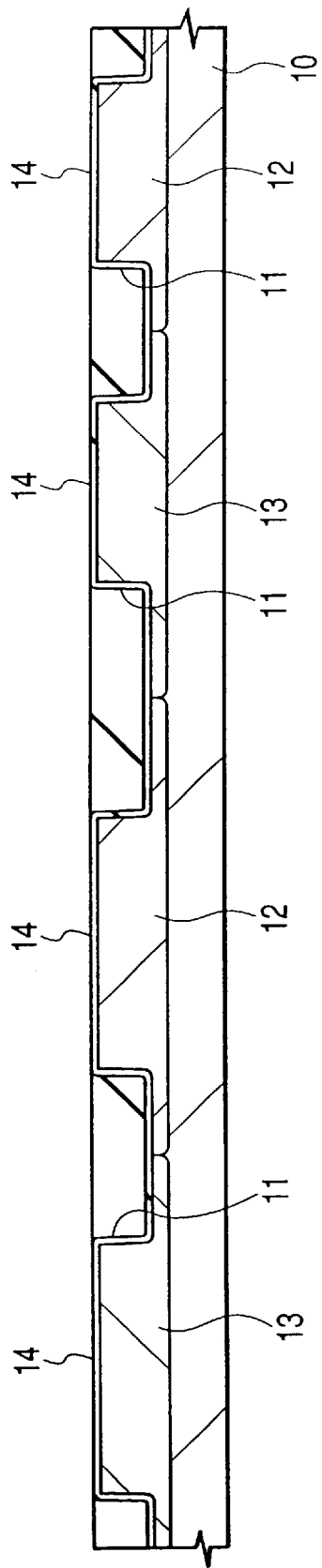
FIG. 23 is a sectional view of essential parts of a semiconductor substrate showing a method of manufacturing a logic LSI according to a third embodiment of the present invention.

First, as shown in FIG. 23, a shallow trench isolation region 11 is formed at a silicon substrate 10, and a p-well 12 for n-channel type MISFET and an n-well 13 for p-channel type MISFET is formed. Thereafter, the full face of the substrate 10 is surface oxidized, and a gate oxide film (thick oxide film) 14 is formed.

Figure 24:
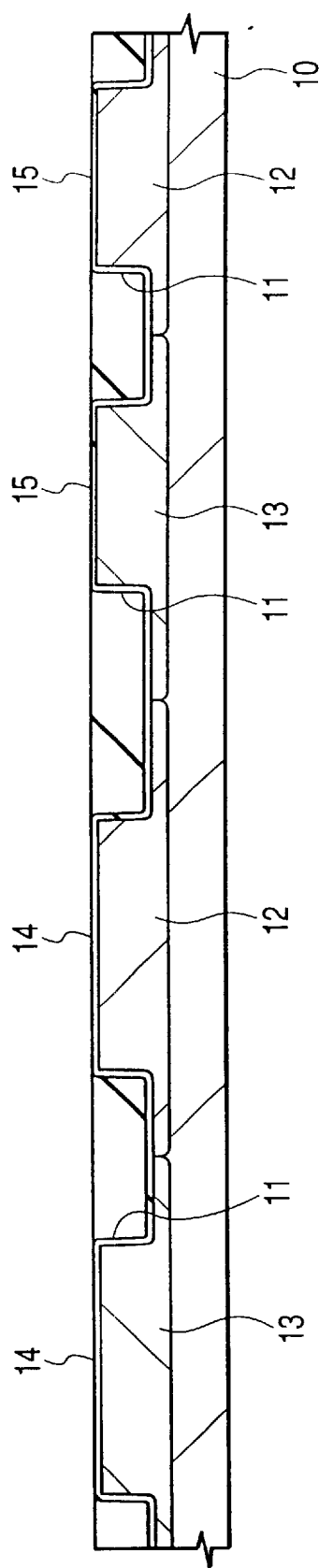
FIG. 24 is a sectional view of essential parts of a semiconductor substrate showing a method of manufacturing a logic LSI according to the third embodiment of the present invention.

Next, as shown in FIG. 24, a thick film oxidized film 14 is left in a high voltage resistance MISFET region (left half of the figure), and only a thick oxide film 14 of the core MISFET region (right half of the figure) is removed. After surface washing, the substrate 10 is re-oxidized, whereby a thin oxide film 15 is formed on the surface of the substrate 10 of the core MISFET region. The thick oxide film 14 is additionally oxidized so as to have desired film thickness, although the film thickness slightly decreases in the washing step. Thereafter, the full face of the substrate 10 is subjected to oxynitridation using NO gas so that nitrogen atoms in desired amount is contained in the $SiO_2$/Si interface of the thin oxide film 14 (not shown). At this time, although the $SiO_2$/Si interface of the thick oxide film 14 is also oxynitrided at the same time, an amount of nitrogen is smaller than that at the thin film section.

Figure 25:
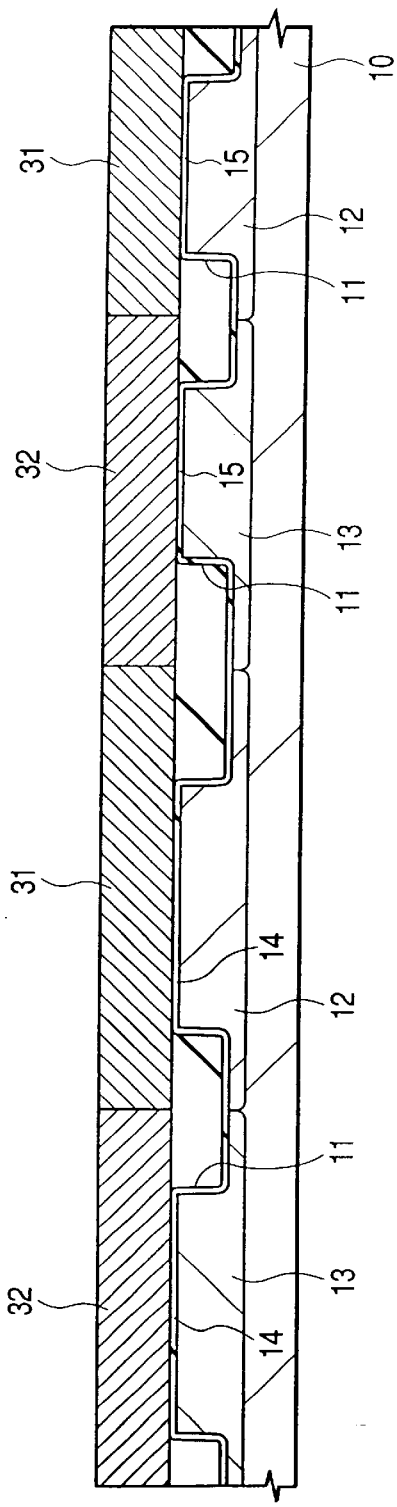
FIG. 25 is a sectional view of essential parts of a semiconductor substrate showing a method of manufacturing a logic LSI according to the third embodiment of the present invention.

Next, as shown in FIG. 25, after a polycrystal silicon film 200 nm is deposited on the substrate 10, a P (phosphor) ion is implanted into a part of the film, and a B (boron) ion is implanted into another part of the film, thereby forming an n-type polycrystal silicon film 31 and a p-type polycrystal silicon film 32.

Figure 26:
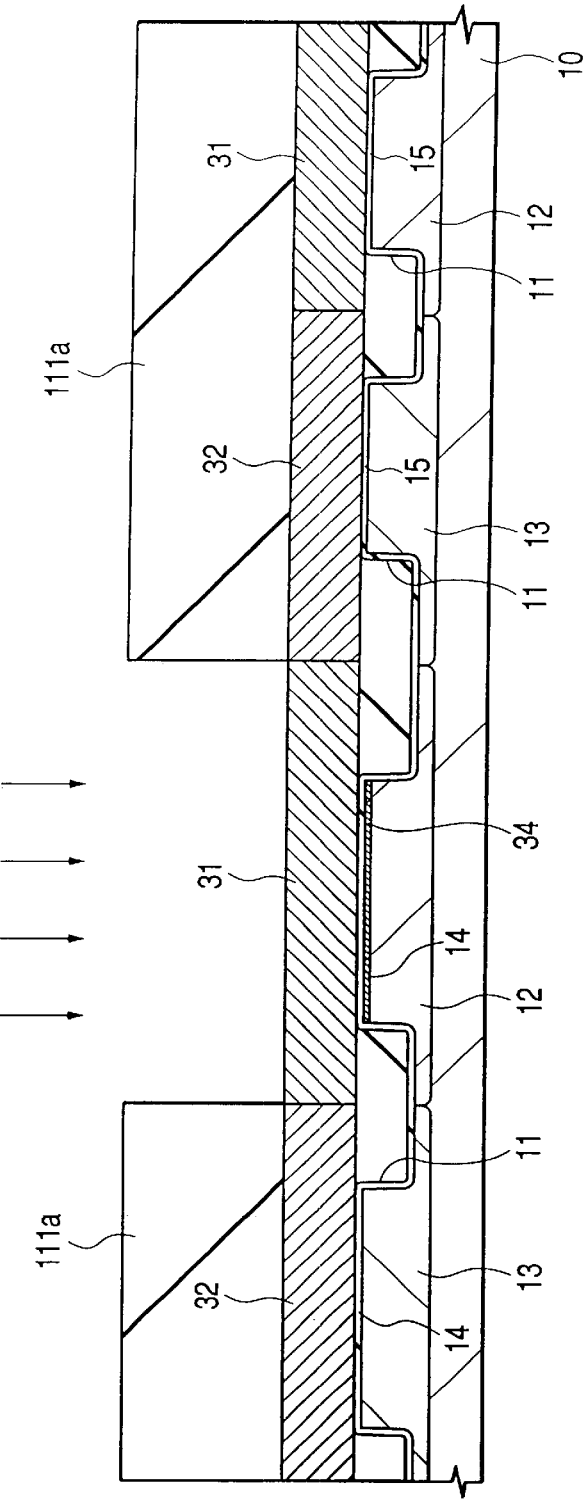
FIG. 26 is a sectional view of essential parts of a semiconductor substrate showing a method of manufacturing a logic LSI according to the third embodiment of the present invention.

Next, as shown in FIG. 26, using a resist mask 111a having only a high voltage resistance n-channel type MISFET region opened thereat, a nitrogen ion ($N_2^+$, 40 KeV, $5 \times 10^{14}$ $cm^{-2}$) is implanted into a thick oxide film 14 through an n-type polycrystal silicon film 31, thereby forming a highly oxy-nitrided region 34 on the $SiO_2$/Si interface of the thick oxide film 14.

Figure 27:
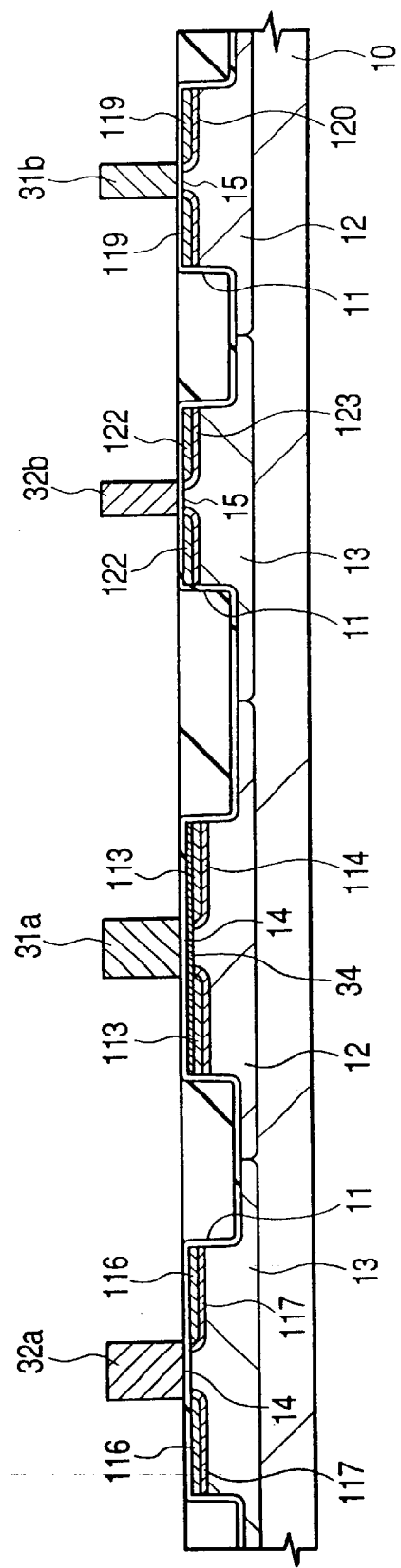
FIG. 27 is a sectional view of essential parts of a semiconductor substrate showing a method of manufacturing a logic LSI according to the third embodiment of the present invention.

Next, as shown in FIG. 27, an n-type polycrystal silicon film 31 and a p-type polycrystal silicon film 32 are patterned, thereby forming gate electrodes 31a, 31b, 32a, and 32b. Then, as in the present embodiments 1 and 2, extension regions 113 and 116 for high voltage resistance n-channel type MISFET and p-channel type MISFET and halo regions 114 and 117 are formed, and extension regions 119 and 122 for the core n-channel type MISFET and p-channel type MISFET and halo regions 120 and 123 are formed.

Figure 28:
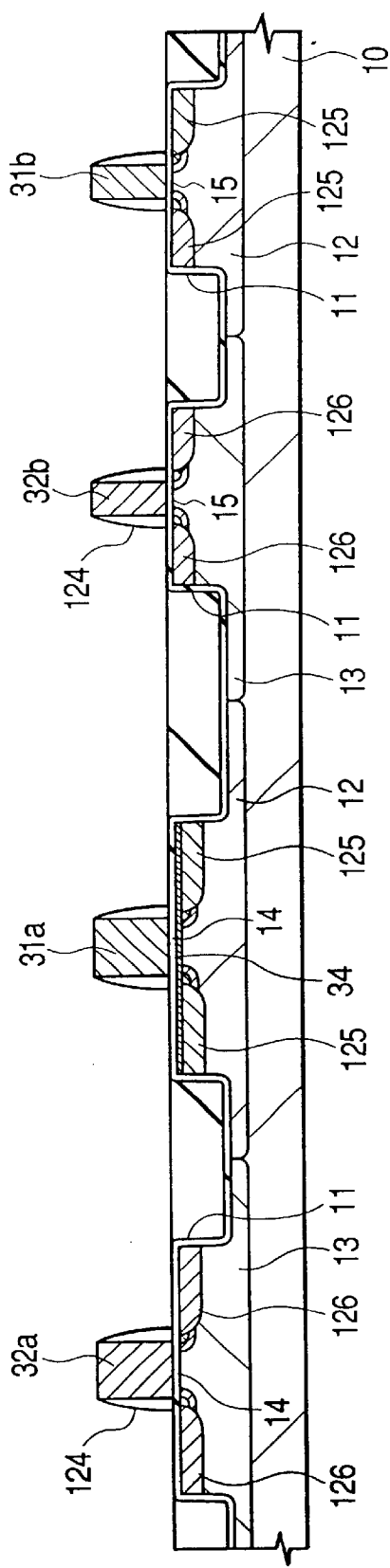
FIG. 28 is a sectional view of essential parts of a semiconductor substrate showing a method of manufacturing a logic LSI according to the third embodiment of the present invention.

Next, as shown in FIG. 28, a sidewall spacer 124 is formed on the side wall of gate electrodes 31a, 31b, 32a, and 32b. Then, an arsenic (As) ion and a boron fluoride ion are implanted on the substrate 10, thereby forming an $n^+$ type semiconductor region 125 with high impurity concentration that configures the source and drain of the n-channel type MISFET and a $p^+$ type semiconductor region 126 with high impurity concentration that configures the source and drain of the p-channel type MISFET.

Figure 29:
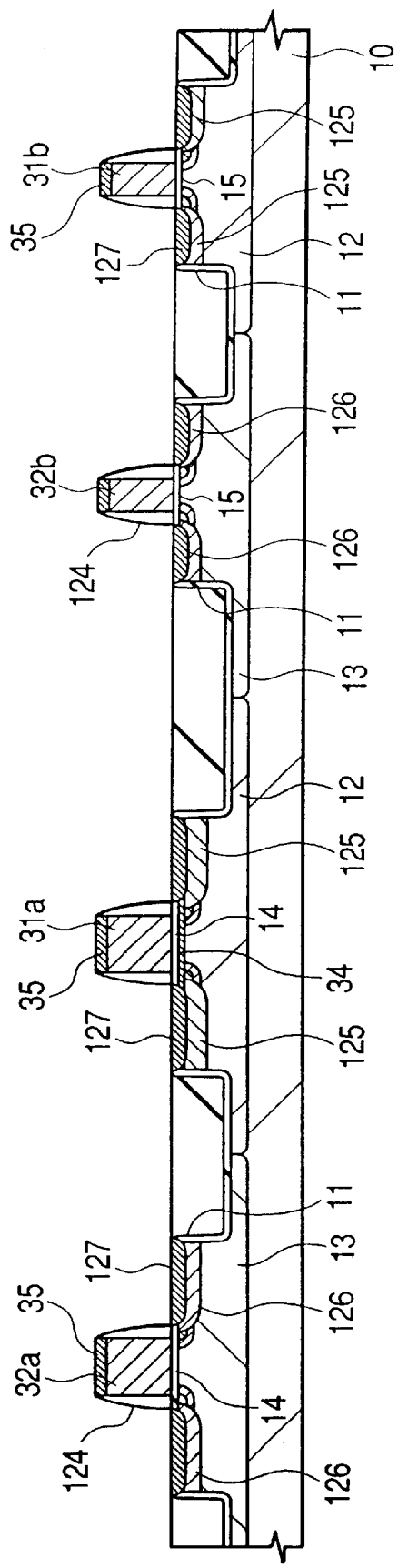
FIG. 29 is a sectional view of essential parts of a semiconductor substrate showing a method of manufacturing a logic LSI according to the third embodiment of the present invention.

Next, as shown in FIG. 29, a suicide layer 127 is formed each on the surface of the $n^+$ type semiconductor region (source and drain) 125 of the n-channel type MISFET and on the surface of the $p^+$ type semiconductor region (source and drain) 126. In the present invention, at this time, a silicide layer 35 is formed on the surface of the gate electrode 31a, 31b, 32a, and 32b at the same time.

Figure 30:
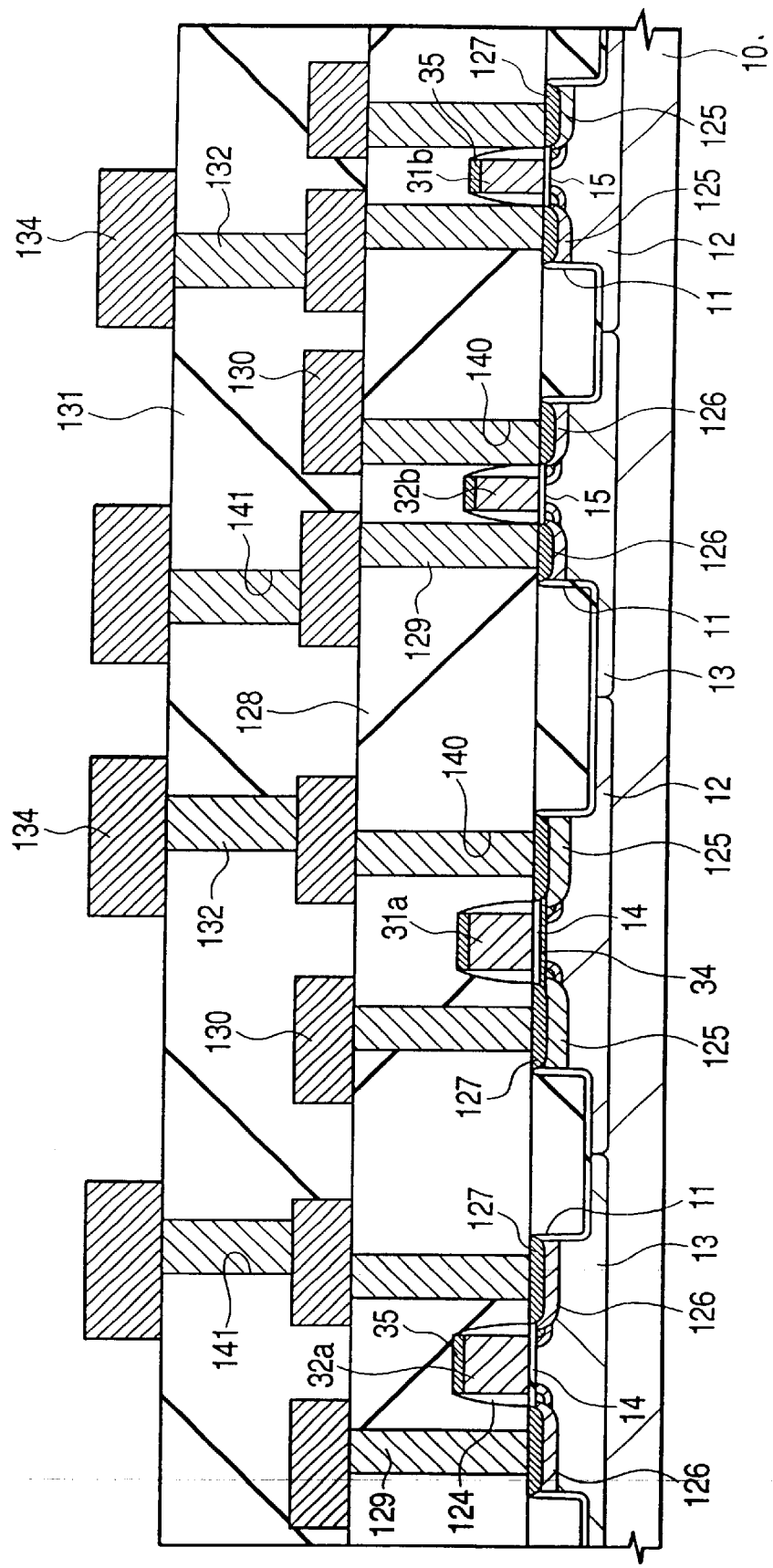
FIG. 30 is a sectional view of essential parts of a semiconductor substrate showing a method of manufacturing a logic LSI according to the third embodiment of the present invention.

Then, as shown in FIG. 30, a first interdielectric film 128 is formed on the top of the MISFET, and then, a W plug 129 is embedded in a contact hole 140 formed at the first interdielectric film 128 on the top of the source and drain (n$^+$ type semiconductor region 125 and p$^+$ type semiconductor region 126). Thereafter, a metal interconnect 130 of the first layer is formed on the top of the first interdielectric film 128. Similarly, a second interdielectric film 131 is formed on the top of a metal interconnect 130 of the first layer, and then, a W plug 132 is embedded in a contact hole 141 formed at the second interdielectric film 131 on the top of the metal interconnect 130. Thereafter, a metal interconnect 134 of the second layer is formed on the top of the second interdielectric film 131. In addition, metal interconnects of one or plural layers may further be formed on the top of the metal interconnect 134 of the second layer. The metal interconnects 130 and 134 are formed of W, for example. As has been described above, a logic LSI is completed.

According to the present invention, it is verified that a sufficient amount of nitrogen atoms exist on the SiO$_2$/Si interface of the high voltage resistance n-channel type MISFET, and the life of the hot carrier reliability is 10 years or more. In addition, it is verified that the NBTI life of the p-channel type MISFET is 10 years or more. That is, as a result of optimizing an amount of nitrogen on the SiO$_2$/Si interface of the core n-channel type MISFET and high voltage resistance n-channel type MISFET, a sufficient hot carrier reliability can be ensured without any side effect. Further, nitrogen is implanted into the entire channel of the high voltage resistance n-channel type MISFET. Thus, there is provided an advantage that a dosage of nitrogen can be reduced to its required minimum, and an occurrence of a crystal defect or the like.

Fourth Embodiment

The present embodiment describes an application example of nitrogen ion implantation into a channel (system LSI having DRAM).

First, as shown in FIG. 31, a shallow trench isolation region 11 is formed on the silicon substrate 10, and then there are formed a p-well 21 for memory cell n-channel type MISFET, a p-well 12 for peripheral n-channel type MISFET, and an n-well 13 for peripheral p-channel type, and the full face of the substrate 10 is surface oxidized, and a thick gate oxide film (thick oxide film) 14 is formed.

Next, as shown in FIG. 32, as in the conventional technique, a thick oxide film 14 is left in a memory cell region and its peripheral high voltage resistance MISFET region, and only the thick oxide film 14 in the peripheral core MISFET region is removed. After surface washing, the substrate 10 is re-oxidized, whereby a thin oxide film 15 is formed on the surface of the substrate 10 in the core MISFET region. The thick film oxide film 14 is additionally oxidized so as to have desired film thickness, although the film thickness decreases in the washing step. Thereafter, the full face of the substrate 10 is subjected to oxynitridation using NO gas so that nitrogen atoms in desired amount is contained in the SiO$_2$/Si interface of the thin oxide film 15 (not shown). At this time, although the SiO$_2$/Si interface of the thick oxide film 14 is also oxy-nitrided at the same time, an amount of nitride is smaller than that at a thin film section.

Figure 33:
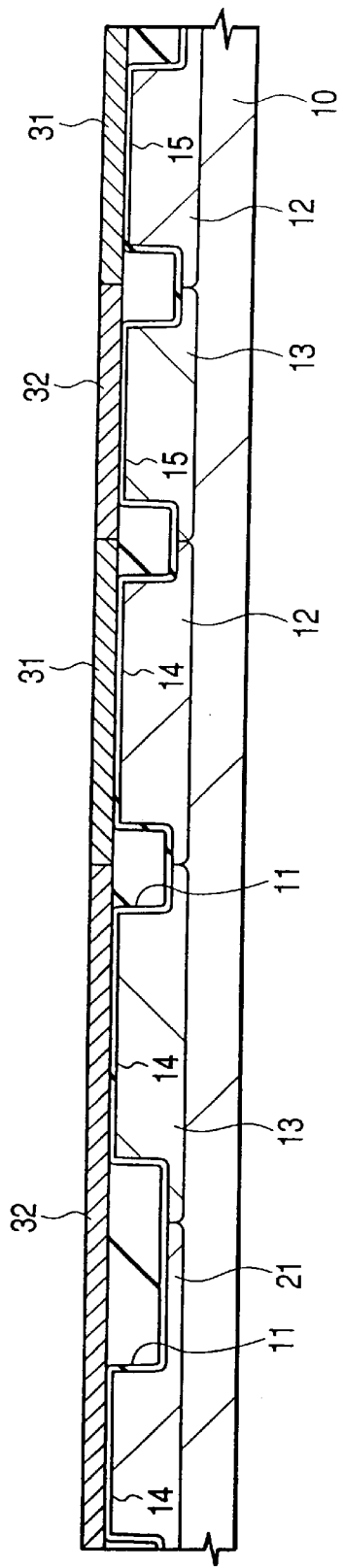
FIG. 33 is a sectional view of essential parts of a semiconductor substrate showing a method of manufacturing a DRAM embedded logic LSI according to the fourth embodiment of the present invention.

Next, as shown in FIG. 33, a P (phosphor) ion is implanted in a part of a polycrystal silicon film deposited on the subtract 10, and a B (boron) ion is implanted into another part, thereby forming an n-type polycrystal silicon film 31 and a p-type polycrystal film 32. In the present embodiment, a p-type polycrystal silicon film 32 is employed for a gate electrode of the memory cell n-channel type MISFET.

Figure 34:
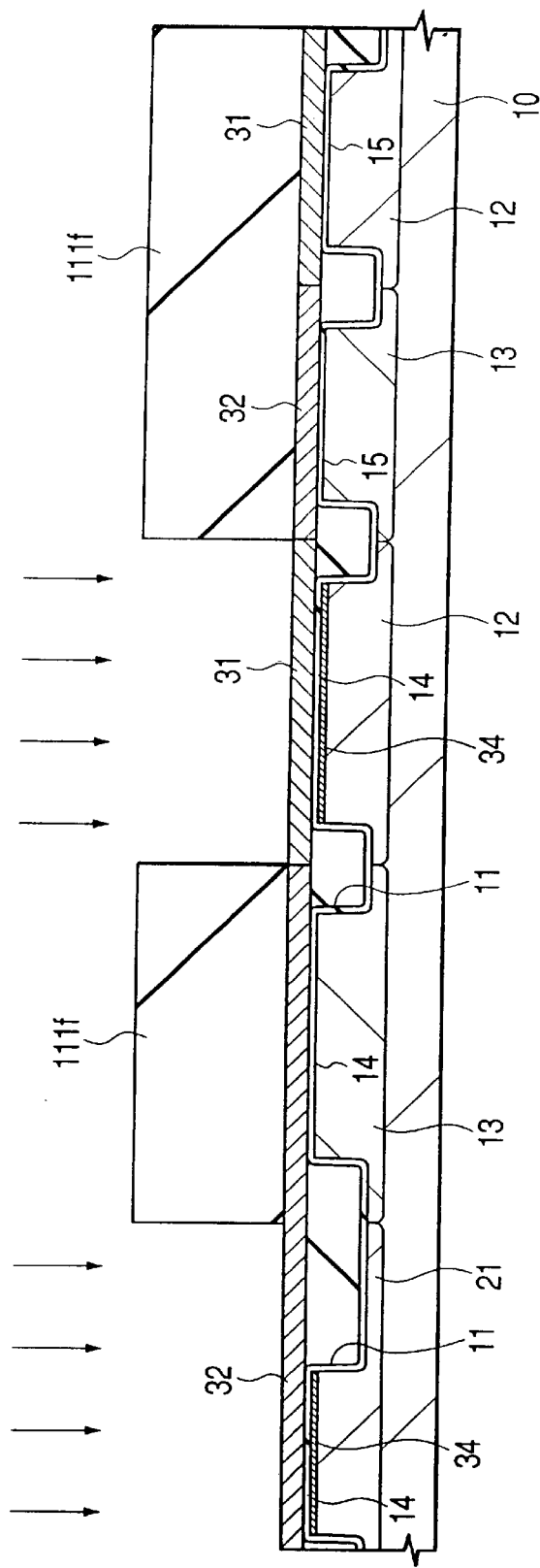
FIG. 34 is a sectional view of essential parts of a semiconductor substrate showing a method of manufacturing a DRAM embedded logic LSI according to the fourth embodiment of the present invention.

Next, as shown in FIG. 34, using a resist mask 111$f$ having a high voltage resistance n-channel type MISFET region and a memory cell n-channel MISFET region opened thereat, a nitrogen ion is implanted through the n-type polycrystal silicon film 31 and the p-type polycrystal silicon film 32, thereby forming a highly oxy-nitrided region 34 on the SiO$_2$/Si interface of the thick oxide film 14.

Here, although the nitrogen ion is implanted into a high-voltage n-channel type MISFET in order to improve high carrier durability, a primary object for the memory cell n-channel MISFET is to reduce a threshold voltage. An p-type polycrystal silicon film is employed for a gate electrode of the memory cell n-channel type MISFET, so that the threshold voltage is too high. However, if the boron concentration of the substrate 10 is lowered excessively, it is difficult to restrain a short channel effect. Therefore, it is effective to lower the threshold voltage by implantation of the above nitrogen ion.

Next, as shown in FIG. 35, a WN film 18, a W film, 19, and a silicon nitride film 135 are sequentially deposited on the top of the n-type polycrystal silicon film 31 and p-type polycrystal silicon film 32. Then, gate electrodes 1$a$ to 1$e$ are formed by patterning the n-type polycrystal silicon film 31 and p-type polycrystal silicon film 32, a WN film 18, a W film 19, and a silicon nitride film 135.

Next, as shown in FIG. 36, a P (phosphor) ion is implanted in the full face of the substrate 10, and an extension region 22 of a memory cell n-channel type MISFET is formed. In the present embodiment, although a P-ion is implanted into the full face of the substrate 10 in order to reduce the number of photomasks, a region other than a memory cell region is covered with a photo resist film, whereby the p-ion may be implanted into only the substrate 10 in the memory cell region.

Figure 37:
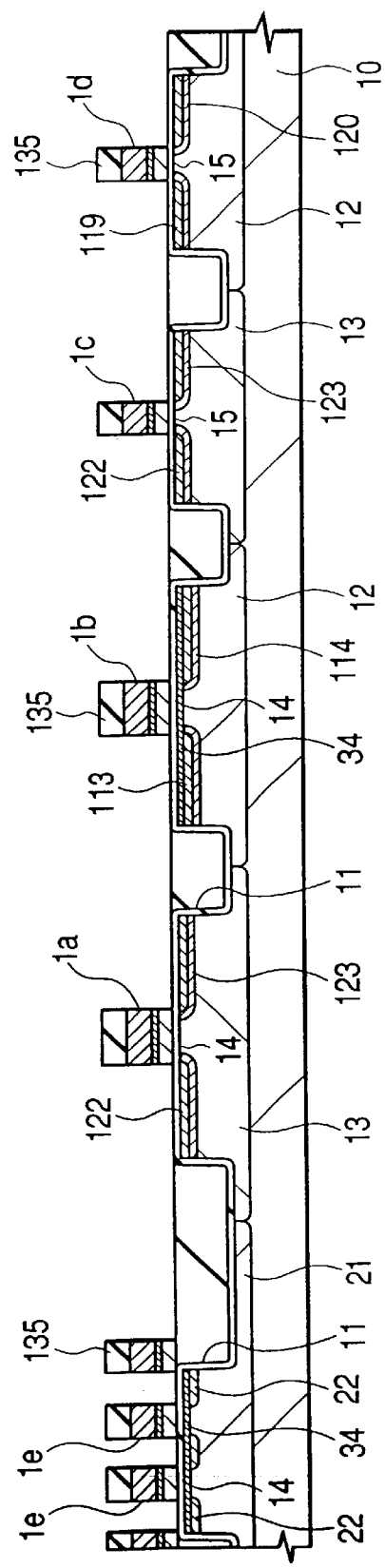
FIG. 37 is a sectional view of essential parts of a semiconductor substrate showing a method of manufacturing a DRAM embedded logic LSI according to the fourth embodiment of the present invention.

Next, as shown in FIG. 37, as in the embodiments 1 to 3, there are formed extension regions 113 and 116 and halo regions 114 and 117 of the high voltage resistance n-channel type MISFET and p-channel type MISFET, and there are formed extension regions 119 and 122 and halo regions 120 and 123 of the core n-channel type MISFET and p-channel type MISFET.

Figure 38:
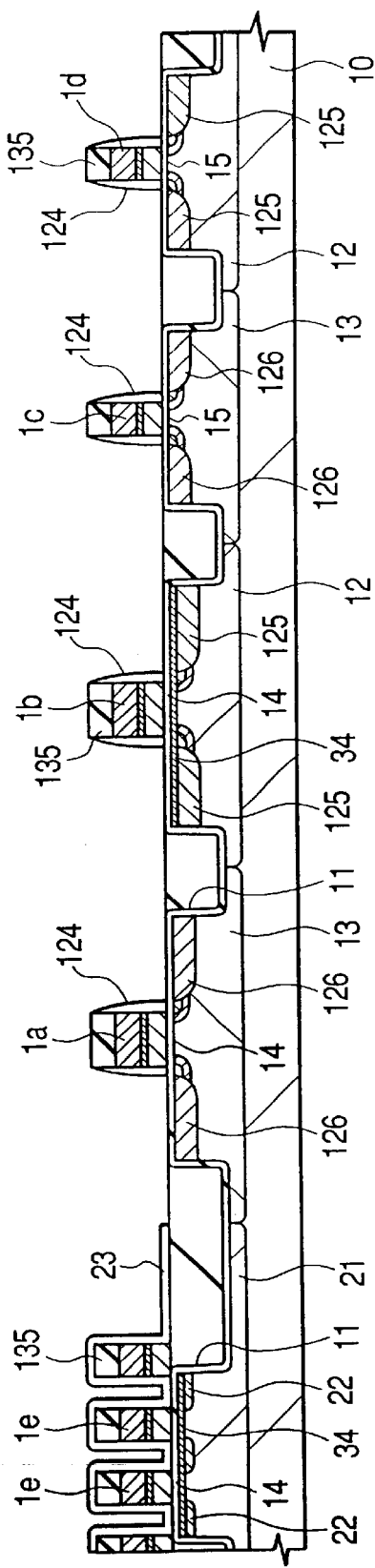
FIG. 38 is a sectional view of essential parts of a semiconductor substrate showing a method of manufacturing a DRAM embedded logic LSI according to the fourth embodiment of the present invention.

Next, as shown in FIG. 38, the silicon nitride film 23 deposited on the substrate 10 is anisotropically etched, thereby forming a sidewall spacer 124 on the side wall of the gate electrodes 1$a$ to 1$d$ of the peripheral MISFET. At this time, the silicon nitride film 23 in the memory cell region is covered with a photo resist film (not shown) so as not to be etched.

Figure 39:
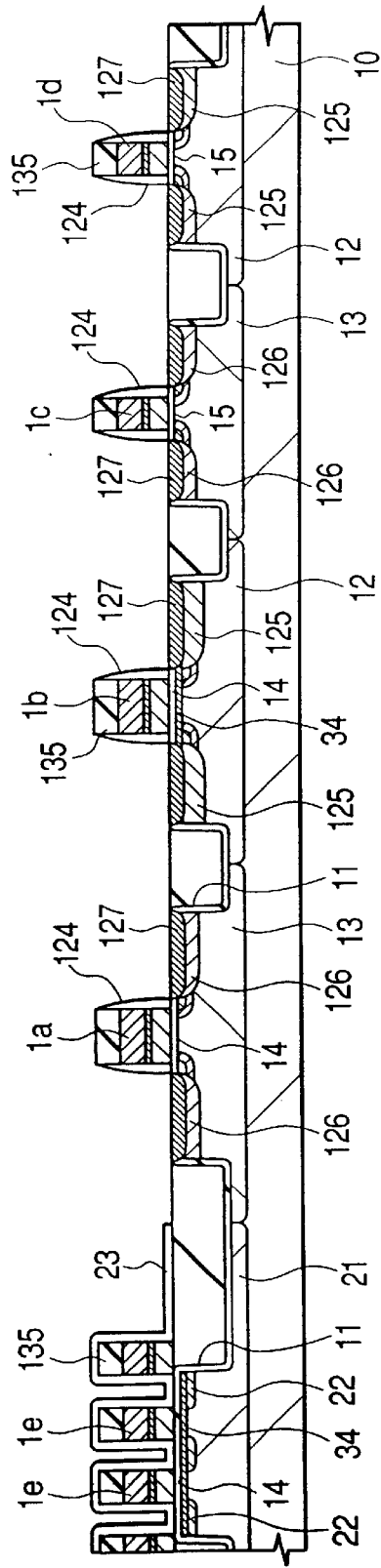
FIG. 39 is a sectional view of essential parts of a semiconductor substrate showing a method of manufacturing a DRAM embedded logic LSI according to the fourth embodiment of the present invention.

Then, an arsenic (As) ion and a boron fluoride ion are implanted into the substrate 10, thereby forming an n$^+$ type semiconductor region 125 with high impurity concentration that configures the source and drain of the peripheral n-channel type MISFET and a P$^+$ type semiconductor region 125 with high impurity concentration that configures the source and drain of the peripheral p-channel type MISFET. Then, as shown in FIG. 39, a silicide layer 127 is formed each on the surface of the n$^+$ type semiconductor region (source and drain) 125 of the peripheral n-channel type MISFET and the p$^+$ type semiconductor region (source and drain) 126 of the peripheral p-channel type MISFET.

Figure 40:
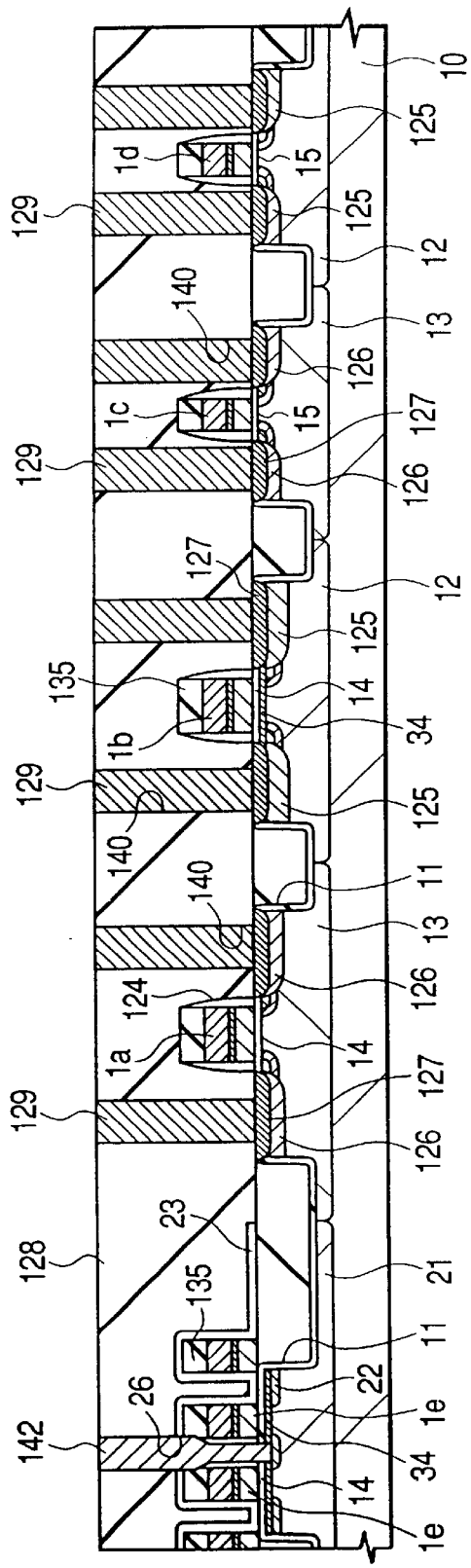
FIG. 40 is a sectional view of essential parts of a semiconductor substrate showing a method of manufacturing a DRAM embedded logic LSI according to the fourth embodiment of the present invention.

Next, as shown in FIG. 40, an first interdielectric film 128 is formed on the top of the MISFET, and then, a polycrystal silicon plug 142 is embedded in a contact hole 26 formed at the first interdielectric film 128 on the top of either one of the source and drain of the memory cell MISFET, and then, a W plug 129 is embedded in a contact hole 140 formed at the first interdielectric film 128 on the top of the source or drain of the peripheral MISFET.

Figure 41:
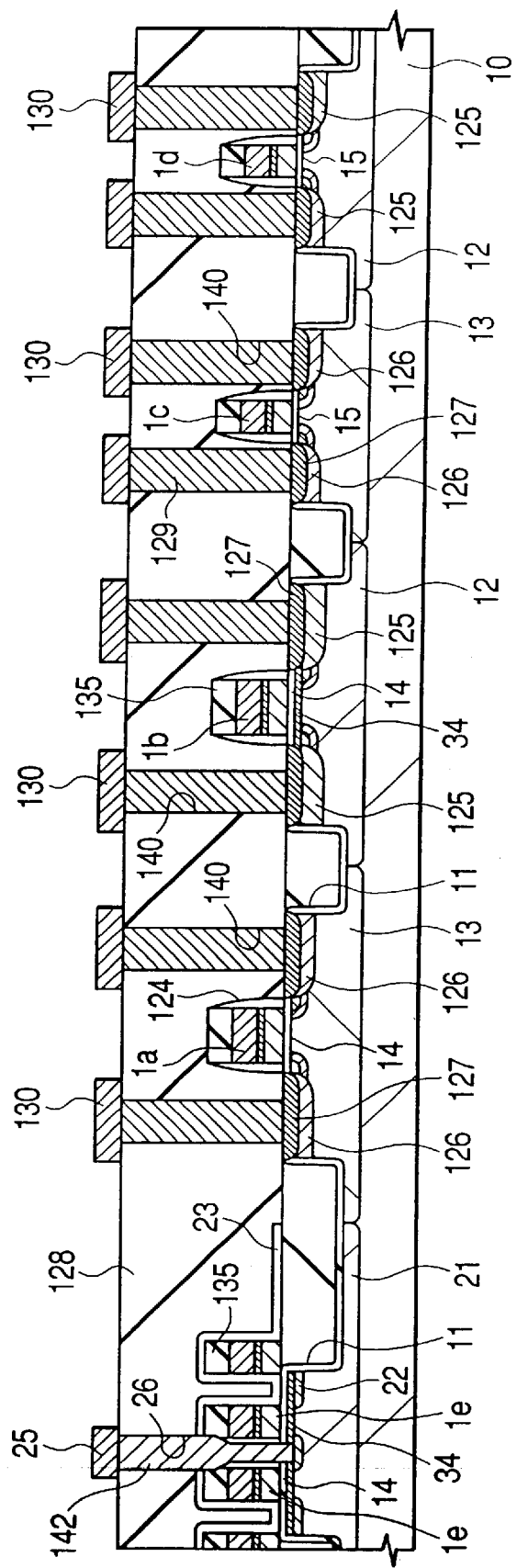
FIG. 41 is a sectional view of essential parts of a semiconductor substrate showing a method of manufacturing a DRAM embedded logic LSI according to the fourth embodiment of the present invention.

Next, as shown in FIG. 41, a bit line 25 and a metal interconnect 130 as a first layer is formed on the top of the first interdielectric film 128. The bit line 25 and metal interconnect 130 is formed of W, for example.

Figure 42:
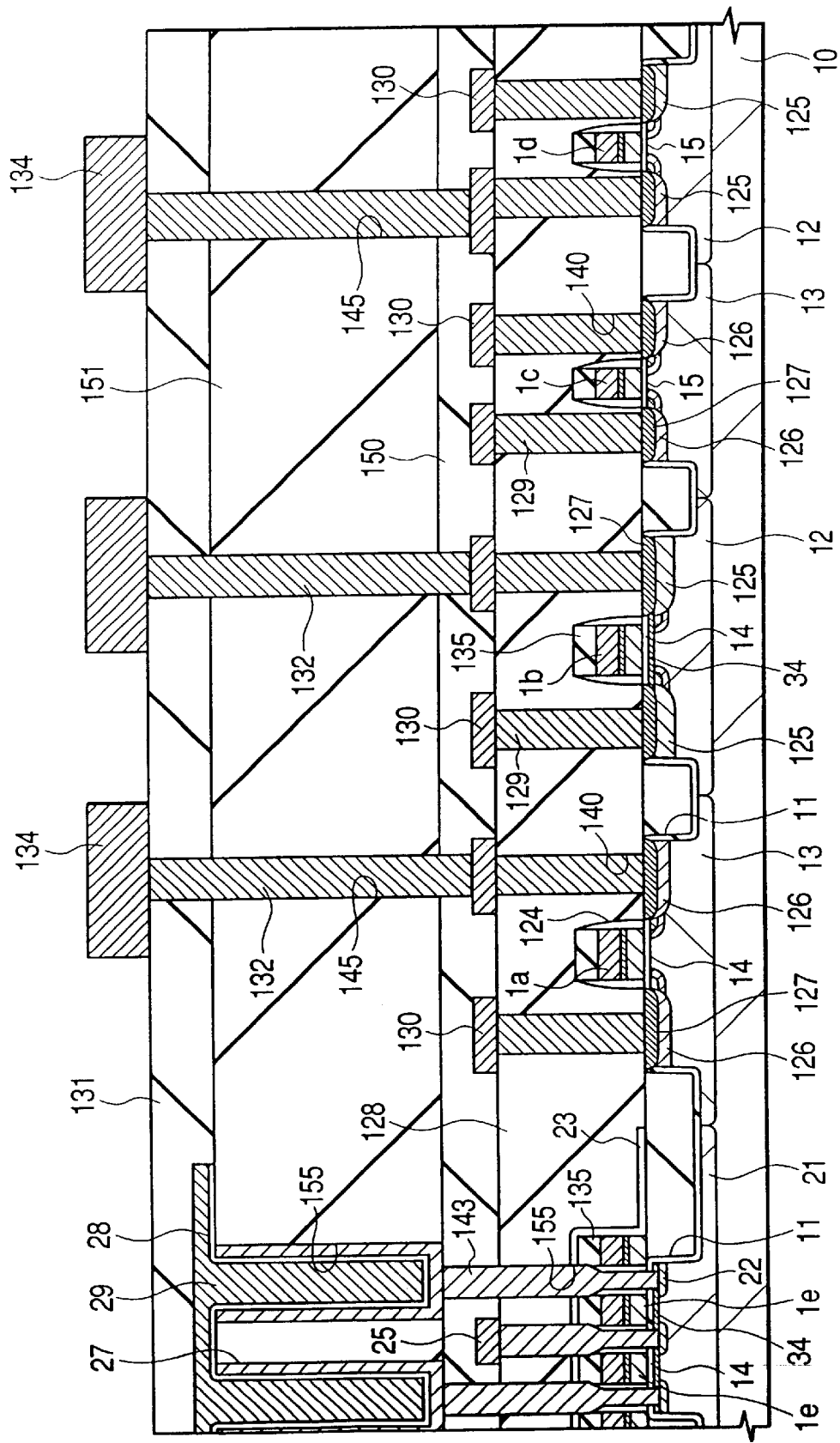
FIG. 42 is a sectional view of essential parts of a semiconductor substrate showing a method of manufacturing a DRAM embedded logic LSI according to the fourth embodiment of the present invention.

Next, as shown in FIG. 42, a silicon oxide film 150 is formed on the top of the bit line 25 and the metal interconnect 130, and then, a contact hole 141 is formed on the first interdielectric film 128 and silicon oxide film 150 on the top of the other one of the source and drain of the memory cell MISFET. Thereafter, a polycrystal silicon plug 143 is embedded inside of the contact hole 141.

Next, an silicon oxide film 151 is deposited on the top of the silicon oxide film 150, and then, a trench 155 is formed on the silicon oxide film 150 in the memory cell region. Thereafter, a memory cell capacity is formed inside of the trench 155. This capacity is configured to have a lower electrode 27 that is formed of a polycrystal silicon, a capacity insulation film 28 that is formed of an tantalum oxide ($Ta_2O_3$), and an upper electrode 29 that is formed of a titanium nitride (TiN).

Next, a second interdielectric film 131 is formed on the top of the capacitor, and then, a W plug 132 is embedded in a through hole 145 formed at the second interdielectric film 131 and silicon oxide films 151 and 150 on the top of the metal interconnect 130. Thereafter, a metal interconnect 134 of the second layer is formed on the top of the second interdielectric film 131. In addition, metal interconnects of one or plural layers may be formed on the top of the metal interconnect 134 of the second layer. As has been described above, a DRAM embedded logic LSI is completed.

According to the present embodiment, it is verified that a sufficient amount of nitrogen atoms exist on the $SiO_2$/Si interface of the high voltage resistance n-channel type MISFET, and the left of the hot carrier reliability is 10 years or more. In addition, it is verified that the NBTI life of the p-channel type MISFET is 10 years or more. Further, the threshold voltage of the memory cell n-channel type MISFET is set by work function control and nitrogen ion implantation into a gate electrode. As a result, the boron concentration of the channel can be optimized, thus making it possible to increase a DRAM data retention time. That is, an amount of nitrogen on the $SiO_2$/Si interface of all the n-channel type MISFETs can be optimized. As a result, sufficient hot carrier reliability can be ensured without any side effect.

Fifth Embodiment

Figure 43:
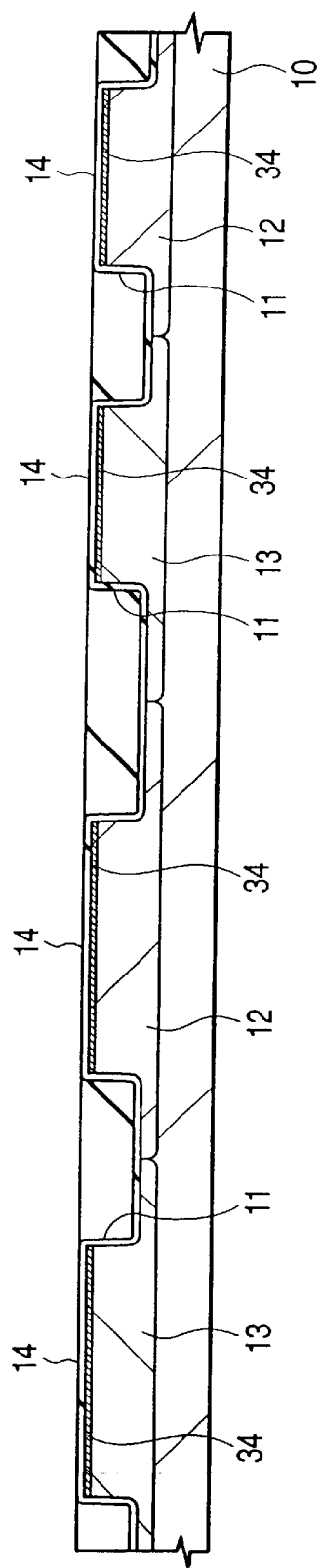
FIG. 43 is a sectional view of essential parts of a semiconductor substrate showing a method of manufacturing a logic LSI according to a fifth embodiment.

The present embodiment describes an example of application of two-times oxynitridations to a logic LSI. First, as shown in FIG. 43, a shallow trench isolation 11 is formed on a silicon substrate 10, and there is formed a p-well 12 for n-channel type MISFET and an n-well 13 for p-channel type MISFET. Then, the full face of the substrate 10 is surface oxidized, and a thick gate oxide film (thick oxide film) 14 is formed. Next, oxynitridation is applied to the full face of the substrate 10 (105° C. and 60 seconds), thereby forming a highly oxy-nitrided region 34 on the $SiO_2$/Si interface of the thick oxide film 14.

Figure 44:
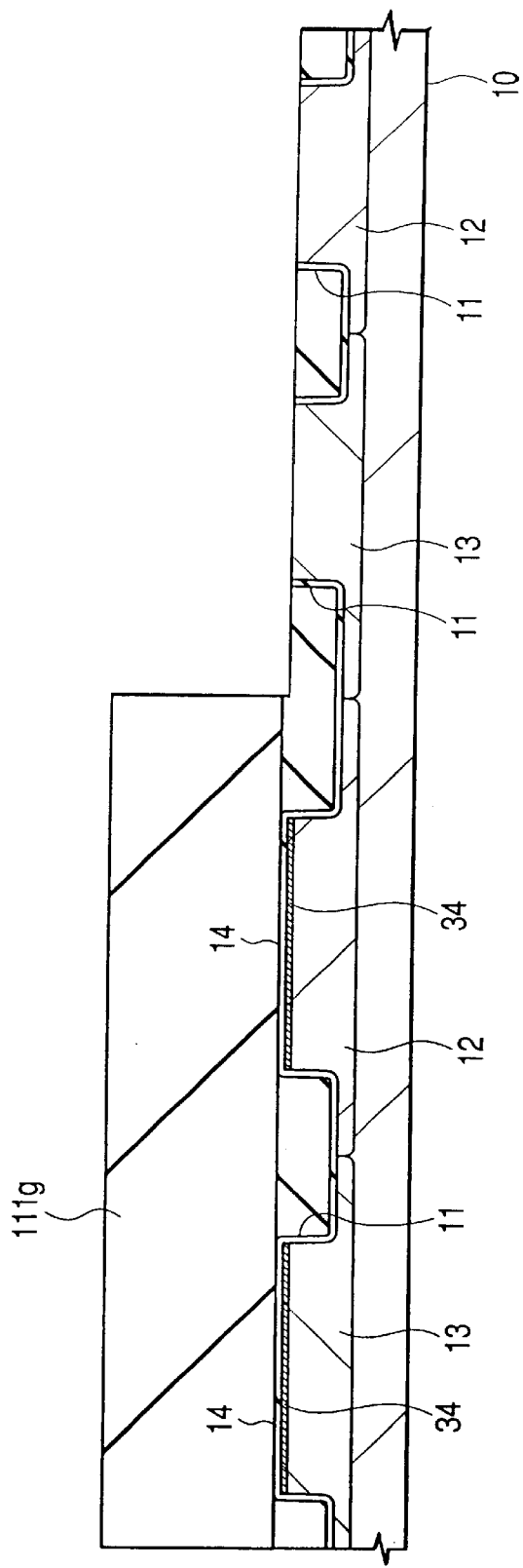
FIG. 44 is a sectional view of essential parts of a semiconductor substrate showing a method of manufacturing a logic LSI according to the fifth embodiment.

Next, as shown in FIG. 44, a high voltage resistance MISFET region is covered with a photo resist film 111g, and the thick oxide film 14 in the core MISFET region is removed together with the highly oxy-nitrided region 34.

Figure 45:
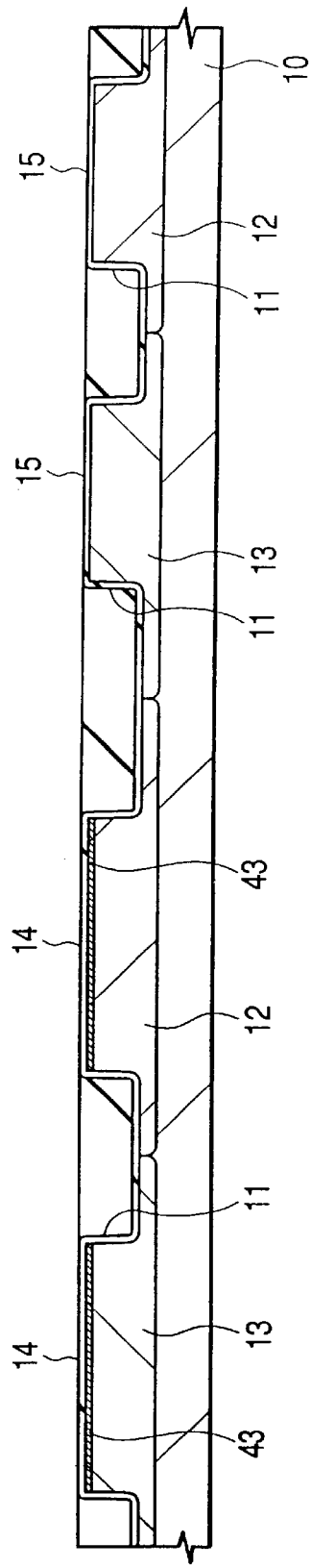
FIG. 45 is a sectional view of essential parts of a semiconductor substrate showing a method of manufacturing a logic LSI according to the fifth embodiment.

Next, as shown in FIG. 45, after surface washing, the substrate 10 is re-oxidized, thereby forming a thin oxide film 15 on the surface of the substrate 10 in the core MISFET region. The thick oxide film 14 is additionally oxidized so as to have desired film thickness, although the film thickness slightly decreased in the washing step. Thereafter, the full face of the substrate is subjected to oxynitridation (1,050° C. and 30 seconds) so that nitrogen atoms in desired amount is contained in the $SiO_2$/Si interface of the thin oxide film 15 (not shown). In this case as well, the first oxynitridation condition is determined in consideration of the $SiO_2$/Si interface of the thick oxide film.

Figure 46:
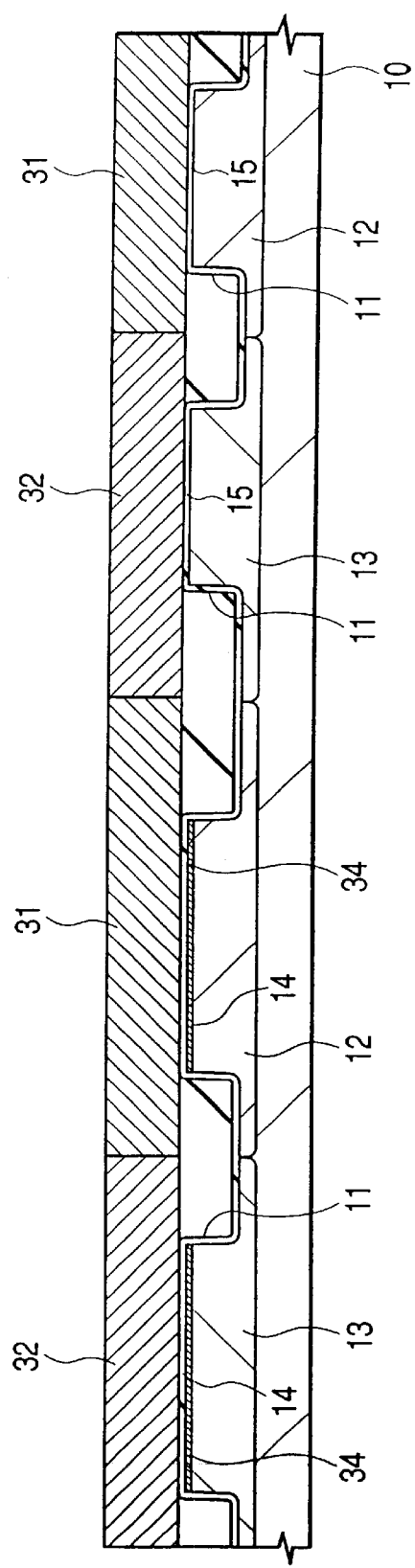
FIG. 46 is a sectional view of essential parts of a semiconductor substrate showing a method of manufacturing a logic LSI according to the fifth embodiment.

Next, as shown in FIG. 46, P (phosphor) ion is implanted into a part of the polycrystal silicon film deposited on the substrate 10, and a B (boron) ion is implanted into another part of the film, thereby forming an n-type polycrystal silicon film 31 and a p-type polycrystal silicon film 32.

Figure 47:
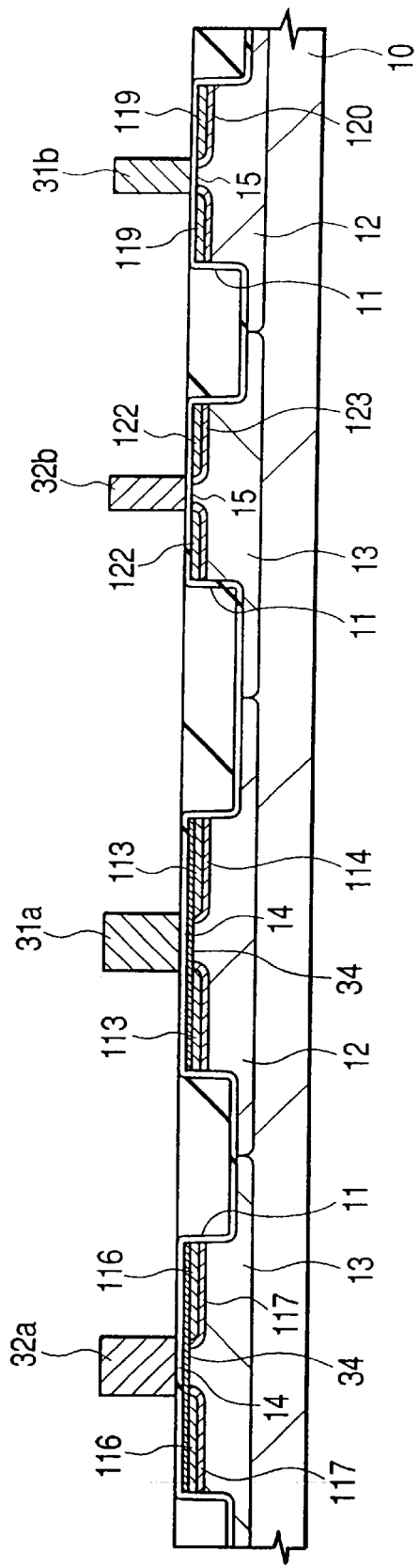
FIG. 47 is a sectional view of essential parts of a semiconductor substrate showing a method of manufacturing a logic LSI according to the fifth embodiment.

Next, as shown in FIG. 47, an n-type polycrystal silicon film 31 and a p-type polycrystal silicon film 32 is patterned, thereby forming gate electrodes 31a, 31b, 32a, and 32b. Thereafter, as in the present embodiments 1 and 2, the high voltage resistance n-channel type MISFET, p-channel type MISFET extension regions 113 and 116 and halo regions 114 and 117 are formed, and the core n-channel type MISFET, p-channel type MISFET extension regions 119 and 122, and halo regions 120 and 123 are formed.

Figure 48:
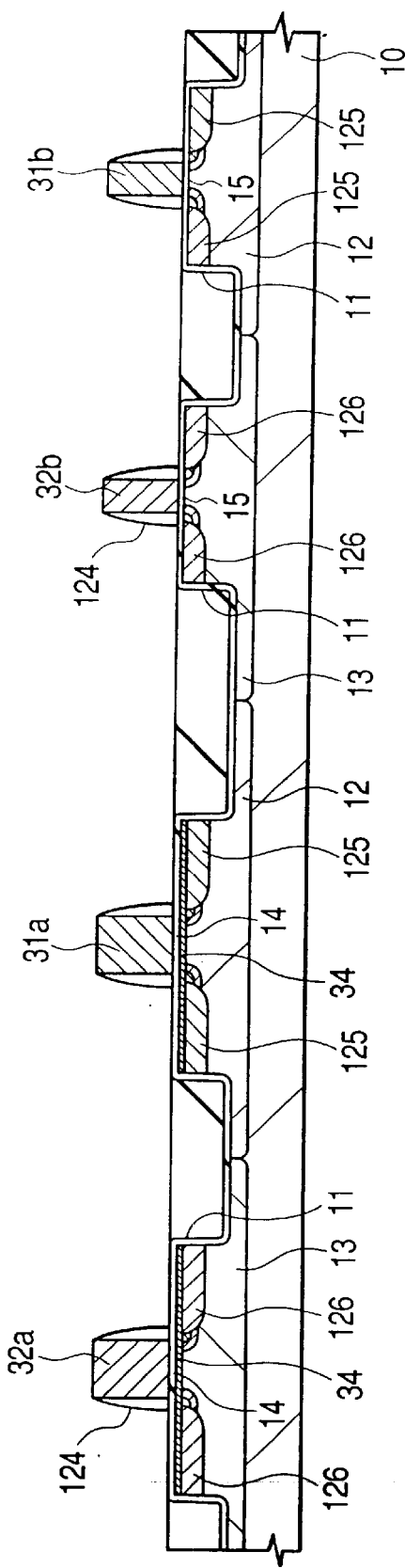
FIG. 48 is a sectional view of essential parts of a semiconductor substrate showing a method of manufacturing a logic LSI according to the fifth embodiment.

Next, as shown in FIG. 48, a sidewall spacer 124 is formed on the side wall of gate electrodes 31a, 31b, 32a, and 32b. Then, an arsenic (As) ion and boron fluoride ion are implanted into the substrate 10, thereby forming the $n^+$ type semiconductor region 125 with high impurity concentration that configures the source and drain of the n-channel type MISFET and the $p^+$ type semiconductor region 126 with high impurity concentration that configures the source and drain of the p-channel type MISFET.

Figure 49:
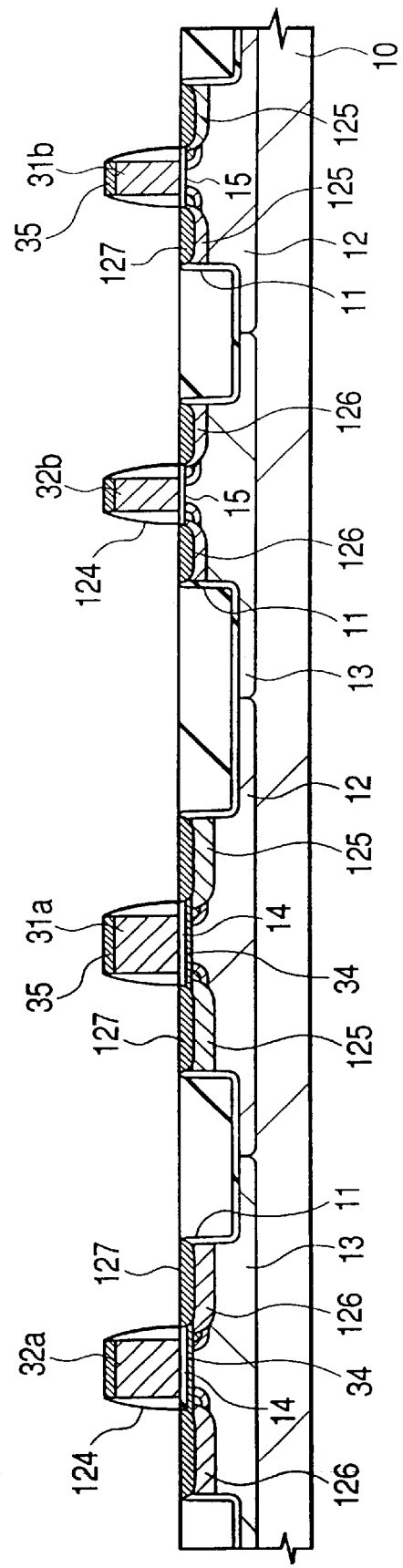
FIG. 49 is a sectional view of essential parts of a semiconductor substrate showing a method of manufacturing a logic LSI according to the fifth embodiment.

Next, as shown in FIG. 49, a silicide layer 127 is formed each on the surface of the source and drain of the n-channel type MISFET and on the surface of the source and drain of the p-channel type MISFET. In the present embodiment, at this time, a silicide layer 35 is formed on the surface of the gate electrode at the same time.

Figure 50:
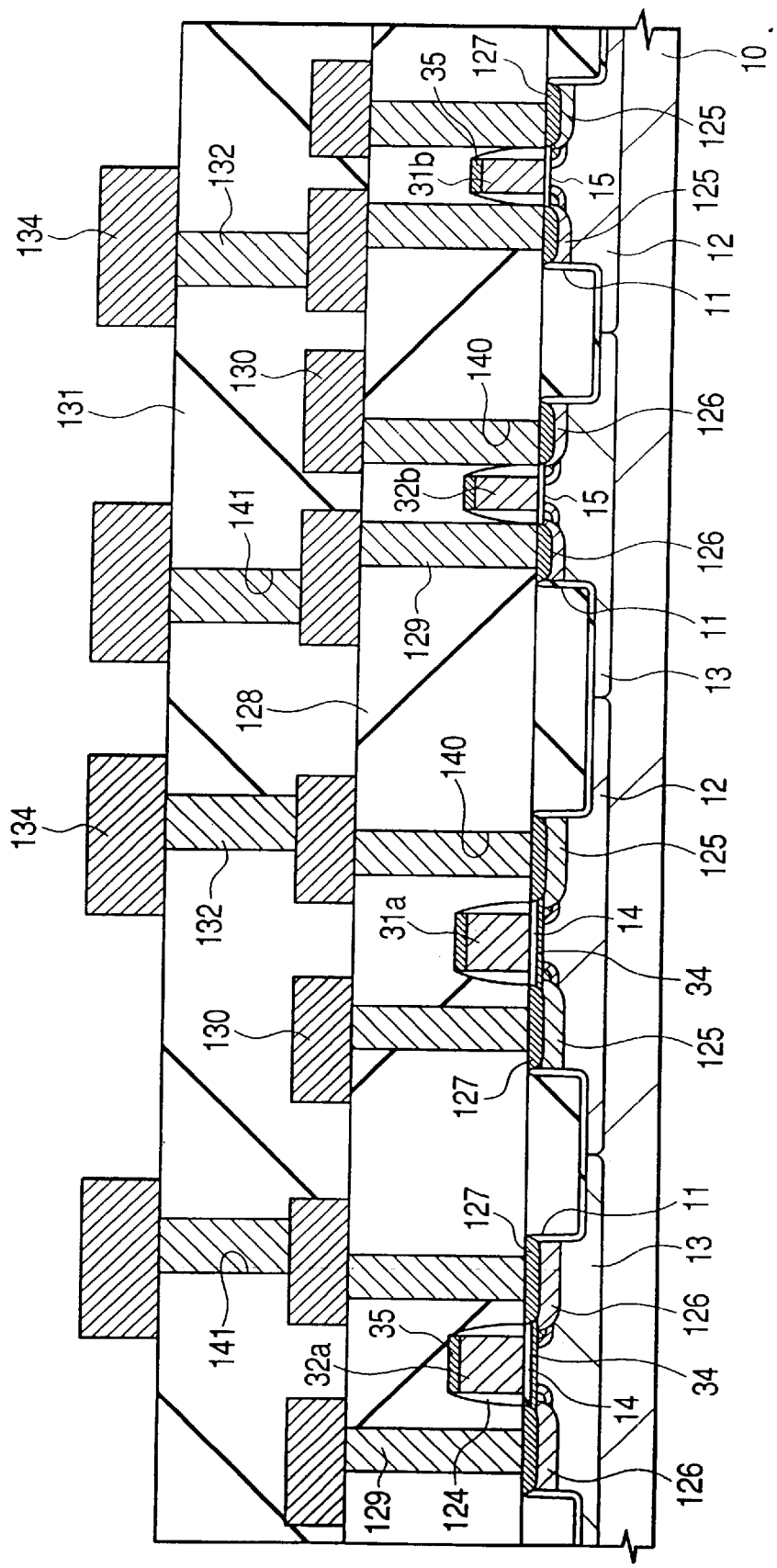
FIG. 50 is a sectional view of essential parts of a semiconductor substrate showing a method of manufacturing a logic LSI according to the fifth embodiment.

Then, as shown in FIG. 50, a first interdielectric film 128 is formed on the top of each MISFET, and then, a W plug 129 is embedded in a contact hole 140 formed on the first interdielectric film 128 on the top of the drain and source ($n^+$ type semiconductor region 125 and $p^+$ type semiconductor region 126). Thereafter, a metal interconnect 130 of the first layer is formed on the top of the first interdielectric film 128. Similarly, a second interdielectric film 131 is formed on the top of the metal interconnect 130 of the first layer, and then, a W plug 132 is embedded in a contact hole 141 formed on the second interdielectric film 131 on the top of the metal interconnect 130. Thereafter, a metal interconnect 134 of the second layer is formed on the top of the second interdielectric film 131. In addition, metal interconnects of one or plural layers may be further formed on the top of the metal interconnect 134 of the second layer. The metal interconnects 130 and 134 are formed of W, for example. As has been described above, a logic LSI is completed.

According to the present embodiment, it is verified that a sufficient amount of nitrogen atoms exist on the $SiO_2$/Si interface of the high voltage resistance n-channel type MISFET, and the life of the hot carrier reliability is 10 years or more. In addition, it is verified that the NBTI life of the p-channel type MISFET is 10 years or more. That is, an amount of nitrogen can be optimized on the $SiO_2$/Si interface of the core n-channel type MISFET and high voltage n-channel type MISFET. As a result, sufficient hot carrier reliability can be ensured without an side effect. Further, there is provided an advantage specific to the present embodiment that the invention can be carried out without increasing a new photo resist step or the like.

Sixth Embodiment

The present embodiment describes an example of application of two-times oxynitridations to a DRAM embedded logic LSI (system LSI having DRAM).

Figure 51:
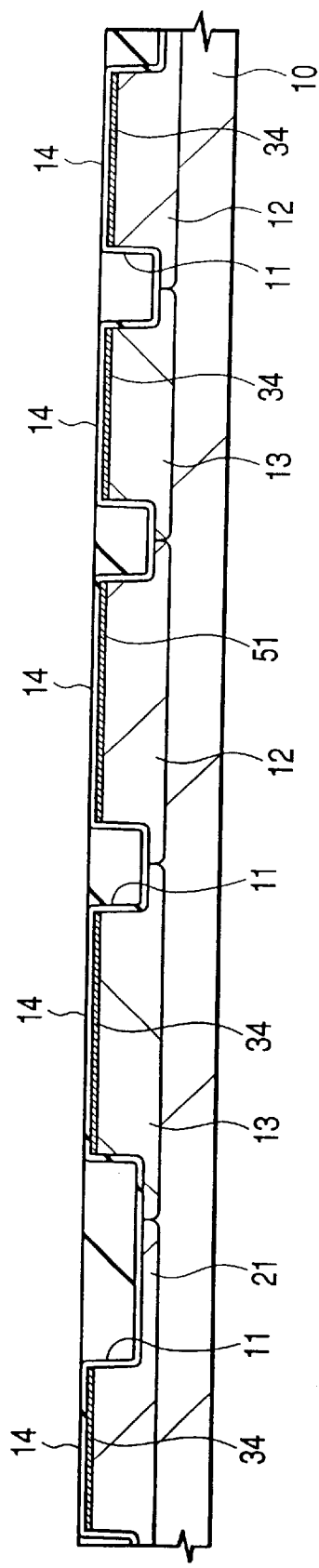
FIG. 51 is a sectional view of essential parts of a semiconductor substrate showing a method of manufacturing a DRAM embedded logic LSI according to a sixth embodiment.

First, as shown in FIG. 51, a shallow trench isolation region 11 is formed on a silicon substrate 10, and there are formed a p-well 21 for memory cell n-channel type MISFET, a p-well 12 for peripheral n-channel type MISFET, and n-well 13 for peripheral p-channel type MISFET. Then, the full surface of the surface 10 is surface oxidized, and a thick gate oxide (thick oxide film) 14 is formed. Next, oxynitridation is applied to the full face of the substrate 10, thereby forming a highly oxy-nitrided region 34.

Figure 52:
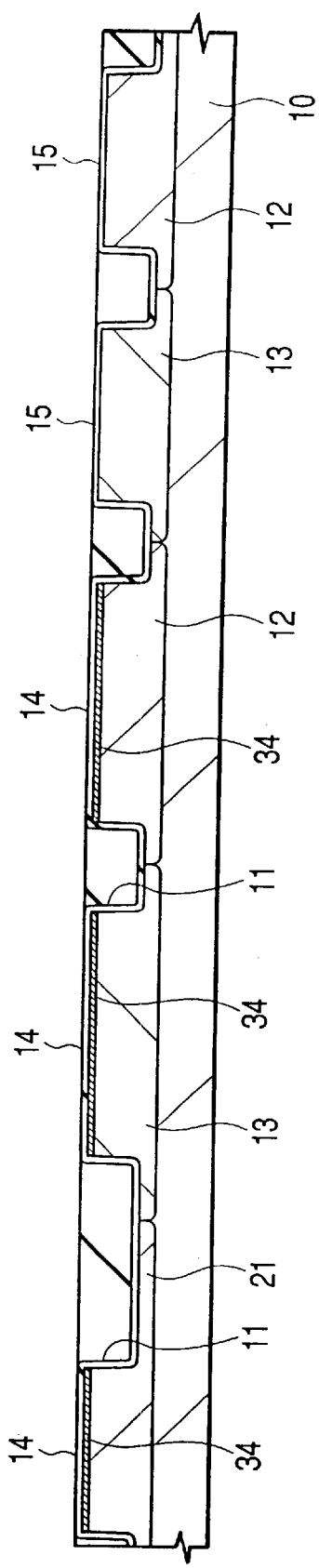
FIG. 52 is a sectional view of essential parts of a semiconductor substrate showing a method of manufacturing a DRAM embedded logic LSI according to the sixth embodiment.

Next, as shown in FIG. 52, a thick oxide film 14 is left in a memory cell region and its peripheral high voltage resistance MISFET region, and only the thick oxide film 14 in the peripheral core MISFET region is removed. After surface washing, the substrate 10 is re-oxidized, thereby forming a thin oxide film 15 on the surface of the core MISFET region. The thick oxide film 14 is additionally oxidized so as to have desired film thickness, although the film thickness slightly decreases in the washing step. Thereafter, the full face of the substrate is subjected to oxynitridation using NO gas so that nitrogen atoms in desired amount is contained in the $SiO_2$/Si interface of the thin oxide film 15 (not shown). In this case as well, the first oxynitridation condition is determined in consideration of an amount of nitrogen on the $SiO_2$/Si interface of the thick oxide film 14.

Next, as shown in FIG. 53, gate electrodes 1a to 1e having a WN (tungsten nitride) 18 inserted between the n-type polycrystal silicon film 16 or p-type polycrystal silicon film 17 and a W (tungsten) film 19 are formed. In the present embodiment, a P-type polycrystal silicon film 17 is employed for a gate electrode 1e of the memory cell n-channel type MISFET. In this manner, the threshold voltage of the memory cell n-channel type MISFET can be highly set, and the lowering of the threshold voltage due to a fixed positive charge caused by oxynitridation is allowable. Thus, there is no need to increase an amount of channel B (boron) implantation. Therefore, there is no concern that a leak current increases due to an increase in electric field at the "pn" junction, and the memory cell data retention time decreases. As a gate electrode 1e of the memory cell n-channel type MISFET, apart from a p-type polycrystal silicon, it is efficient that there are employed a gate material having a greater work function than n-type polycrystal silicon such as p-type polycrystal silicon/Ge (germanium), titanium nitride.

Next, as shown in FIG. 54, a P (phosphor) ion is implanted into the full face of the substrate 10, and an extension region 22 of the memory cell n-channel MISFET is formed. In the present embodiment, although P-ion is implanted into the full face of the substrate 10 in order to reduce the number of photomasks, a region other than memory cell region is covered with a resist mask, whereby P-ion may be implanted into only the substrate in the memory cell region.

Next, as shown in FIG. 55, using a resist mask 111c having only the high voltage resistance n-channel type MISFET region opened thereat, a p-ion and a boron fluoride (BF$_2$)-ion 61 are implanted, thereby forming an extension region 113 and halo region 114 for the high voltage resistance n-channel type MISFET.

Next, as shown in FIG. 56, using a resist mask 111d having only the core n-channel type MISFET region opened thereat, an arsenic (As) ion and a boron fluoride ion 118 are implanted, thereby forming an extension region 119 and a halo region 120 for the core n-channel type MISFET. In the case where the nitrogen concentration is low on the $SiO_2$/Si interface of the thin oxide film 15 in the core channel type MISFET region, implantation of nitrogen ion may be added.

Figure 57:
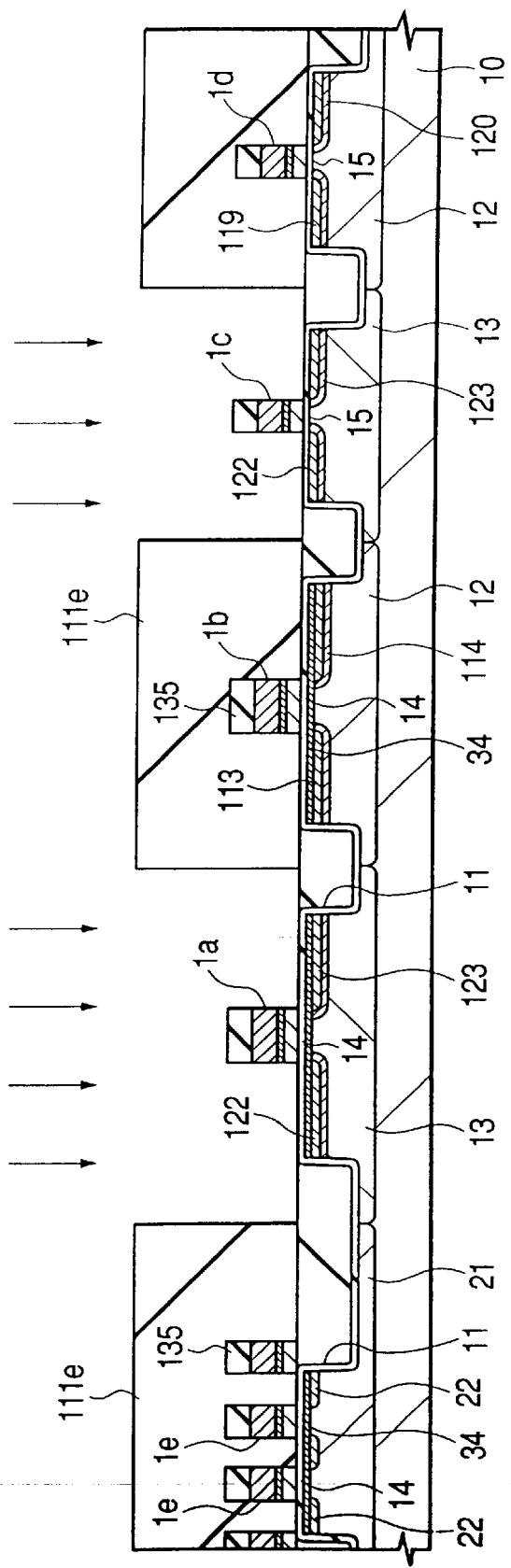
FIG. 57 is a sectional view of essential parts of a semiconductor substrate showing a method of manufacturing a DRAM embedded logic LSI according to the sixth embodiment.

Next, as shown in FIG. 57, using a resist mask 111e having only a p-channel type MISFET region opened thereat, a boron fluoride ion and a P-ion 121 are implanted, thereby forming an extension region 122 and a halo region 123 for the p-channel type MISFET. Thereafter, heat treatment for activating the above impurities is carried out.

Figure 58:
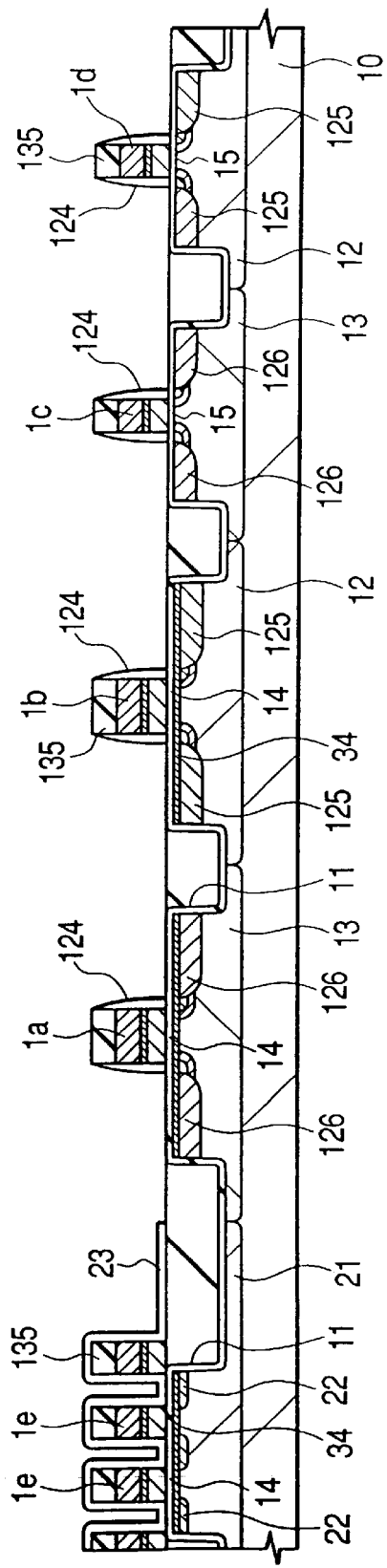
FIG. 58 is a sectional view of essential parts of a semiconductor substrate showing a method of manufacturing a DRAM embedded logic LSI according to the sixth embodiment.

Next, as shown in FIG. 58, a silicon nitride film 23 deposited on the substrate 10 is anisotropically etched, thereby forming a sidewall spacer 124 on the side wall of gate electrodes 1a to 1d of the peripheral MISFET. At this time, a silicon nitride film 23 in the memory cell region is covered with a photo resist film (not shown) so as not to be etched.

Figure 59:
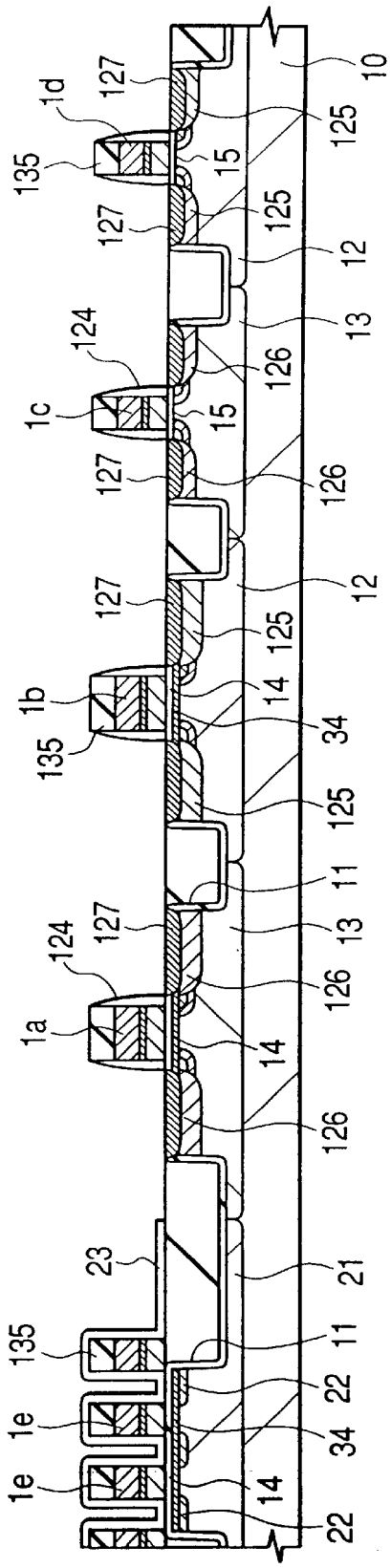
FIG. 59 is a sectional view of essential parts of a semiconductor substrate showing a method of manufacturing a DRAM embedded logic LSI according to the sixth embodiment.

Then, an arsenic (As) ion and a boron fluoride ion are implanted into the substrate 10, thereby forming a $n^+$ type semiconductor region 125 with high impurity concentration that configures the source and drain of the peripheral n-channel type MISFET and a $p^+$ type semiconductor region 126 with high impurity concentration that configures the source and drain of the peripheral p-channel type MISFET. Then, as shown in FIG. 59, a silicide layer 127 is formed each on the surface of the source and drain of the peripheral n-channel type MISFET and on the surface of the source and drain of the peripheral p-channel type MISFET.

Figure 60:
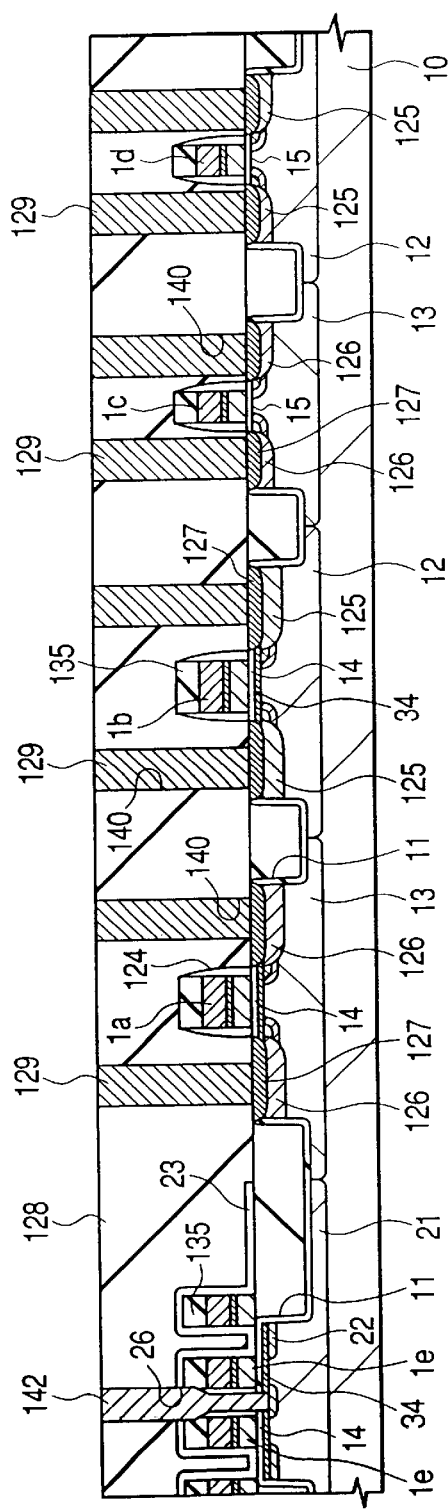
FIG. 60 is a sectional view of essential parts of a semiconductor substrate showing a method of manufacturing a DRAM embedded logic LSI according to the sixth embodiment.

Next, as shown in FIG. 60, after a first interdielectric film 128 is formed, a polycrystal silicon plug 142 is embedded in a contact hole 26 formed on the first interdielectric film 128 on the top of either one of the source and drain of the memory cell MISFET. Then, a W plug 129 is embedded in a contact hole 140 formed on the first interdielectric film 128 on the top of the source and drain of the peripheral MISFET.

Figure 61:
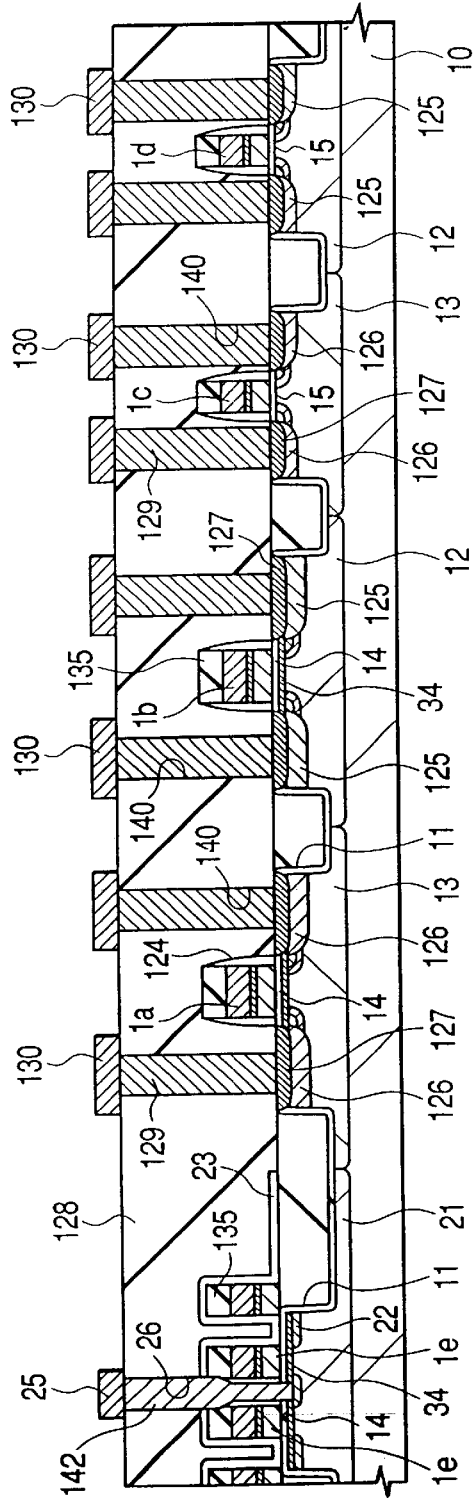
FIG. 61 is a sectional view of essential parts of a semiconductor substrate showing a method of manufacturing a DRAM embedded logic LSI according to the sixth embodiment.

Next, as shown in FIG. 61, a bit line 25 is formed on the top of the first interdielectric film 128, and a metal interconnect 130 of the first layer is formed. The bit line 25 and metal interconnect 130 are formed of W, for example.

Figure 62:
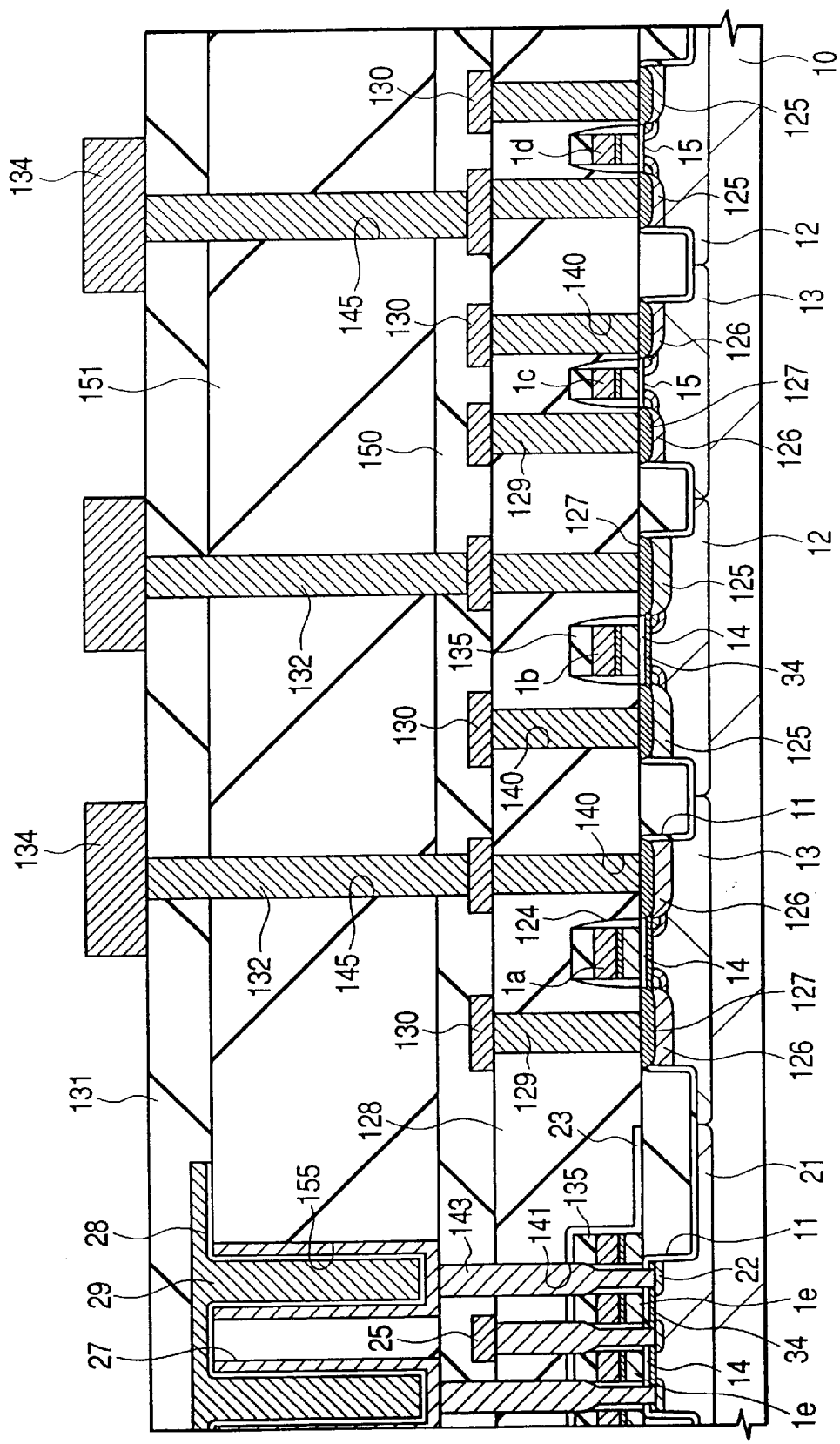
FIG. 62 is a sectional view of essential parts of a semiconductor substrate showing a method of manufacturing a DRAM embedded logic LSI according to the sixth embodiment.

Next, as shown in FIG. 62, a silicon oxide film 150 is formed on the top of the bit line 25 and the metal interconnect 130, and then, a contact hole 141 is formed on the first interdielectric film 128 and silicon oxide film 150 on the top of the other one of the source and drain of the memory cell MISFET. Thereafter, a polycrystal silicon plug 26 is embedded inside of the contact hole 141.

Next, a silicon oxide film 151 is embedded on the top of the silicon oxide film 150, and then, a trench 155 is formed on the silicon oxide film 151 in the memory cell region. Thereafter, a memory cell capacity is formed inside of the trench 155. This capacitor is configured to have, for example, a lower electrode 27 that is formed of a polycrystal silicon, a capacity insulation film 28 that is formed of a tantalum ($Ta_2O_5$), and an upper electrode 29 that is formed of titanium nitride (TiN).

Next, a second interdielectric film 131 is formed on the top of the capacitor, and then, a W plug 132 is embedded in a through hole 145 formed on the second interdielectric film 131 and the silicon oxide film 151 and 150 on the top of the metal interconnect 130. Thereafter, a metal interconnect 134 of the second layer is formed on the top of the second interdielectric film 131. In addition, metal interconnects of one or plural layers may be further formed on the top of the metal interconnect 134 of the second layer. As has been, described above, a DRAM embedded logic LSI is completed.

According to the present embodiment, it is verified that a sufficient amount of nitrogen atoms exist in the $SiO_2$/Si interface of the high voltage resistance n-channel type MISFET, and the life of the hot carrier reliability is 10 years or more. In addition, it is verified that the NBTI life of the p-channel type MISFET is 10 years or more. That is, an amount of nitrogen can be optimized on the $SiO_2$/Si interface of the core n-channel type MISFET and high voltage resistance n-channel type MISFET. As a result, sufficient hot carrier reliability can be ensured without any side effect. Further, the threshold voltage of the memory cell n-channel type MISFET is set by work function control of a gate electrode. As a result, the boron concentration of a channel can be optimized, thus making it possible to increase a DRAM data retention time. That is, as a result of optimizing an amount of nitrogen on the $SiO_2$/Si interface of all the n-channel type MISFETs, sufficient hot carrier reliability can be ensured without any side effect.

Seventh Embodiment

The present embodiment describes an example 2 of application of nitrogen ion implantation into a channel to a logic LSI.

First, as shown in FIG. 63, a shallow trench isolation region 11 is formed on a silicon substrate 10, thereby forming a p-well 12 for n-channel type MISFET and an n-well 13 for p-channel type MISFET. A surface oxide film 71 during ion implantation is left on the full face of the substrate. With a photo resist 111a being a mask, a nitrogen ion ($N_2^+$, 5 KeV, $3\times10^{14}$ cm$^{-2}$) is implanted into only the high voltage resistance n-channel MISFET section (reference numeral 72 denotes a nitrogen implantation region).

Next, as shown in FIG. 64, after the photo resist 111a and surface oxide film 71 are removed, a thick oxide film 14 is fully grown. At this time, the nitrogen in the substrate reacts on an interface, and a highly oxy-nitrided region 34 is formed.

Next, as shown in FIG. 65, using a photo resist 111g, a thick oxide film 14 is left in the high voltage resistance MISFET region, and only the thick oxide film 14 in the core MISFET region is removed.

Next, the photo resist 111g is removed. After surface washing, as shown in FIG. 66, the substrate 10 is re-oxidized, thereby forming a thin oxide film 15 on the surface of the substrate 10 in the core MISFET region. The thick oxide film 14 is additionally oxidized so as to have desired film thickness, although the film thickness slightly decreases in the washing step. Thereafter, the full face of the substrate 10 is subjected to oxynitridation using NO gas so that nitrogen atoms in desired amount is contained in the $SiO_2$/Si interface of the thin oxide film 15 (not shown). At this time, although the $SiO_2$/Si interface of the thick oxide film 14 is also oxy-nitrided at the same time, an increase in amount of nitrogen is smaller than that at the thin film section.

Figure 67:
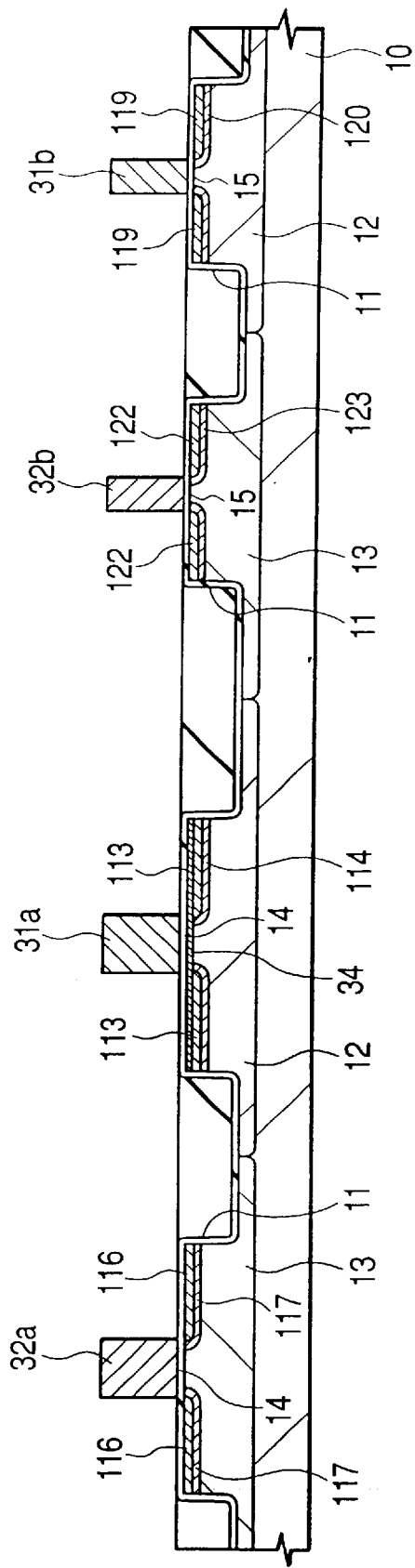
FIG. 67 is a sectional view of essential parts of a semiconductor substrate showing a method of manufacturing a logic LSI according to the seventh embodiment.

Next, as shown in FIG. 67, a P (phosphor) ion is implanted into a part of the polycrystal silicon film deposited on the substrate 10, and a B (boron) ion is implanted into another part, thereby forming an n-type polycrystal silicon film 31 and a p-type polycrystal silicon film 32. Gate electrodes 31a, 31b, 32a, and 32b are formed by patterning these films. Then, as in the embodiments 1 and 2, the high voltage resistance n-channel type MISFET, p-channel type MISFET extension regions 113 and 116, and halo regions 114 and 117 are formed, and the extension regions 119 and 122 and halo regions 120 and 123 for the core n-channel type MISFET and p-channel type MISFET extension regions 119 and 122, and halo regions 120 and 123 are formed.

Figure 68:
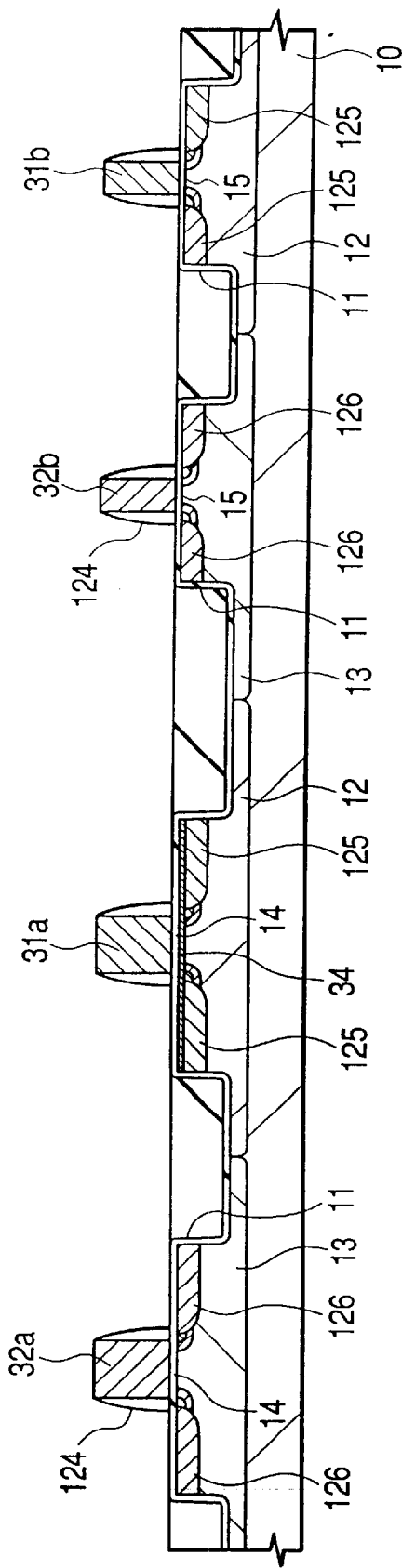
FIG. 68 is a sectional view of essential parts of a semiconductor substrate showing a method of manufacturing a logic LSI according to the seventh embodiment.

Next, as shown in FIG. 68, a sidewall spacer 124 is formed on the side wall of gate electrodes 31a, 31b, 32a, and 32b. Then, an arsenic (As) ion and a boron fluoride ion are implanted into the substrate 10, thereby forming an n$^+$ type semiconductor region 125 with high impurity concentration that configures the source and drain of the n-channel type MISFET and a p$^+$ type semiconductor region 126 with high impurity concentration that configures the source and drain of the p-channel type MISFET.

Figure 69:
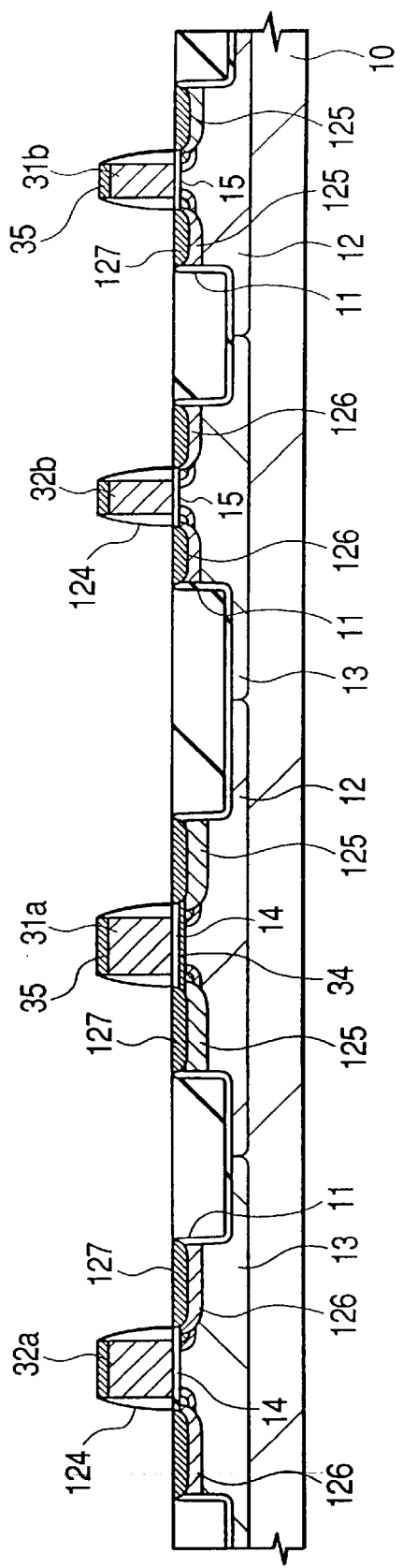
FIG. 69 is a sectional view of essential parts of a semiconductor substrate showing a method of manufacturing a logic LSI according to the seventh embodiment.

Next, as shown in FIG. 69, a silicide layer 127 is formed each on the surface of the source and drain of the n-channel type MISFET and on the surface of the source and drain of the p-channel type MISFET. In the present embodiment, at this time, a silicide layer 35 is formed on the surface of the gate electrodes 31a, 31b, 32a, and 32b at the same time.

Figure 70:
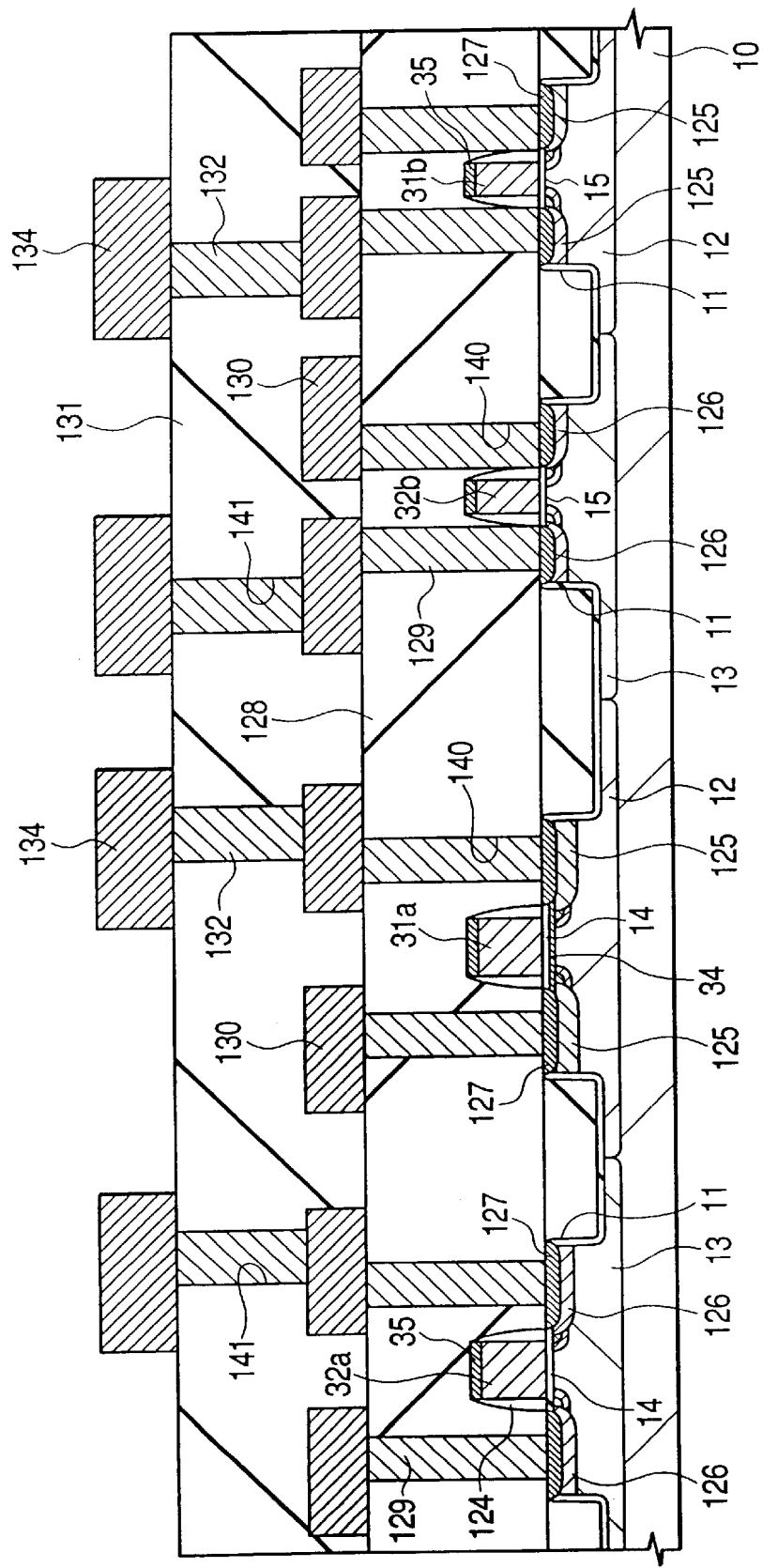
FIG. 70 is a sectional view of essential parts of a semiconductor substrate showing a method of manufacturing a logic LSI according to the seventh embodiment.

Then, as shown in FIG. 70, a first interdielectric film 128 is formed on the top of the MISFET, and then, a W plug 129 is embedded in a contact hole 140 formed on the first interdielectric film 128 on the top of the source and drain (n$^+$ type semiconductor region 125 and p$^+$ type semiconductor region 126). Thereafter, a metal interconnect 130 of the first layer is formed on the top of the first layer. Similarly, the second interdielectric film 131 is formed on the top of the metal interconnect 130 of the first layer, and then, a W plug 132 is embedded in a contact hole 141 formed on the second interdielectric film 131 on the top of the metal interconnect 130. Then, a metal interconnect 134 of the second layer is formed on the top of the second interdielectric film 131. In addition, metal interconnects of one or plural layers may be further formed on the top of the metal interconnect 134 of the second layer. The metal interconnects 130 and 134 are formed of W, for example. As has been described above, a logic LSI is completed.

According to the present embodiment, it is verified that a sufficient amount of nitrogen atoms exist on the $SiO_2$/Si interface of the high voltage resistance n-channel type MISFET, and the life of the hot carrier reliability is 10 years or more. In addition, it is verified that the NBTI life of the p-channel type MISFET is 10 years or more. That is, an amount of nitrogen can be optimized on the $SiO_2$/Si interface of the core n-channel type MISFET and high voltage resistance n-channel type MISFET. As a result, sufficient hot carrier reliability can be ensured without any side effect.

In selective oxynitridation technique caused by nitrogen ion implantation, it is possible to select a further specific portion of the thick n-channel type MISFET. For example, nitrogen ion is implanted into a section at which a gate length is short and countermeasures against a hot carrier are indispensable. Alternatively, a nitrogen ion is not implanted into a section at which an occurrence of a 1/f noise is not preferable, like an analog MISFET. Further, nitrogen is implanted into the entire channel of the high voltage resistance n-channel type MISFET. Thus, there is provided an advantage that an amount of nitrogen dosage can be reduced to its required minimum, and an occurrence of a crystal defect or the like can be restrained. In addition, there is provided an advantage that there is no possibility of degradation caused by an oxide breakdown voltage which is a concern in the case of ion implantation through a gate oxide film.

Eighth Embodiment

The present embodiment describes an example 3 of application of nitrogen ion implantation into a channel to a logic LSI.

Figure 71:
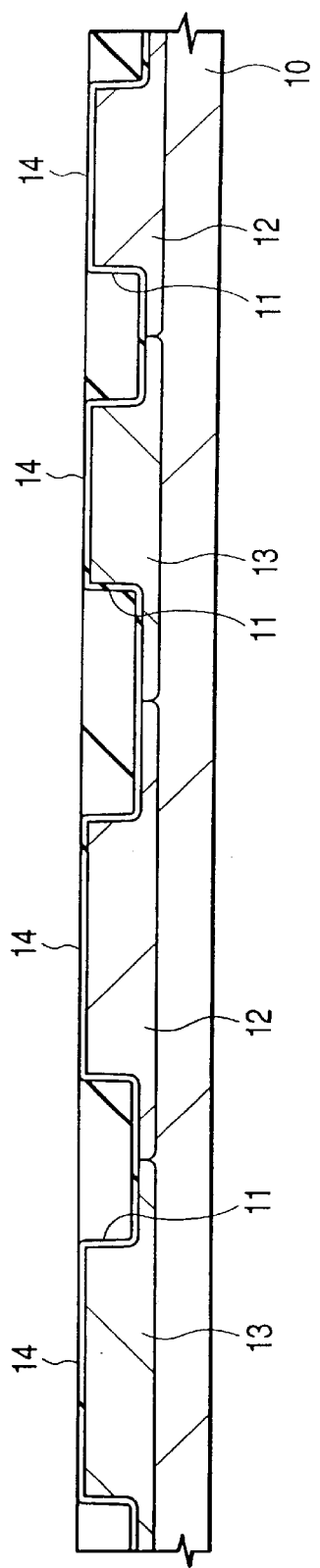
FIG. 71 is a sectional view of essential parts of a semiconductor substrate showing a method of manufacturing a logic LSI according to the eighth embodiment.

First, as shown in FIG. 71, a shallow trench isolation region 11 is formed on a silicon substrate 10, thereby forming a p-well 12 for n-channel type MISFET and an n-well 13 for p-channel type MISFET. Then, a thick oxide film 14 is fully grown.

Figure 72:
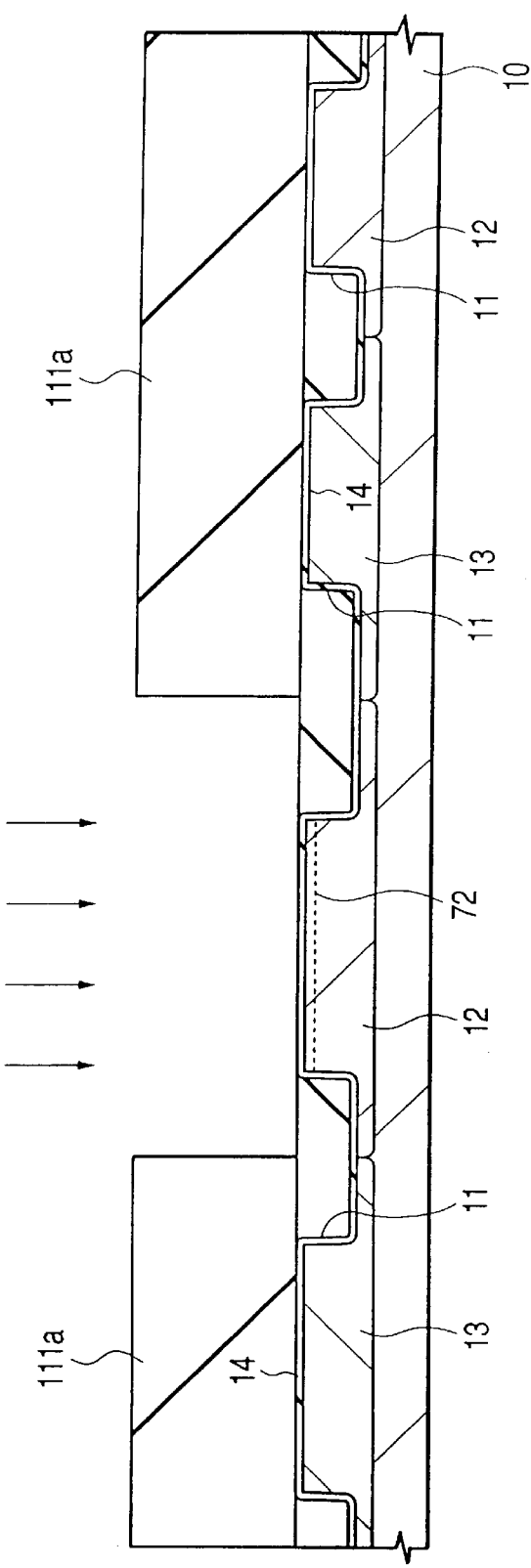
FIG. 72 is a sectional view of essential parts of a semiconductor substrate showing a method of manufacturing a logic LSI according to the eighth embodiment.

Next, as shown in FIG. 72, with a photo resist 111a being as a mask, a nitrogen ion ($N^2$, 5 KeV, $3\times10^{14}$ cm$^{-2}$) is implanted onto into a high voltage resistance n-channel MISFET section (reference numeral 72 denotes a nitrogen implantation region).

Next, as shown in FIG. 73, using a photo resist 111g, a thick oxide film 14 is left in a high voltage resistance MISFET region, and only the thick oxide film 14 in the core MISFET region is removed.

Next, as shown in FIG. 74, the photo resist 111g is removed. After surface washing, the substrate 10 is re-oxidized, thereby forming a thin oxide film 15 on the surface of the surface 10 in the core MISFET region. The thick oxide film 14 is additionally oxidized so as to have desired film thickness, although the film thickness slightly decreases in the washing step. Thereafter, the full face of the substrate 10 is subject to oxynitridation using NO gas so that a desired amount of nitrogen atoms is contained in the $SiO_2$/Si interface of the thin oxide film 15 (not shown). At this time, although the $SiO_2$/Si interface of the thick oxide film 14 is also oxy-nitrided at the same time, an amount of nitrogen is smaller than that at the thin film section. However, at this time, the nitrogen ion-implanted in the substrate reacts on the interface during heat treatment, and a highly oxy-nitrided region 34 is formed. Thus, an amount of nitrogen at the high voltage resistance n-channel MISFET section is compensated for.

Next, as shown in FIG. 75, a P (phosphor) ion is implanted into a part of the polycrystal silicon film deposited on the substrate 10, and a B (boron) ion is implanted into another part, thereby forming an n-type polycrystal silicon film 31 and a p-type polycrystal silicon film 32. Gate electrodes 31a, 31b, 32a, and 33b are formed by patterning these films. Then, as in the first and second embodiments, the extension regions 113 and 116 and halo regions 114 and 117 of the high voltage resistance n-channel type MISFET and p-channel type MISFET are formed, and the extension regions 119 and 122 and halo regions 120 and 123 of the core n-channel type MISFET and p-channel type MISFET are formed.

Next, as shown in FIG. 76, a sidewall spacer 124 is formed on the side wall of the gate electrodes 31, 31b, 32a, and 33b. Then, an arsenic (As) ion and a boron fluoride ion are implanted into the substrate 10, thereby forming an n$^+$ type semiconductor region 125 with high impurity concentration that configures the source and drain of the n-channel type MISFET and a p$^+$ type semiconductor region 126 with high impurity concentration that configures the source and drain of the p-channel type MISFET.

Figure 77:
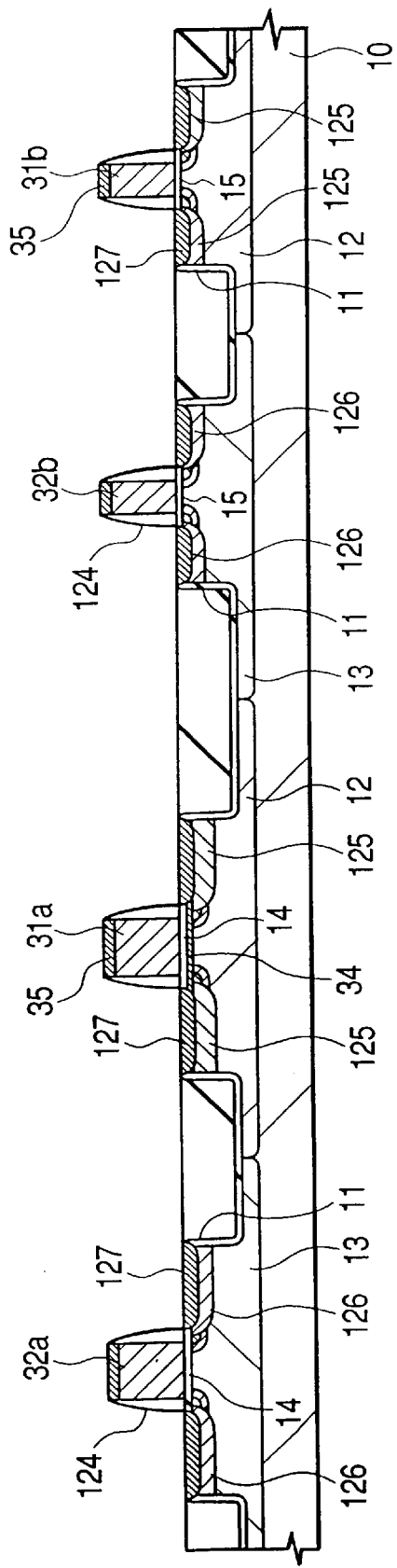
FIG. 77 is a sectional view of essential parts of a semiconductor substrate showing a method of manufacturing a logic LSI according to the eighth embodiment.

Next, as shown in FIG. 77, a silicide layer 127 is formed each on the surface of the source and drain of the n-channel type MISFET and on the surface of the source and drain of the p-channel type MISFET. In the present embodiment, at this time, a silicide layer 35 is formed on the surface of the gate electrodes 31a, 31b, 32b, and 33b at the same time.

Figure 78:
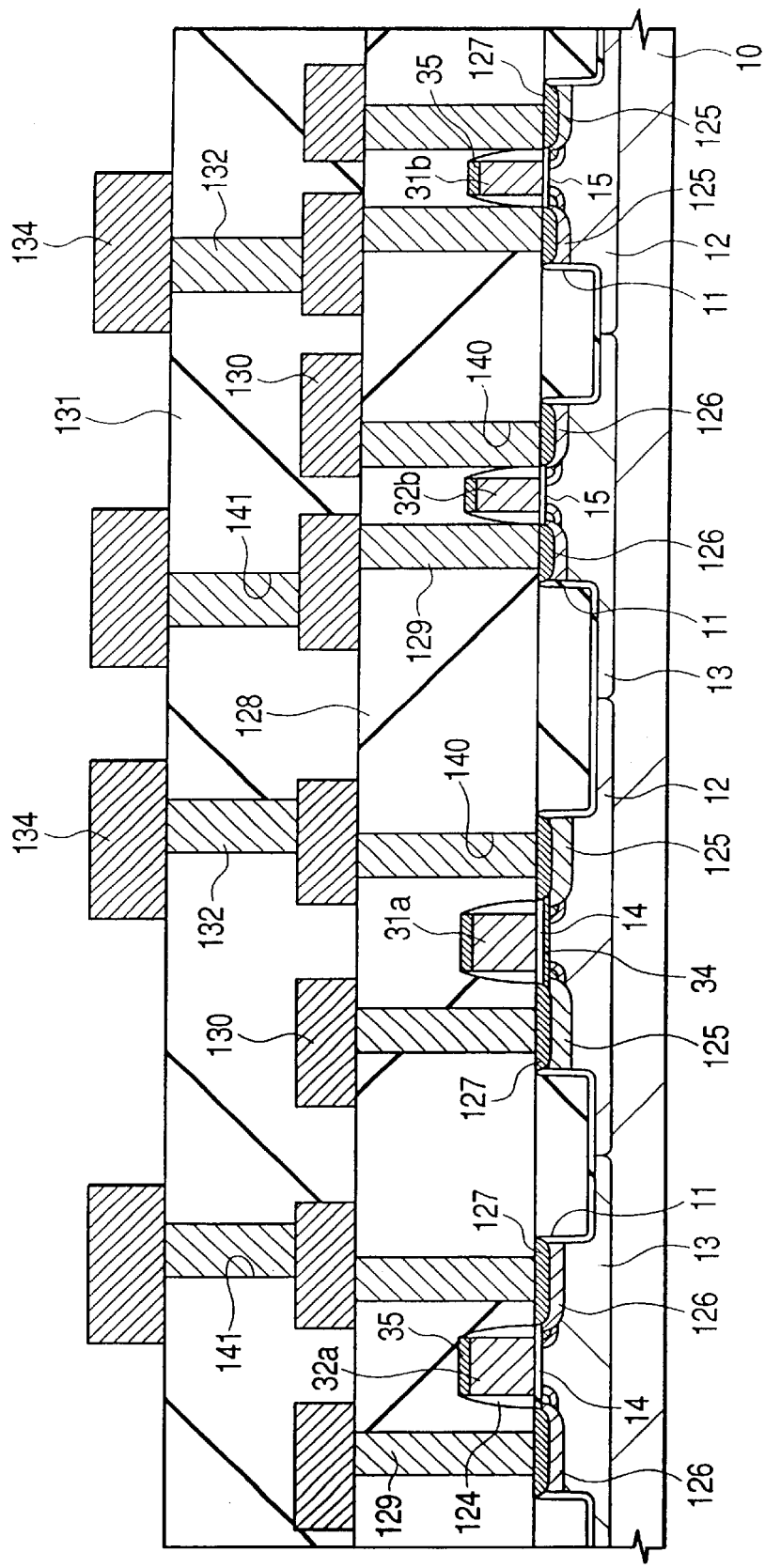
FIG. 78 is a sectional view of essential parts of a semiconductor substrate showing a method of manufacturing a logic LSI according to the eighth embodiment.
Figure 81:
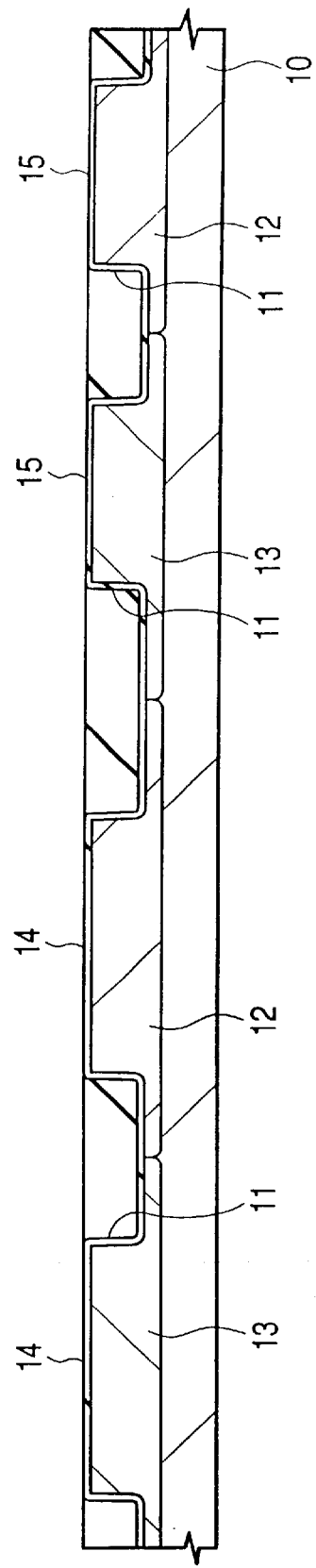
FIG. 81 is a sectional view of essential parts of a semiconductor substrate showing a method of manufacturing a CMOS-logic LSI studied by the Invention.
Figure 82:
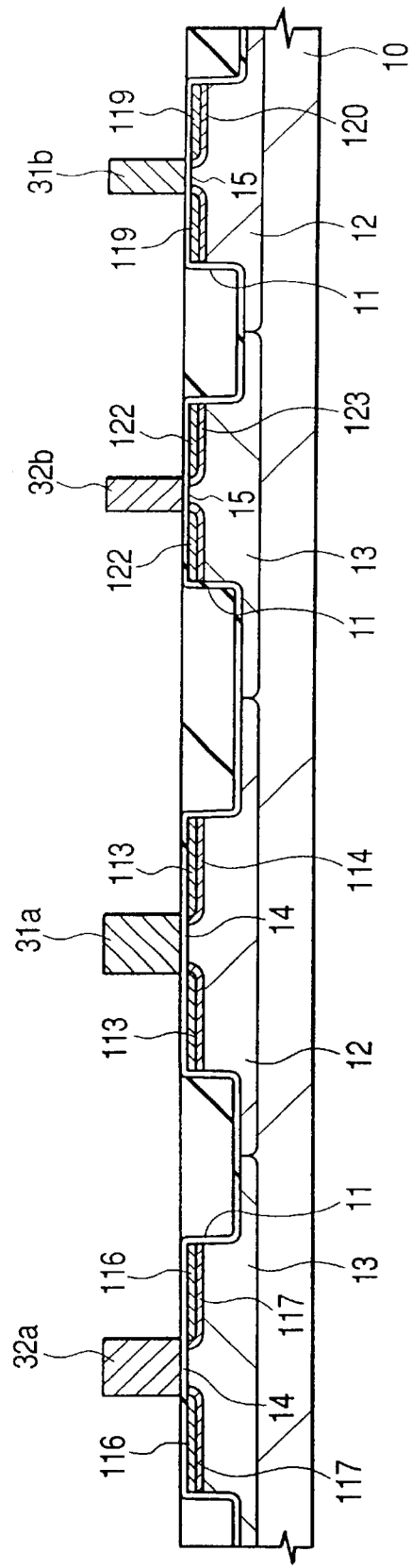
FIG. 82 is a sectional view of essential parts of a semiconductor substrate showing a method of manufacturing a CMOS-logic LSI studied by the Invention.
Figure 83:
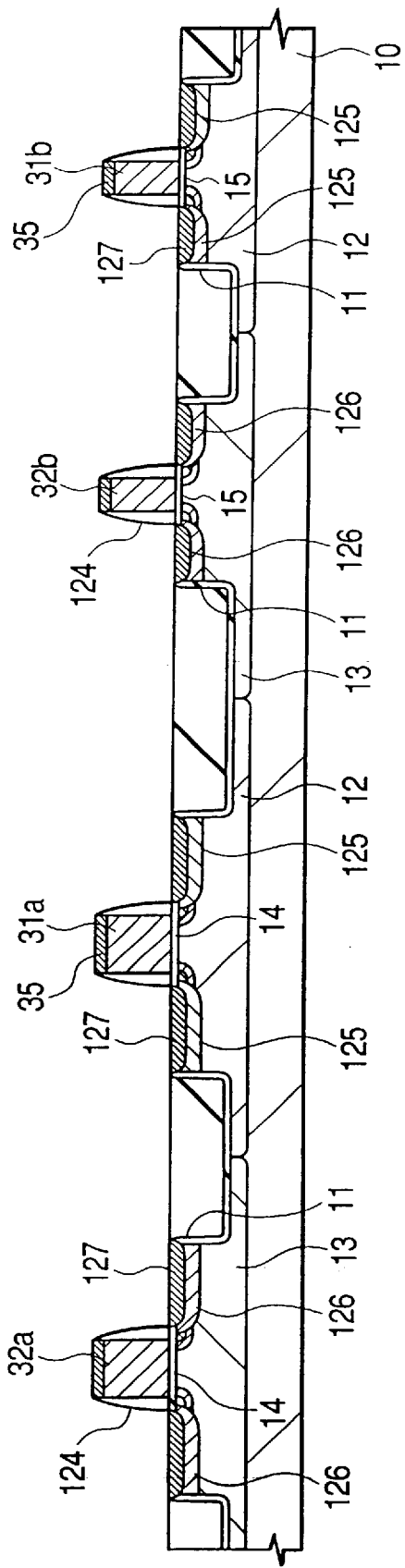
FIG. 83 is a sectional view of essential parts of a semiconductor substrate showing a method of manufacturing a CMOS-logic LSI studied by the Invention.
Figure 84:
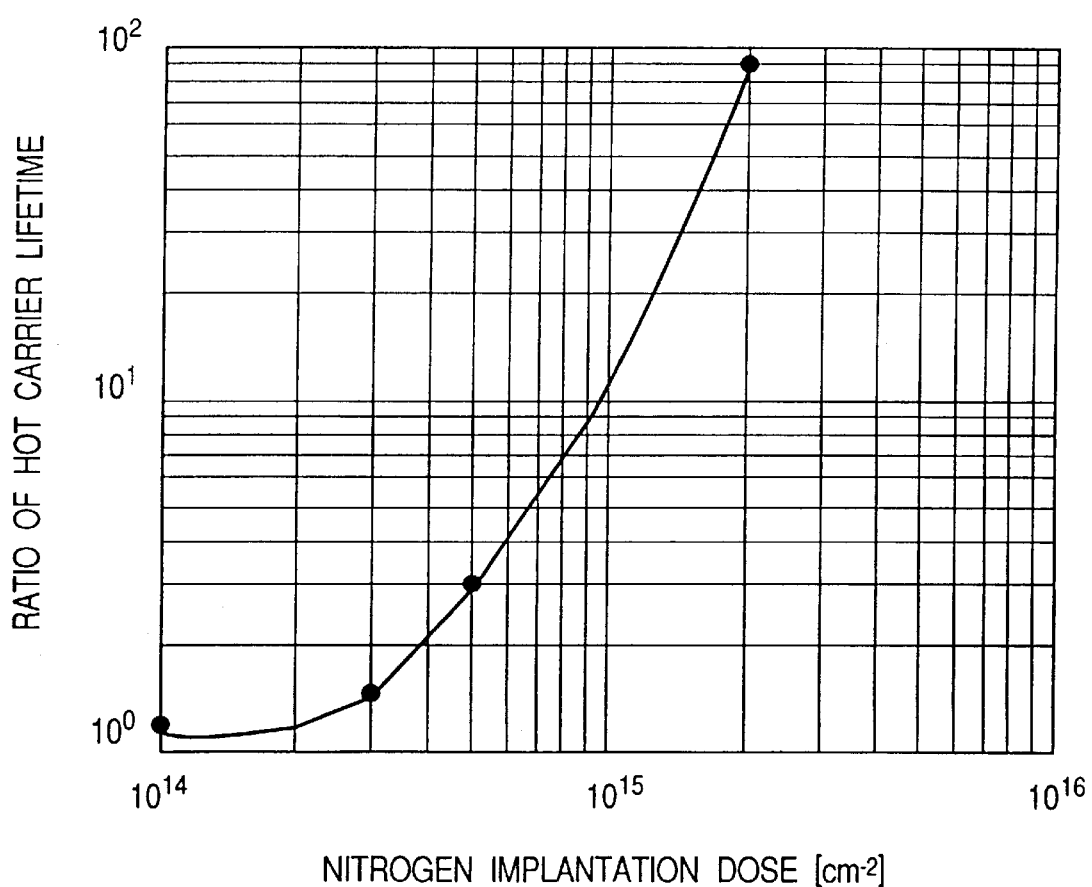
FIG. 84 is a graph depicting a relationship between an amount of nitrogen ion implantation and a hot carrier life.
Figure 85:
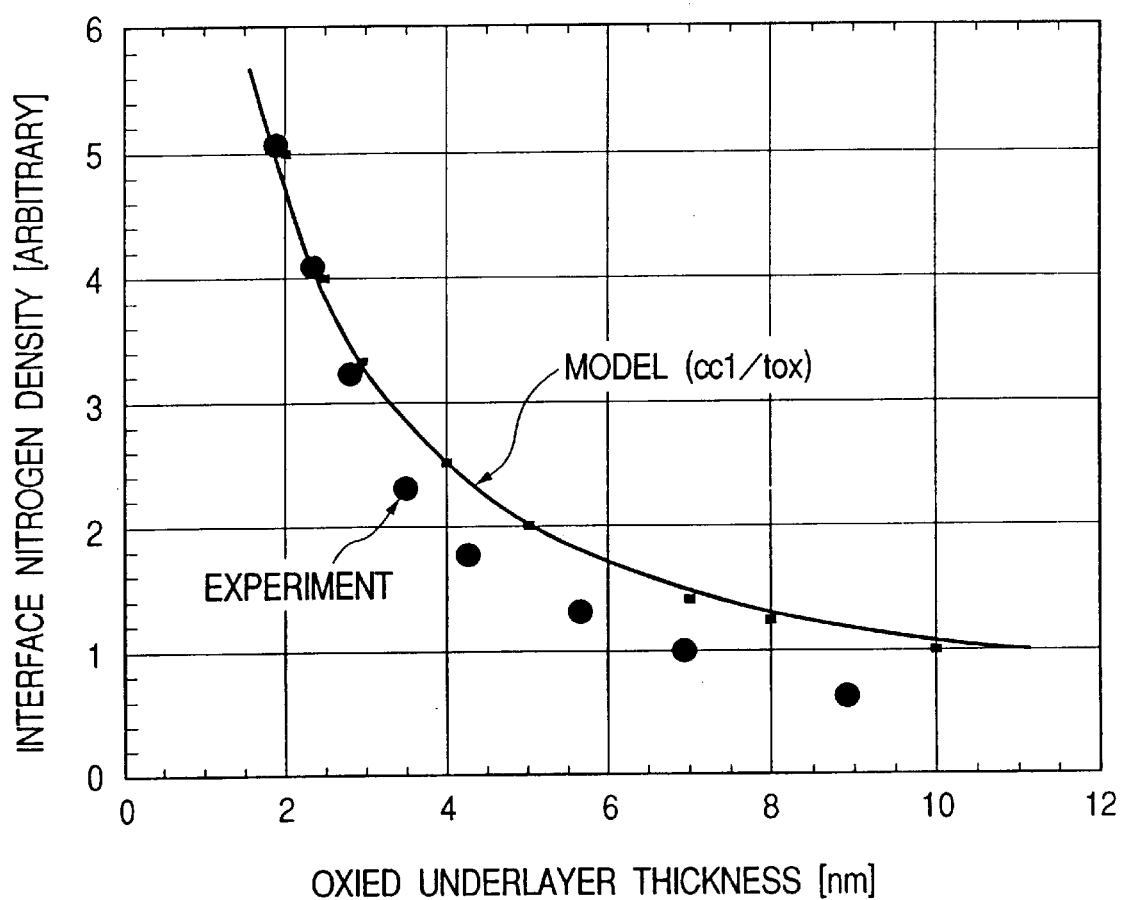
FIG. 85 is a graph depicting a relationship between an amount of nitrogen ion implantation and a hot carrier life.
Figure 86:
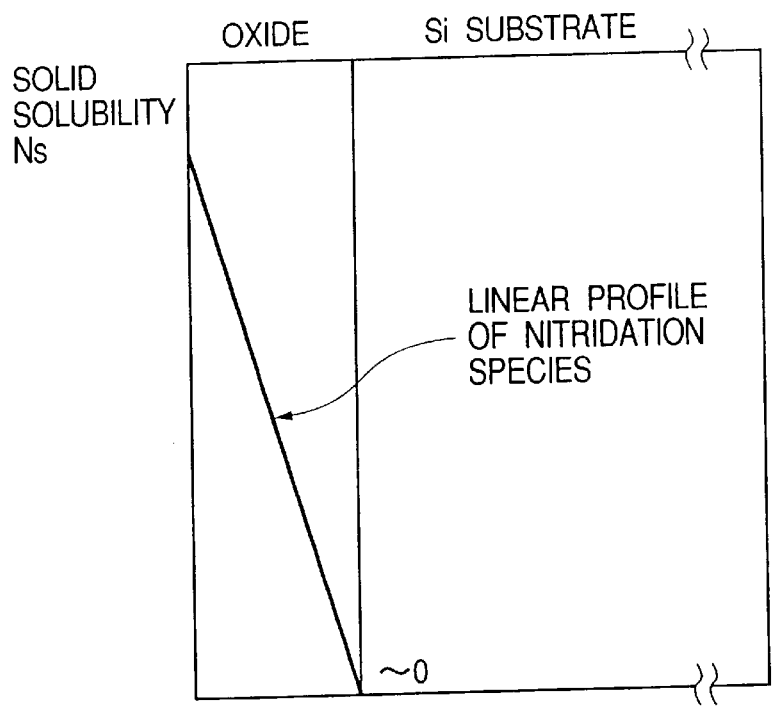
FIG. 86 is a graph and model chart showing oxide under-lay film thickness dependency of an amount of interfacial nitrogen.
Figure 87:
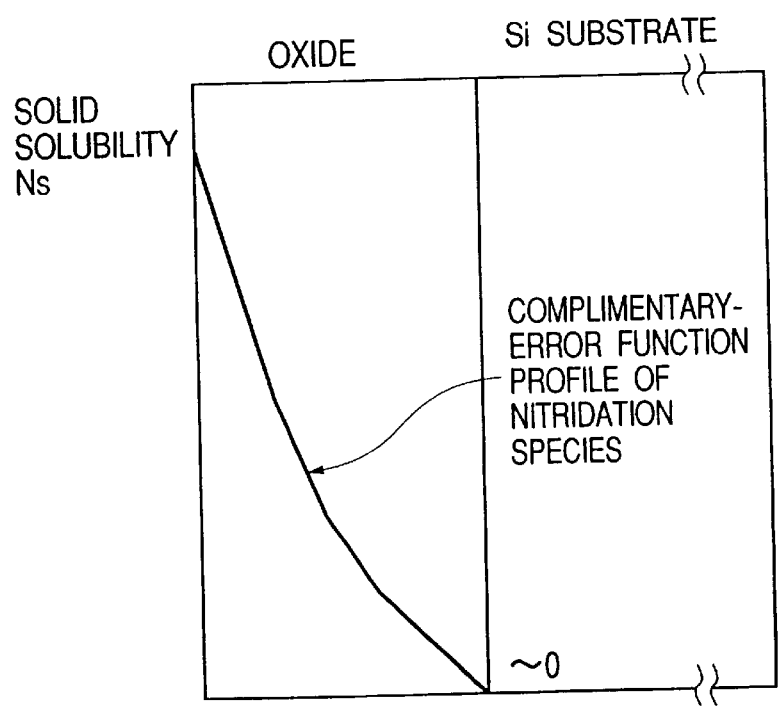
FIG. 87 is a graph depicting a relationship between an amount of nitrogen ion implantation and a hot carrier life.

Then, as shown in FIG. 78, a first interdielectric film 128 is formed on the top of the MISFET, and a W plug 129 is embedded in a contact hole 140 formed on the first interdielectric film 128 on the top of the source and drain (n$^+$ type semiconductor region 125 and p$^+$ type semiconductor region 126). Thereafter, a metal interconnect 130 of the first layer is formed on the top of the first interdielectric film 128. Similarly, a second interdielectric film 131 is formed on the top of a metal interconnect 130 of the first layer, and then, a W plug 132 is embedded in a contact hole 141 formed on the second interdielectric film 131 on the top of the metal interconnect 130. Thereafter, a metal interconnect 134 of the second layer is formed on the top of the second interdielectric film 131. In addition, metal interconnects of one or plural layers may be formed on the top of the metal interconnect 134 of the second layer. The metal interconnects 130 and 134 are formed of W, for example. As has been described above, a logic LSI is completed.

According to the present embodiment, it is verified that a sufficient amount of nitrogen atoms exist on the $SiO_2$/Si interface of the high voltage resistance n-channel type MISFET, and the life of the hot carrier reliability is 10 years or more. In addition, it is verified that the NBTI life of the p-channel type MISFET is 10 years or more. That is, an amount of nitrogen can be optimized on the $SiO_2$/Si interface of the core n-channel type MISFET and high voltage resistance n-channel type MISFET. As a result, sufficient hot carrier reliability can be ensured without any side effect.

In selective oxynitridation technique caused by nitrogen ion implantation, it is possible to select a further specific portion of the thick n-channel type MISFET. For example, nitrogen ion is implanted into a section at which a gate length is short and countermeasures against a hot carrier are indispensable. Alternatively, a nitrogen ion is not implanted into a section at which an occurrence of a 1/f noise is not preferable, like an analog MISFET. Further, nitrogen is implanted into the entire channel of the high voltage resistance n-channel type MISFET. Thus, there is provided an advantage that an amount of nitrogen dosage can be reduced to its required minimum, and an occurrence of a crystal defect or the like can be restrained.

So far, although the invention achieved by the Inventor has been specifically described by way of embodiments of the invention, the present invention is not limited to the above embodiments. Of course, various modifications can occur without departing from the spirit of the invention.

Of the inventions disclosed by the present application, advantageous effects achieved by typical ones will be briefly described as follows.

According to the present invention, in a logic LSI, nitrogen atoms whose concentration is equal to or greater than that determined in inversely proportional to the film thickness are contained in the $SiO_2$/Si interface of the thick-film n-channel type MISFET requiring high voltage resistance, as compared with the $SiO_2$/Si interface of the thin-film n-channel type MISFET. Thus, sufficient hot carrier durability can be ensured.

According to the present invention, in a DRAM embedded logic LSI, an amount of nitrogen on the $SiO_2$/Si interface is normalized according to whether a gate electrode of a memory cell n-channel type MISFET is an n-type polycrystal silicon or a p-type polycrystal silicon. This enables a channel B (boron) profile design capable of maintaining a long data retention time and shorting a channel in length.

What is claimed is:

1. A method of manufacturing a semiconductor comprising the steps of:
    (a) forming a first gate insulation film in a first region of a main face of a semiconductor substrate, followed by forming a second gate insulation film that is thicker than the first gate insulation film in a second region of a main face of the semiconductor substrate;
    (b) applying oxynitridation to the first and second gate insulation film;
    (c) forming a first gate electrode of a first MISFET on top of the first gate insulation film, followed by forming a second gate electrode of a second MISFET on top of the second insulation film; and (d) implanting an ion that contains nitrogen or nitrogen atoms in at least one part of an interface between the second gate insulation film and the semiconductor substrate before or after the step (a) or before or after the step (c).

2. A method of manufacturing a semiconductor comprising the steps of:
   (a) forming a second gate insulation film on a main face of a semiconductor substrate;
   (b) applying oxynitridation to the second gate insulation film;
   (c) removing the second gate insulation film in a first region of the semiconductor substrate, followed by leaving the second gate insulation film in a second region of the semiconductor substrate;
   (d) oxidizing the semiconductor substrate, thereby forming a first gate insulation film that is thinner than the second gate insulation film in the first region of the semiconductor substrate;
   (e) applying a second oxynitridation to the first and second gate insulation films; and
   (f) forming a first gate electrode of a first MISFET on top of the first gate insulation film, followed by forming a second gate electrode of a second MISFET on top of the second gate insulation film.

* * * * *